(12) United States Patent
Farahani et al.

(10) Patent No.: US 10,228,721 B2
(45) Date of Patent: Mar. 12, 2019

(54) PORTABLE COMPUTING SYSTEM

(71) Applicant: Apple Inc., Cupertino, CA (US)

(72) Inventors: Houtan R. Farahani, San Ramon, CA (US); Craig C. Leong, San Jose, CA (US); Matthew W. Blum, San Francisco, CA (US); Zheng Gao, San Jose, CA (US); Kevin M. Robinson, Sunnyvale, CA (US); Keith J. Hendren, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 53 days.

(21) Appl. No.: 15/215,530

(22) Filed: Jul. 20, 2016

(65) Prior Publication Data

US 2016/0327980 A1 Nov. 10, 2016

Related U.S. Application Data

(63) Continuation of application No. 14/642,667, filed on Mar. 9, 2015, now Pat. No. 9,411,380.

(Continued)

(51) Int. Cl.
*G06F 1/16* (2006.01)
*H05K 5/00* (2006.01)
(Continued)

(52) U.S. Cl.
CPC ............ *G06F 1/1616* (2013.01); *G06F 1/16* (2013.01); *G06F 1/169* (2013.01); *G06F 1/1637* (2013.01);
(Continued)

(58) Field of Classification Search
CPC .... G06F 1/1616; G06F 1/1637; G06F 1/1656; G06F 1/1662; G06F 1/1683;
(Continued)

(56) References Cited

U.S. PATENT DOCUMENTS 3,810,052 A 5/1974 Yanaga
3,898,393 A 8/1975 Digre
(Continued)

FOREIGN PATENT DOCUMENTS

CN 203366181 U 12/2013
CN 103914108 A 7/2014
(Continued)

OTHER PUBLICATIONS

International Patent Application No. PCT/US2015/066637—International Search Report and Written Opinion dated May 30, 2016, 26 pages.

(Continued)

*Primary Examiner* — Anthony Haughton
(74) *Attorney, Agent, or Firm* — Dickinson Wright RLLP

(57) ABSTRACT

A portable electronic device having several features is disclosed. The device can include a retention member that retains flexible circuits extending from a top portion to a bottom portion of the device, thereby allowing some components to be moved from a top portion of the device to a bottom portion. The device may include a cover plate can be secured with a display in the top portion to cover the retention member and other internal components. The device can include an omni-directional port designed to receive a connector different orientations and provide power to the device. The device can include a flexible keyboard having butterfly keycaps. The device can include an array of openings for an audio driver, with some of the array including through holes and blind holes. The device can also include a touch pad having a force feedback sensor and a haptic device.

12 Claims, 28 Drawing Sheets

Related U.S. Application Data

(60) Provisional application No. 62/101,826, filed on Jan. 9, 2015, provisional application No. 62/101,838, filed on Jan. 9, 2015, provisional application No. 62/104,597, filed on Jan. 16, 2015, provisional application No. 62/104,611, filed on Jan. 16, 2015, provisional application No. 62/106,667, filed on Jan. 22, 2015, provisional application No. 62/106,687, filed on Jan. 22, 2015, provisional application No. 62/111,036, filed on Feb. 2, 2015, provisional application No. 62/106,689, filed on Jan. 22, 2015, provisional application No. 62/111,042, filed on Feb. 2, 2015, provisional application No. 62/128,955, filed on Mar. 5, 2015, provisional application No. 62/058,081, filed on Sep. 30, 2014, provisional application No. 62/058,074, filed on Sep. 30, 2014, provisional application No. 62/058,087, filed on Sep. 30, 2014, provisional application No. 62/101,854, filed on Jan. 9, 2015, provisional application No. 62/129,692, filed on Mar. 6, 2015, provisional application No. 62/129,841, filed on Mar. 7, 2015, provisional application No. 62/129,842, filed on Mar. 7, 2015, provisional application No. 62/129,843, filed on Mar. 7, 2015.

(51) Int. Cl.
| | |
|---|---|
| *H05K 7/00* | (2006.01) |
| *G06F 3/02* | (2006.01) |
| *G06F 3/01* | (2006.01) |
| *G06F 3/041* | (2006.01) |
| *G06F 3/0354* | (2013.01) |
| *H05K 5/04* | (2006.01) |

(52) U.S. Cl.
CPC .......... *G06F 1/1656* (2013.01); *G06F 1/1662* (2013.01); *G06F 1/1683* (2013.01); *G06F 1/1688* (2013.01); *G06F 1/1698* (2013.01); *G06F 3/01* (2013.01); *G06F 3/016* (2013.01); *G06F 3/02* (2013.01); *G06F 3/0202* (2013.01); *G06F 3/0227* (2013.01); *G06F 3/03547* (2013.01); *G06F 3/041* (2013.01); *H05K 5/04* (2013.01); *G06F 2203/04105* (2013.01)

(58) Field of Classification Search
CPC ...... G06F 1/1688; G06F 1/169; G06F 1/1698; G06F 3/01; G06F 3/016; G06F 3/02; G06F 3/0202; G06F 3/0227; G06F 3/03547; G06F 3/041; H05K 5/04
USPC .............. 361/679.21–679.3, 679.55, 679.56
See application file for complete search history.

(56) References Cited

U.S. PATENT DOCUMENTS

| | | | |
|---|---|---|---|
| 3,938,618 A | 2/1976 | Ambruoso, Sr. | |
| 4,739,316 A | 4/1988 | Yamaguchi et al. | |
| 4,814,566 A | 3/1989 | Sigl | |
| 4,978,949 A | 12/1990 | Herron et al. | |
| 5,406,038 A | 4/1995 | Reiff et al. | |
| 5,422,784 A | 6/1995 | Wakahara et al. | |
| 5,424,586 A | 6/1995 | Hattori et al. | |
| 5,719,799 A | 2/1998 | Isashi | |
| 5,943,214 A | 8/1999 | Sato et al. | |
| 6,087,989 A | 7/2000 | Song et al. | |
| 6,160,701 A | 12/2000 | Baker et al. | |
| 6,168,330 B1 | 1/2001 | Okada et al. | |
| 6,392,871 B1 | 5/2002 | Yanase | |
| 6,429,846 B2 | 8/2002 | Rosenberg et al. | |
| 6,447,314 B1 | 9/2002 | Kato et al. | |
| 6,529,370 B1 | 3/2003 | Kamishima | |
| 6,612,668 B2 | 9/2003 | Doan | |
| 6,654,234 B2* | 11/2003 | Landry ................. G06F 1/1616 248/917 |
| 6,697,495 B1 | 2/2004 | Younm | |
| 6,707,666 B1 | 3/2004 | Chuang | |
| 6,788,530 B2 | 9/2004 | Hill | |
| 6,822,635 B2* | 11/2004 | Shahoian .............. G06F 1/1616 345/156 |
| 6,879,293 B2 | 4/2005 | Sato | |
| 6,911,601 B1 | 6/2005 | Gilbert et al. | |
| 6,936,782 B2 | 8/2005 | Ito | |
| 6,975,507 B2 | 12/2005 | Wang | |
| 7,407,202 B2 | 8/2008 | Ye et al. | |
| 7,474,117 B1 | 1/2009 | Bandholz et al. | |
| 7,480,132 B2 | 1/2009 | Wu et al. | |
| 7,489,502 B2 | 2/2009 | Hong et al. | |
| 7,495,898 B2 | 2/2009 | Lo et al. | |
| 7,907,399 B2 | 3/2011 | Kim et al. | |
| 7,920,378 B2 | 4/2011 | Mihara et al. | |
| 7,933,123 B2 | 4/2011 | Wang et al. | |
| 7,969,731 B2 | 6/2011 | Yang et al. | |
| 7,984,936 B2 | 7/2011 | Lee | |
| 8,068,059 B2 | 11/2011 | Konishi | |
| 8,081,433 B2* | 12/2011 | Iwata ..................... G06F 1/162 361/679.09 |
| 8,164,898 B2 | 4/2012 | Chen et al. | |
| 8,208,249 B2 | 6/2012 | Chin | |
| 8,300,389 B2 | 10/2012 | Kang et al. | |
| 8,340,735 B2 | 12/2012 | Edeler | |
| 8,564,941 B2 | 10/2013 | Watabe et al. | |
| 8,604,931 B1 | 12/2013 | Veloso et al. | |
| 8,654,524 B2 | 2/2014 | Pance et al. | |
| 8,660,623 B2 | 2/2014 | Man et al. | |
| 8,687,353 B2 | 4/2014 | Murakata | |
| 8,773,846 B2 | 7/2014 | Wang | |
| 8,792,231 B2 | 7/2014 | Derryberry | |
| 9,019,697 B2 | 4/2015 | Tamura et al. | |
| 9,048,665 B2 | 6/2015 | Wojcik et al. | |
| 9,203,137 B1 | 12/2015 | Guterman et al. | |
| 9,276,626 B2 | 3/2016 | Rayner | |
| 9,277,035 B2 | 3/2016 | Sung et al. | |
| 9,411,380 B2 | 8/2016 | Farahani et al. | |
| 9,436,227 B2 | 9/2016 | Kotaka et al. | |
| 9,575,514 B2 | 2/2017 | Robinson et al. | |
| 9,710,023 B2 | 7/2017 | Shi et al. | |
| 2002/0032510 A1 | 3/2002 | Turnbull et al. | |
| 2002/0033795 A1* | 3/2002 | Shahoian .............. G06F 1/1616 345/156 |
| 2002/0044132 A1 | 4/2002 | Fish | |
| 2002/0044446 A1 | 4/2002 | Layne et al. | |
| 2002/0046879 A1 | 4/2002 | Barabash | |
| 2002/0063690 A1 | 5/2002 | Chung et al. | |
| 2002/0191808 A1 | 12/2002 | Croft, III et al. | |
| 2004/0017735 A1 | 1/2004 | Kotanagi et al. | |
| 2004/0051670 A1 | 3/2004 | Sato | |
| 2004/0057197 A1 | 3/2004 | Hill et al. | |
| 2004/0150486 A1 | 8/2004 | Barr et al. | |
| 2004/0201532 A1 | 10/2004 | Apostolos et al. | |
| 2005/129263 A1 | 1/2005 | Tamura et al. | |
| 2005/0052833 A1* | 3/2005 | Tanaka ..................... G06F 1/162 361/679.21 |
| 2005/0052834 A1* | 3/2005 | Tanaka ................... F16M 11/10 361/679.27 |
| 2005/0078463 A1 | 4/2005 | Chheda et al. | |
| 2005/0105256 A1 | 5/2005 | Chuang | |
| 2005/0180100 A1 | 8/2005 | Thomason | |
| 2006/0034042 A1 | 2/2006 | Hisano et al. | |
| 2006/0034467 A1 | 2/2006 | Sleboda et al. | |
| 2006/0050061 A1* | 3/2006 | Aiken ................... G06F 1/1626 345/173 |
| 2006/0054704 A1 | 3/2006 | Fitch et al. | |
| 2006/0104469 A1 | 5/2006 | Hawker et al. | |
| 2006/0164799 A1 | 7/2006 | Varela | |
| 2006/0293091 A1 | 12/2006 | Hawker et al. | |
| 2007/0004241 A1 | 1/2007 | Meier et al. | |
| 2007/0075613 A1 | 4/2007 | Mau | |
| 2007/0116261 A1 | 5/2007 | Hawker et al. | |

(56) References Cited

U.S. PATENT DOCUMENTS

| | | |
|---|---|---|
| 2007/0153461 A1 | 7/2007 | Singh et al. |
| 2007/0216702 A1* | 9/2007 | Takahashi ............... H04N 5/64 |
| | | 345/582 |
| 2008/0053713 A1 | 3/2008 | Huang et al. |
| 2008/0164055 A1 | 7/2008 | Wang et al. |
| 2008/0271288 A1 | 11/2008 | Senatori |
| 2009/0027849 A1 | 1/2009 | Tanaka |
| 2009/0032289 A1 | 2/2009 | Timms et al. |
| 2009/0050402 A1* | 2/2009 | Shinohara ............... H04R 1/288 |
| | | 181/207 |
| 2009/0079723 A1 | 3/2009 | Wang et al. |
| 2009/0257207 A1 | 10/2009 | Wang et al. |
| 2009/0323268 A1 | 12/2009 | Iwata |
| 2010/0061584 A1 | 3/2010 | Lin et al. |
| 2010/0073241 A1 | 3/2010 | Vazquez et al. |
| 2010/0091442 A1 | 4/2010 | Theobald et al. |
| 2010/0092022 A1 | 4/2010 | Hopkinson et al. |
| 2010/0138763 A1 | 6/2010 | Kim |
| 2010/0276193 A1 | 11/2010 | Liu |
| 2010/0296243 A1 | 11/2010 | Lu |
| 2010/0321253 A1 | 12/2010 | Vazquez et al. |
| 2010/0326720 A1 | 12/2010 | Tsao et al. |
| 2010/0328182 A1 | 12/2010 | Wong et al. |
| 2011/0045881 A1 | 2/2011 | Lo et al. |
| 2011/0051345 A1 | 3/2011 | Watanabe et al. |
| 2011/0094790 A1 | 4/2011 | Lin et al. |
| 2011/0120901 A1 | 5/2011 | Liu et al. |
| 2011/0141052 A1 | 6/2011 | Bernstein et al. |
| 2011/0193459 A1 | 8/2011 | Yang et al. |
| 2012/0012448 A1 | 1/2012 | Pance et al. |
| 2012/0018208 A1 | 1/2012 | Shimasaki |
| 2012/0050975 A1 | 3/2012 | Garelli et al. |
| 2012/0078627 A1 | 3/2012 | Wagner |
| 2012/0187809 A1 | 7/2012 | Kim |
| 2012/0194393 A1 | 8/2012 | Uttermann et al. |
| 2012/0194448 A1 | 8/2012 | Rothkopf |
| 2012/0212903 A1 | 8/2012 | Hopkinson et al. |
| 2012/0223866 A1 | 9/2012 | Ayala Vazquez et al. |
| 2012/0235942 A1* | 9/2012 | Shahoian ............... G06F 1/1616 |
| | | 345/173 |
| 2012/0285737 A1 | 11/2012 | Judy et al. |
| 2012/0314378 A1 | 12/2012 | Liao |
| 2012/0326886 A1 | 12/2012 | Herman et al. |
| 2013/0003280 A1 | 1/2013 | Degner et al. |
| 2013/0038551 A1 | 2/2013 | Shirai et al. |
| 2013/0044419 A1 | 2/2013 | Watanabe |
| 2013/0063004 A1 | 3/2013 | Lai et al. |
| 2013/0070951 A1 | 3/2013 | Tanaka et al. |
| 2013/0077217 A1 | 3/2013 | Trzaskos et al. |
| 2013/0148315 A1 | 6/2013 | Dabov |
| 2013/0207853 A1 | 8/2013 | Yamamoto et al. |
| 2013/0241641 A1 | 9/2013 | Zhu et al. |
| 2013/0265708 A1 | 10/2013 | Mathew et al. |
| 2013/0307736 A1 | 11/2013 | Larsen et al. |
| 2013/0329359 A1 | 12/2013 | Andre et al. |
| 2014/0009344 A1 | 1/2014 | Zhu et al. |
| 2014/0043744 A1 | 2/2014 | Matsuoka et al. |
| 2014/0092552 A1 | 4/2014 | Bekele |
| 2014/0203974 A1 | 7/2014 | Liu et al. |
| 2014/0268517 A1 | 9/2014 | Moon et al. |
| 2014/0268593 A1 | 9/2014 | DeRosa et al. |
| 2014/0286522 A1 | 9/2014 | Forbes et al. |
| 2014/0292588 A1 | 10/2014 | Yoon et al. |
| 2014/0347228 A1 | 11/2014 | Tseng et al. |
| 2015/0237733 A1 | 8/2015 | Stahr et al. |
| 2015/0338887 A1 | 11/2015 | Farahani et al. |
| 2016/0033621 A1 | 2/2016 | Ottenhues et al. |
| 2016/0105749 A1 | 4/2016 | Qutub et al. |
| 2016/0202727 A1 | 7/2016 | Lin et al. |
| 2016/0202735 A1 | 7/2016 | Robinson et al. |
| 2016/0205766 A1 | 7/2016 | Blum et al. |
| 2016/0209870 A1 | 7/2016 | Farahani et al. |
| 2016/0212892 A1 | 7/2016 | Sweet et al. |
| 2016/0216735 A1 | 7/2016 | Reid et al. |
| 2016/0216741 A1 | 7/2016 | Farahani et al. |
| 2016/0219353 A1 | 7/2016 | Whitwell |
| 2016/0259375 A1 | 9/2016 | Andre et al. |
| 2016/0327986 A1 | 11/2016 | Farahani et al. |
| 2017/0003718 A1 | 1/2017 | Farahani et al. |
| 2017/0133743 A1 | 5/2017 | Kato et al. |

FOREIGN PATENT DOCUMENTS

| | | |
|---|---|---|
| CN | 104407670 A | 3/2015 |
| CN | 103576771 B | 5/2017 |
| WO | 2005043881 A2 | 5/2005 |
| WO | 2013184151 A1 | 12/2013 |

OTHER PUBLICATIONS

International Search Report and written opnion; PCT/US2015/053026; dated Aug. 4, 2016 (39 pages).

Chinese Patent for Utility Model No. ZL201590001019.6—Evaluation Report dated Aug. 21, 2018.

\* cited by examiner

PORTABLE COMPUTING SYSTEM

CROSS-REFERENCE TO RELATED APPLICATIONS

This application claims the benefit of priority under 35 U.S.C. 120 to:

(i) U.S. application Ser. No. 14/642,677, to Farahani et al., filed Mar. 9, 2015, and titled "PORTABLE COMPUTING SYSTEM", now U.S. Pat. No. 9,411,380 issued Aug. 9, 2016, the contents of which is incorporated herein by reference in its entirety for all purposes.

This application claims the benefit of priority under 35 U.S.C. 119(e) to:

(i) U.S. Provisional Application No. 62/101,826, to Shi et al., filed Jan. 9, 2015, and titled "TREATMENT OF A SUBSTRATE SUB-SURFACE";

(ii) U.S. Provisional Application No. 62/101,838, to Robinson et al., filed Jan. 9, 2015, and titled "ENCLOSURE FEATURES OF A PORTABLE COMPUTING DEVICE";

(iii) U.S. Provisional Application No. 62/104,597, to Farahani et al., filed Jan. 16, 2015, and titled "LOGO FEATURES OF A PORTABLE COMPUTER";

(iv) U.S. Provisional Application No. 62/104,611, to Sweet et al., filed Jan. 16, 2015, and titled "HYBRID ACOUSTIC EMI FOAM FOR USE IN A PERSONAL COMPUTER";

(v) U.S. Provisional Application No. 62/106,667, to Sweet et al., filed Jan. 22, 2015, and titled "HYBRID ACOUSTIC EMI FOAM FOR USE IN A PERSONAL COMPUTER";

(vi) U.S. Provisional Application No. 62/106,687, to Farahani et al., filed Jan. 22, 2015, and titled "ENCLOSURE FEATURES OF A PORTABLE COMPUTER";

(vii) U.S. Provisional Application No. 62/111,036, to Farahani et al., filed Feb. 2, 2015, and titled "ENCLOSURE FEATURES OF A PORTABLE COMPUTER";

(vii) U.S. Provisional Application No. 62/106,689, to Reid et al., filed Jan. 22, 2015, and titled "KEYBOARD STRUCTURE AND RETENTION FEATURES OF A PORTABLE COMPUTER";

(ix) U.S. Provisional Application No. 62/111,042, to Reid et al., filed Feb. 2, 2015, and titled "KEYBOARD STRUCTURE AND RETENTION FEATURES OF A PORTABLE COMPUTER";

(x) U.S. Provisional Application No. 62/128,955, to Andre et al., filed Mar. 5, 2015, and titled "CHIN PLATE FOR A PORTABLE COMPUTING DEVICE";

(xi) U.S. Provisional Application No. 62/058,081, to Hendren, filed Sep. 30, 2014, and titled "KEYBOARD ASSEMBLY";

(xii) U.S. Provisional Application No. 62/058,074, to Hendren, filed Sep. 30, 2014, and titled "KEYBOARD ASSEMBLY";

(xiii) U.S. Provisional Application No. 62/058,087, to Hendren, filed Sep. 30, 2014, and titled "KEYBOARD ASSEMBLY";

(xiv) U.S. Provisional Application No. 62/101,854, to Blum et al., filed Jan. 9, 2015, and titled "FEATURES OF A FLEXIBLE CONNECTOR IN A PORTABLE COMPUTING DEVICE";

(xv) U.S. Provisional Application No. 62/129,692, to Farahani et al., filed Mar. 6, 2015 and titled "PORTABLE COMPUTING SYSTEM"; and (xvi) U.S. Provisional Application No. 62/129,841, to Hendren et al., filed Mar. 7, 2015 and titled "KEY FOR KEYBOARD ASSEMBLY", the contents of each is hereby incorporated by reference in their entirety.

(xvii) U.S. Provisional Application No. 62/129,842, to Hendren et al., filed Mar. 7, 2015 and titled "VENTING SYSTEM FOR KEYBOARD ASSEMBLY"; and (xviii) U.S. Provisional Application No. 62/129,843, to Hendren et al., filed Mar. 7, 2015 and titled "LIGHT ASSEMBLY FOR KEYBOARD ASSEMBLY", the contents of each is hereby incorporated by reference in their entirety.

This Application is Related to the Following Cases:

(i) International Application PCT/US2013/00086, to Parivar et al., with an international filing date of Mar. 15, 2013, and titled "VARYING OUTPUT FOR A COMPUTING DEVICE BASED ON TRACKING WINDOWS";

(ii) U.S. Pat. No. 8,633,916, to Bernstein et al., and titled "TOUCH PAD WITH FORCE SENSORS AND ACTUATOR FEEDBACK";

(iii) U.S. Ser. No. 14/499,209, to Leong et al., filed Sep. 28, 2014, and titled "LOW-TRAVEL KEY MECHANISM USING BUTTERFLY HINGES";

(iv) U.S. Ser. No. 14/058,316, to Leong et al., filed Oct. 21, 2013, and titled "MULTI-FUNCTIONAL KEYBOARD ASSEMBLIES";

(v) U.S. Ser. No. 14/543,748 to Amini et al., filed Nov. 17, 2014, and titled "CONNECTOR RECEPTACLE HAVING A TONGUE"; and (vi) U.S. Ser. No. 14/641,216, to Farahani et al., filed Mar. 6, 2015 and titled "PORTABLE COMPUTING SYSTEM", the contents of each is hereby incorporated by reference in their entirety.

FIELD

The described embodiments relate generally to portable computing systems. More particularly, the present embodiments relate to enclosures of portable computing systems and methods of assembling portable computing systems.

BACKGROUND

The outward appearance of a portable computing system, including its design and its heft, is important to a user of the portable computing system, as the outward appearance contributes to the overall impression that the user has of the portable computing system. At the same time, the assembly of the portable computing system is also important to the user, as a durable assembly will help extend the overall life of the portable computing system and will increase its value to the user.

One design challenge associated with the manufacture of portable computing systems is the design of the outer enclosures used to house the various internal computing components. This design challenge generally arises from a number conflicting design goals that include the desirability of making the outer enclosure or housing lighter and thinner, of making the enclosure stronger, and of making the enclosure aesthetically pleasing, among other possible goals. Lighter housings or enclosures tend to be more flexible and therefore have a greater propensity to buckle and bow, while stronger and more rigid enclosures tend to be thicker and carry more weight. Unfortunately, increased weight may lead to user dissatisfaction with respect to reduced portability, while bowing may damage internal parts or lead to other failures. Further, few consumers desire to own or use a device that is perceived to be ugly or unsightly. Due to such considerations, portable computing system enclosure materials are typically selected to provide sufficient structural rigidity while also meeting weight constraints, with any aesthetic appeal being worked into materials that meet these initial criteria.

As such, outer enclosures or housings for portable computing systems are often made from aluminum, steel and other inexpensive yet sturdy metals having a suitable thickness to achieve both goals of low weight and high structural rigidity. The use of metal enclosures is also convenient from the standpoint of providing a ready electrical ground and/or a ready radio frequency ("RF") or electromagnetic interference ("EMI") shield for the processor and other electrical components of the computing device, since a metal enclosure or outer housing can readily be used for such functions.

Therefore, it would be beneficial to provide portable computing system that is aesthetically pleasing and lightweight, and durable. It would also be beneficial to provide methods for assembling the portable computing system.

SUMMARY

This paper describes various embodiments that relate to a portable computing system.

A portable computing system includes at least the following: a lid portion that includes a display assembly; a top case pivotally coupled with the lid portion and including sidewalls that enclose and define a cavity and edges of the sidewalls that define a keyboard opening leading into the cavity, and a data port including: a receptacle region defined entirely by one of the sidewalls and having a size and shape configured to receive an electrical connector arranged to pass power and data to and from the portable computing system, a through hole defined by the sidewall and connecting the cavity to the receptacle region, and a printed circuit board (PCB) disposed within the cavity and including an edge connector protruding from one side of the PCB, the edge connector extending into the receptacle region by way of the through hole. The portable computing system also includes a keyboard assembly disposed at least partially within the cavity, the keyboard assembly having a lateral dimension greater than a lateral dimension of the keyboard opening; and a touch-sensitive user interface assembly that includes both an actuator that provides vibratory feedback at the touch-sensitive user interface assembly, and a force sensor arranged to detect an amount of force applied to the touch-sensitive user interface assembly.

In one aspect of the described embodiments, a portable computing system can include at least the following elements: a lid portion including a display assembly; and a base portion pivotally coupled with the lid portion. The base portion includes a top case defining a speaker grill that defines a number of speaker holes. The speaker holes can include a combination of blind holes extending partially through a wall of the top case and through holes extending entirely through the wall of the top case. The through holes can be positioned proximate speakers disposed within an interior volume defined by the base portion. The base portion also includes a bottom case coupled with the top case to define the interior volume, the bottom case including an interior facing surface that includes a first terraced region having a first thickness and a second terraced region having a second thickness, the second thickness being greater than the first thickness, an exterior facing cosmetic surface defining a number of recesses, and a device foot disposed within each of the recesses defined by the exterior facing cosmetic surface.

In another aspect of the described embodiments, a portable computing system includes at least the following elements: a base portion, that includes a keyboard assembly disposed within the base portion and including a number of keycaps extending through corresponding openings defined by a top wall of the base portion, each of the keycaps being supported by a low travel support structure and associated with a discrete LED. The base portion also includes a sidewall defining an opening through which a connector of a printed circuit board extends, the connector being configured to receive electrical power and transmit and receive high-speed data transmissions when a plug is engaged within the opening and electrically coupled with the connector; and a lid portion pivotally coupled with the base portion. The lid portion includes a display, and a retention member that secures one end of a flexible circuit extending between the lid portion and the base portion.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

Figure 1:
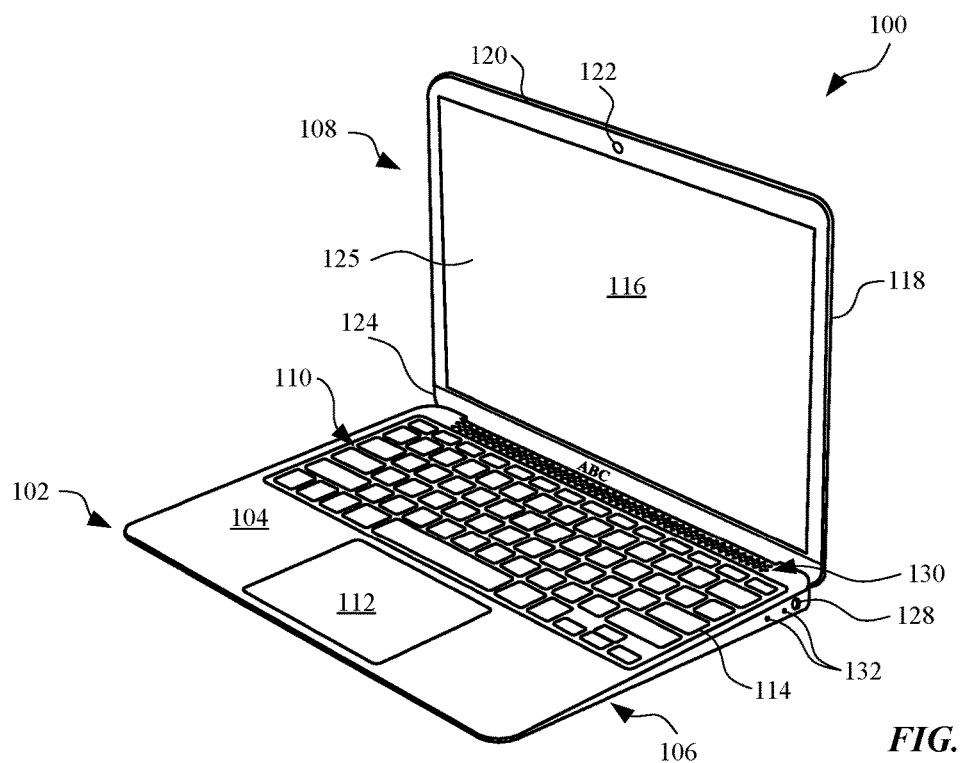
FIGS. 1-2 illustrate front facing perspective views of a portable computing system in an open (lid) state.

Those skilled in the art will appreciate and understand that, according to common practice, various features of the drawings discussed below are not necessarily drawn to scale, and that dimensions of various features and elements of the drawings may be expanded or reduced to more clearly illustrate the embodiments of the present invention described herein.

DETAILED DESCRIPTION

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting, such that other embodiments may be used, and changes may be made without departing from the spirit and scope of the described embodiments.

The following relates to a portable computing system such as a laptop computer, net book computer, tablet computer, etc. The portable computing system can include a multi-part housing having a top case and a bottom case joining at a reveal region to form a base portion. The portable computing system can have an upper portion (or lid) that can house a display screen and other related components whereas the base portion can house various processors, drives, ports, battery, keyboard, touch pad and the like. The base portion can be formed of numerous housing components that can include top and bottom outer housing components each of which can be formed in a particular manner at an interface region such that the gap and offset between these outer housing components are not only reduced, but are also more consistent from device to device during the mass production of devices. These general subjects are set forth in greater detail below.

In a particular embodiment, the lid portion and base portion can be pivotally connected with each other by way of a pair of hinges. In some embodiments, communication can be routed between the lid and base portions by flexible cables extending between the base portion and the lid portion. In one particular embodiment, circuitry configured to drive operations of the display within the lid can be positioned within the base portion and proximate to a location where the lid and base portions are pivotally coupled.

The multipart housing can be formed of a strong and durable yet lightweight material. Such materials can include composite materials and or metals such as aluminum. Aluminum has a number of characteristics that make it a good choice for the multipart housing. For example, aluminum is a good electrical conductor that can provide good electrical ground and it can be easily machined and has well known metallurgical characteristics. Furthermore, aluminum is not highly reactive and non-magnetic which can be an essential requirement if the portable computing system has radio frequency (RF) capabilities, such as WiFi (including dual stream 802.11 ac WiFi), AM/FM, etc. In some embodiments, the multipart housing can be formed by a subtractive machining operation in which portions of a single block of metal are machined away to create one or more housing components with integrally formed features to form the multipart housing. In order to both protect the multipart housing and provide an aesthetically appealing finish (both visual and tactile), a protective layer can be placed or formed on an external surface of the multipart housing. The protective layer can be applied in such a way to both enhance the aesthetic appeal of the housing and to protect the appearance of the portable computing system. In one embodiment, when the multipart housing is formed of aluminum, an exterior surface of the aluminum can be anodized to form the protective layer.

The top case can include a cavity, or lumen, into which a number of operational components can be inserted during an assembly operation. In the described embodiment, the operational components can be inserted into the lumen and attached to the top case in a "top-bottom" assembly operation in which top most components are inserted first followed by components in a top down arrangement. For example, the top case can be provided and shaped to accommodate a keyboard module. The keyboard module can include a keyboard assembly formed of a number of keycap assemblies and associated circuitry, such as a flexible membrane on which can be incorporated a switching matrix. In one embodiment, the keyboard module can be slightly larger than an opening leading into the lumen. In one particular embodiment, the keyboard module can be angled into the lumen and/or bent to accommodate the opening leading into the lumen.

The keyboard module of the portable computing system can include any number of advancements to form an advanced low-profile keyboard module. One advancement that can be utilized to reduce a travel distance of each key is a butterfly hinge. The butterfly hinge can be arranged to provide positive actuation of each key over a short travel distance for each key. In some embodiments, one or more of the keys of the keyboard module can include discrete circuitry that support various functionality associated with one or more of the keys of the keyboard module. In some embodiments, the individual circuitry can include discrete lighting elements so that individual keycaps can be selectively illuminated. In some embodiments, the circuitry under each keycap can serve other purposes such as for example force sensing for distinguishing an amount of force exerted upon a particular key. In some embodiments, circuitry in the keycaps can serve to support other functionality that might not otherwise fit within the space provided by the lumen defined by the multipart housing.

In addition to the keyboard, the portable computing system can include a touch sensitive device along the lines of a touch pad, touch screen, etc. In those embodiments where the portable computing system includes a touch pad, the touch pad can be formed from a glass material. The glass material provides a cosmetic surface and is the primary source of structural rigidity for the touch pad. The use of the glass material in this way significantly reduces the overall thickness of the touch pad compared to previous designs. The touch pad can include circuitry for processing signals from sensors associated with the touch pad. The touch pad can include any one or more of a number of sensors including touch and force sensitive sensors. In some embodiments, the sensors can be configured to react in different ways depending how or in what manner the portable computing system is being used. For example, the touch and or force sensing can be more or less sensitive depending upon the amount of sensitivity appropriate for a given application or control.

In the embodiments where at least one of the top case and bottom case are formed of conductive material, such as aluminum, a good electrical ground plane or electrical ground can be provided. The ability to provide a good ground plane can be particularly advantageous due to the close proximity of the operational components to one another in the portable computing system. Due to this close proximity, it is desirable to isolate sources of significant RF radiation (such as a main logic board, or MLB) from those circuits, such as wireless circuits, that are sensitive to RF interference. In this way, at least the conductive top and/or bottom case be used to provide a good chassis ground that, in turn, can be used to electromagnetically isolate the circuits that produce RF energy from those components that are sensitive to RF energy. Moreover, by forming both top and bottom case with conductive material, the top and bottom case can be joined to form a base portion that can act as a Faraday cage that can effectively shield the external environment from EMI generated by the portable computing system. The Faraday cage like attributes of the base portion can also protect RF sensitive components from externally generated EMI.

In order to provide a pleasing aesthetic to the user, the shape of the portable computing system can have a profile that is pleasing to the eye and to the touch. In the described embodiments, the multipart housing can have a tapered or asymmetrically shaped geometry. The tapered shape can be one in which one end is thicker than the other end such that when the bottom surface of the portable computing system is placed upon a flat supporting surface, such as a table or desk, the angle presented by the tapered shaped housing (in particular the tapered shaped upper portion of the multipart housing) can present an easy to use keyboard arrangement and touch pad. In contrast to conventional portable computing systems such as laptop computers having a uniformly shaped housing with little or no angularity, the tapered shape of the portable computing system can improve user interaction with the touch pad and keyboard by presenting the touch pad surface and the keycaps in a more natural alignment with a user's fingers. In this way, improved ergonomics can help reduce an amount of stress and strain placed upon the user's wrists. The tapered design can also help to reduce an amount of material utilized in areas of the portable computing system where extra space or room is not required. It should be noted that in some embodiments, the tapered or asymmetric shaped geometry of the multipart housing may not result in the user interface being angled towards the user and may only serve to reduce weight and an overall volume of the housing.

Due at least in part to the strong and resilient nature of the material used to form the multipart housing, the multipart housing can include a number of openings having wide spans that do not require additional support structures. Such openings can take the form of ports that can be used to provide access to internal circuits. The ports can include, for example, data ports suitable for accommodating cables (USB, Ethernet, FireWire, etc.) connecting external circuits. The openings can also provide access to an audio circuit, video display circuit, power input, etc.

In some embodiments, the amount and number of ports arranged though the multi-part housing may be substantially reduced. For example, numerous types of input/output ports and power connectors can be combined into a single connector, which can take sole responsibility for receiving power and high-speed data.

These and other embodiments are discussed below with reference to FIGS. 1-45; however, those skilled in the art will readily appreciate that the detailed description given herein with respect to these figures is for explanatory purposes only and should not be construed as limiting.

Figure 2:
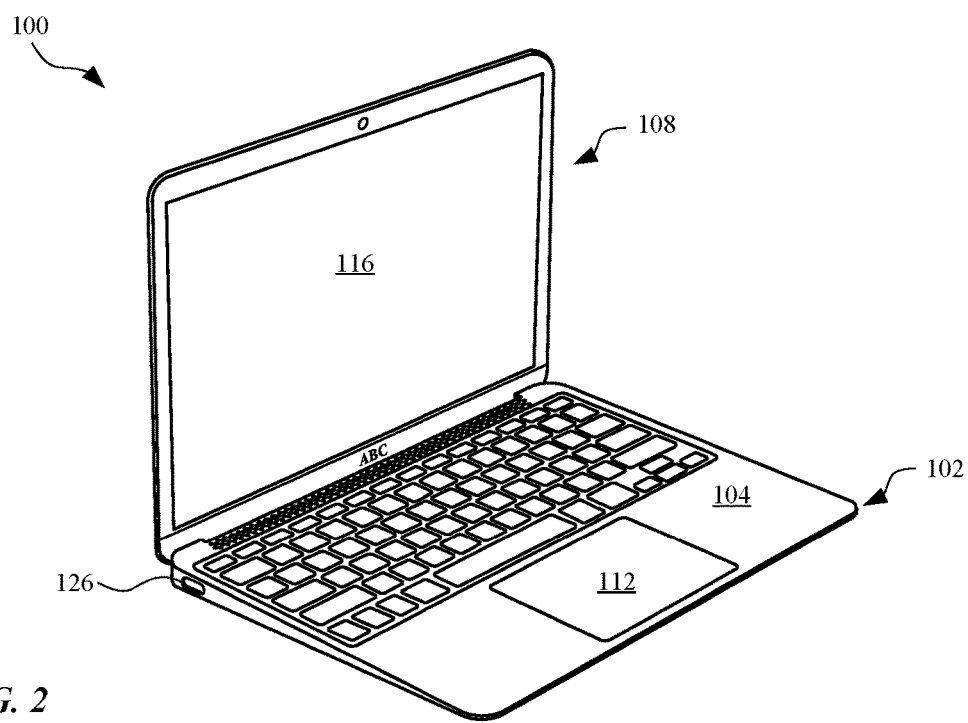
Figure 3:
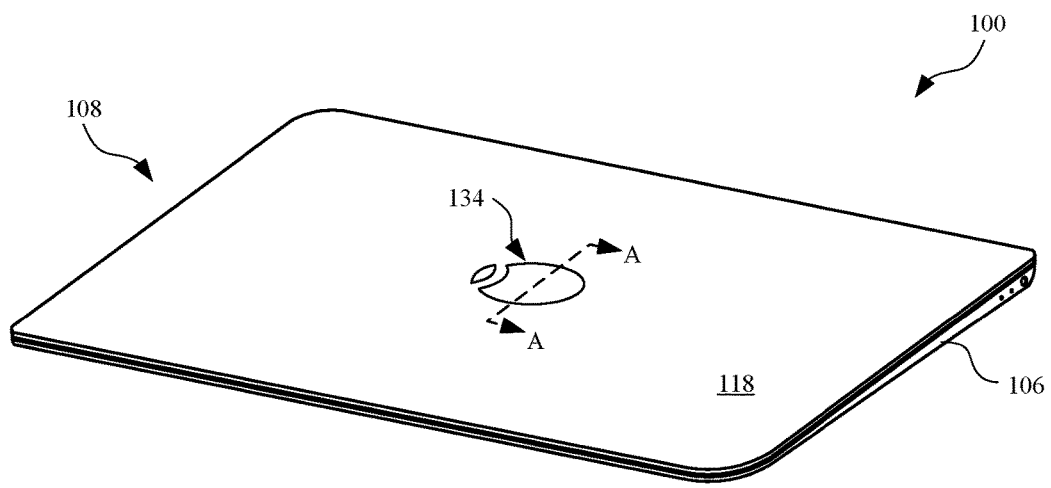
FIGS. 3-4 illustrate a portable computing system in a closed (lid) state.
Figure 4:
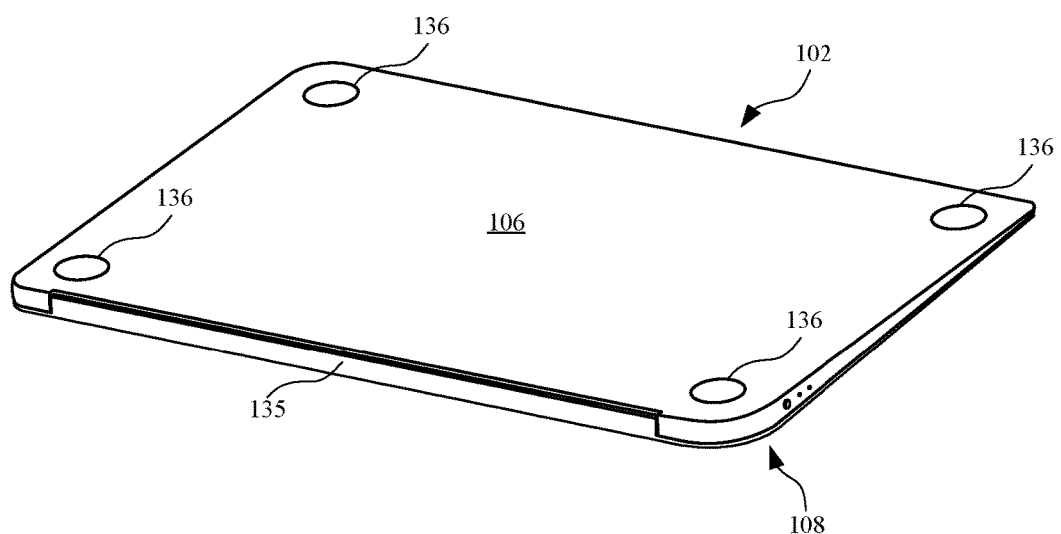

FIGS. 1-4 show various views of portable computing system 100 in accordance with the described embodiments. FIGS. 1-2 show front facing perspective views of portable computing system 100 in an open (lid) state whereas FIGS. 3-4 shows portable computing system 100 in a closed (lid) state. Portable computing system 100 can include base portion 102 formed of top case 104 fastened to bottom case 106. Base portion 102 can be pivotally connected to lid portion 108 by way of hinges that are hidden from view by a cosmetic wall. Base portion 102 can have an overall tapered shape having a first end sized to accommodate the hinged connection that pivotally couples base portion 102 to lid portion 108. In the described embodiment, the overall tapered shape of base portion 102 can be created by the tapered shape of top case 104. Alternatively, in some embodiments, bottom case 106 is tapered to provide a similar result. In some embodiments, bottom case 106 and top case 104 can cooperate to define the tapered shape of base portion 102. Top case 104 can be configured to accommodate various user input devices such as keyboard 110 and touch pad 112. Keyboard 110 can include a number of keycaps 114. In some embodiments, keycaps 114 are low-profile keycaps. In some embodiments, a travel distance of each of keycaps 114 can be minimized so that a volume within base portion 102 is not taken up to accommodate the travel of each of keycaps 114.

Each of keycaps 114 can have a symbol imprinted thereon for identifying a key input associated with the particular keycaps 114. Keyboard 110 can be arranged to receive a discrete input at each of keycaps 114 using a finger motion referred to as a keystroke. In the described embodiment, the symbols on each of keycaps 114 can be laser etched thereby creating an extremely clean and durable imprint that will not fade under the constant application of keystrokes over the life of portable computing system 100. Touch pad 112 can be configured to receive a user's finger gesturing. A finger gesture can include touch events from more than one finger applied in unison. The gesture can also include a single finger touch event such as a swipe or a tap. In some embodiments, touch pad 112 can be configured with force detection sensors configured to determine how much pressure is received at touch pad 112. In this way, applications running on portable computing system 100 can be configured to respond in different ways to varying levels of pressure applied when performing tapping or gesturing actions. Furthermore, in some embodiments touch pad 112 can be configured to provide haptic feedback to a user interacting with touch pad 112 in the form of vibration of touch pad 112.

Lid portion 108 can include display 116 and rear cover 118 (shown more clearly in FIG. 3) that can add a cosmetic finish to lid portion 108 and also provide structural support to at least display 116. In the described embodiment, lid portion 108 can include display trim 120 that surrounds display 116. In some embodiments, both display 116 and display trim 120 can be overlaid by a transparent substrate 125 along the lines of high strength glass or plastic. Lid portion 108 can be moved with the aid of a number of hinges that pivotally couple the lid portion to the base portion, from the closed position to remain in the open position and back again. Display 116 can display visual content such as a graphical user interface, still images such as photos as well as video media items such as movies. Display 116 can display images using any appropriate technology such as a liquid crystal display (LCD), OLED, etc. Portable computing system 100 can also include image capture device 122 located on display trim 120. Image capture device 122 can be configured to capture both still and video images. Display trim 120 can be supported by structural components (not shown) within lid portion 108 but attached to rear cover 118. Display trim 120 can enhance the overall appearance of display 116 by hiding operational and structural components as well as focusing attention onto the active area of display 116. In some embodiments, display trim 120 can be colored to blend seamlessly in with display 116 when display 116 is not illuminated. In addition to display trim 120, lid portion 108 can also include a chin cover 124 that covers a region of lid portion 108 below display 116. Chin cover 124 can be formed from a thin layer of plastic or glass and colored to blend pleasingly in with the rest of portable computing system 100. In some embodiments, chin cover 124 can be configured to mask the appearance of data cables descending from a bottom edge of display 116. Chin cover 124 can also include markings to help identify a type or brand associated with portable computing system 100. Top case 104 can also define data port 126 and audio port 128, which can both be used to transfer data between an external circuit(s) and portable computing system 100. In some embodiments, data port 126 can be configured to receive power and transmit data. Lid portion 108 can be formed to have unibody construction that can provide additional strength and resiliency to lid portion 108 which is particularly important due to the stresses caused by repeated opening and closing. In addition to the increase in strength and resiliency, the unibody construction of lid portion 108 can reduce overall part count by eliminating separate support features. Top case 104 can also define an array of speaker holes 130 through which speakers coupled to bottom case 106 can transmit audio content. Top case 104 can also define microphone openings 132 that are configured to provide a conduit through which microphones within base portion 102 can record audio content.

FIGS. 3-4 show top and bottom perspective views of portable computing system 100. More specifically, FIG. 3 shows a top view of portable computing system 100 showing rear cover 118 of lid portion 108 that partially defines an outward cosmetic appearance of portable computing system 100. Rear cover 118 also defines an opening within which cosmetic logo 134 can be retained. In some embodiment, cosmetic logo 134 can take the form of an at least partially transparent window that can be illuminated by light emitted by display 116. In other embodiments, the opening can take the form of a recess that accommodates cosmetic logo 134 when cosmetic logo 134 takes the form of a metallic logo. The metallic logo can be finished in a way manner that contrasts with the cosmetic surface of rear cover 118. FIG. 4 shows a bottom perspective view of portable computing system 100 in which a protruding end 135 of lid portion 108 conceals a back end of portable computing system 100 where lid portion 108 is coupled with base portion 102. Also, as shown, lid portion 108 includes protruding end 135 capable of pivoting with respect to base portion 102. FIG. 4 also shows how support feet 136 can be arranged along bottom case 106 to provide support to portable computing system 100. Support feet 136 can be formed of wear resistant and resilient material such as plastic, silicone or rubber. In some embodiments, support feet 136 can be mounted to bottom case 106 in a manner similar to the way in which cosmetic logo 134 is mounted to rear cover 118. In some embodiments, a portion of support feet can extend through an opening defined by bottom case 106 and then be heat staked to an interior facing surface of bottom case 106.

Referring again to FIGS. 1-4, the enclosure of portable computing system 100 includes lid portion 108, including rear cover 118 and protruding end 135, and base portion 102, defined by top case 104 and bottom case 106. In some embodiments, top case 104, bottom case 106, lid portion 108, rear cover 118, and protruding end 135 are formed from a metal, such as aluminum. Accordingly, in those embodiments, portable computing system 100 can include an all-metal enclosure, which refers to a portable computing system having an entire outer peripheral portion, with the exception of support feet 136, that includes metal. This allows for a rigid, protective enclosure surrounding the components of portable computing system 100 (see FIG. 3, for example).

Generally, radio frequencies sent and received from a radio antenna from devices such as WiFi or Bluetooth radios cannot permeate through a metal enclosure. Accordingly, traditional portable computing systems may include a plastic or non-metal structure that allows for transmission of the radio frequencies for wireless communication with an external radio. However, portable computing system 100 having an all-metal enclosure may nonetheless include various radios and radio antennas integrated within the all-metal enclosure and disposed in regions other than protruding end 135 to accommodate the all-metal enclosure. For example, in some embodiments, one or more radio antennas are disposed behind chin cover 124 (shown in FIG. 1) which is designed to allow radio frequencies to permeate through chin cover 124. Also, one or more radio antennas may remain disposed proximate to protruding end 135 and rely on openings, such as speaker holes 130 (shown in FIG. 1), for transmission of radio frequencies.

Figure 5:
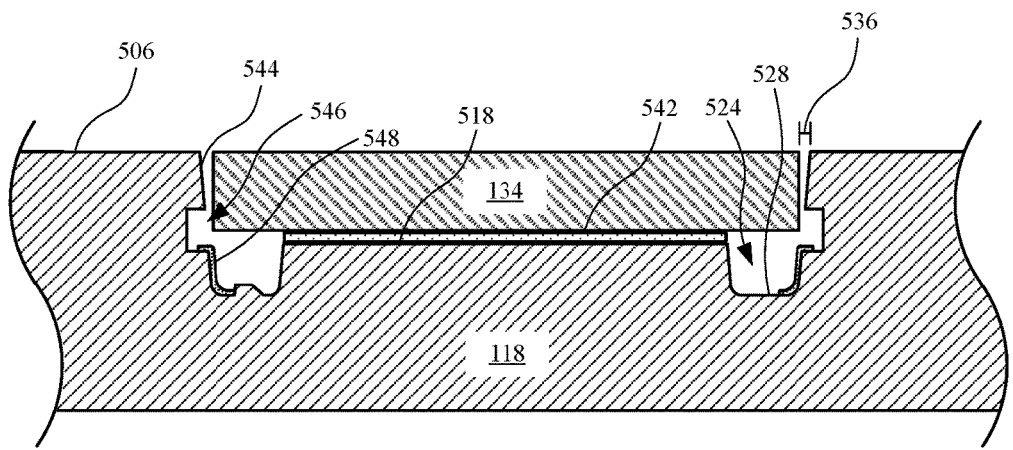
FIG. 5 illustrates a cross sectional view of the rear cover shown in FIG. 3, with a cosmetic logo secured with the logo support.

FIG. 5 illustrates a cross sectional view of rear cover 118 shown in FIG. 4, with cosmetic logo 134 secured with logo support 518. As shown, cosmetic logo 134 is secured with logo support 518 via adhesive layer 542. Also, logo support 518 may be part of a substrate, such as rear cover 118. Also, indention region 546 ensures the cosmetic logo 134 is not disturbed by tapered region 544 of rear cover 118. Further, darkened region 548 disguises surface 528 of relief section 524 as well as a portion of indention region 546. In this manner, a user viewing cosmetic logo 134 may not be able to view surface 528 through gap 536.

Logo support 518 of rear cover 118 is generally flat. That is, logo support 518 is generally parallel to exterior region 506 of rear cover 118. This ensures cosmetic logo 134, when secured with logo support 518, is also flat. In order to ensure logo support 518 is flat, a cutting tool (not shown) may include certain cutting techniques. The formation of the logo support 518 and cutting techniques used to form the logo support 518 are described and explained in U.S. Provisional Application 62/104,597, to Farahani et al., and titled "LOGO FEATURES OF A PORTABLE COMPUTER", the contents of which are incorporated herein by reference in its entirety.

Figure 6:
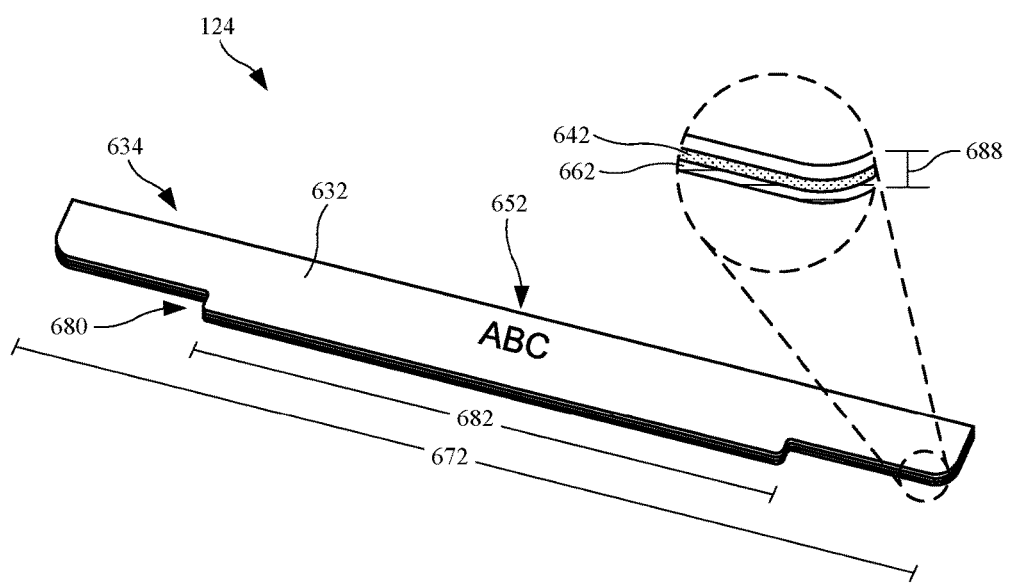
FIG. 6 illustrates an isometric front view of the cover plate, in accordance with the described embodiments.

FIG. 6 illustrates an isometric front view of chin cover 124, in accordance with the described embodiments. Chin cover 124 may include several features. For example, chin cover 124 may include substrate 632. In some embodiments, substrate 632 is formed from plastic. In other embodiments, substrate 632 is formed from carbon fiber. Further, in other embodiments, substrate 632 is formed from fiberglass. In the embodiment shown in FIG. 6, substrate 632 is formed from glass. Accordingly, substrate 632 may be formed from a transparent material. Generally, the substrate 632 can be formed by any material or materials that include a relatively high stiffness-to-thickness ratio, while also allowing electromagnetic waves (such as RF) to pass through substrate 632. In this manner, an internal component such as an antenna (not shown) can be positioned in lid portion 108 (shown in FIG. 1) and also behind substrate 632, and the internal component still send and receive electromagnetic waves passing through substrate 632. In other embodiments, substrate 632 is formed from stainless steel sufficiently thin to allow electromagnetic waves to pass.

Also, in order to increase the stiffness of substrate 632, substrate 632 may undergo a chemical process designed to chemically strengthen substrate 632. This may include submerging substrate 632 in a chemical bath that includes potassium nitrate at a relatively high temperature (for example, 300 degrees Celsius or greater). In addition, substrate 632 undergoes additional processes to alter the texture or roughness. For example, substrate 632 may undergo a blasting process (for example, sand blast) and/or chemical etching process to obtain a surface roughness similar to that of track pad 124 (shown in FIG. 1). In addition, in some embodiments, substrate 632 includes an anti-reflective coating. In this manner, chin cover 124 may include an appearance substantially similar to that of the display 116 (shown in FIG. 1).

As shown, substrate 632 includes first surface 634. First surface 634, when assembled, is associated with a surface that extends away from display 116 (shown in FIG. 1) or a cover glass disposed over display 116. In other words, first surface 634 is a surface that is visible when installed on display 116 or the cover glass. It will be appreciated that the first surface 634 may undergo or include the previous processes (such as the blasting process, chemical etching, and the anti-reflective coating). Along with substrate 632, chin cover 124 may include several features. For example, chin cover 124 may include first layer 642. In some embodiments, first layer 642 is an ink layer. Generally, first layer 642 is an opaque layer applied to substrate 632. Accordingly, first layer 642 may be formed from a relatively dark material, such as black ink. However, alternatively, an opaque material including a lighter color may be applied. Also, in some embodiments, first layer 642 is applied by screen printing onto a second surface of substrate 632. The second surface may be referred to as a surface that is opposite first surface 634. This will be discussed below. Accordingly, as shown in the enlarged view, first layer 642 may be located behind substrate 632 and therefore positioned between substrate 632 and display 116 when chin cover 124 is installed. However, when substrate 632 is formed from a transparent material such as glass, first layer 642 is still visible when chin cover 124 is installed.

Chin cover 124 can also include second layer 652. In some embodiments, the second layer 652 defines an indicium, which can include letters, words, symbols, shapes, or a combination thereof. As shown in FIG. 6, second layer 652 includes several letters. Like first layer 642, second layer 652 may also be applied to the second surface of substrate 632. Further, first layer 642 may be applied to substrate 632 such that certain voids in first layer 642 define an outer perimeter of second layer 652. In other words, first layer 642 may not be fully applied to the second surface, and in those regions, second layer 652 is applied to the second surface of substrate 632. Second layer 652 may include any material or materials used to form first layer 642, and may be applied to the second surface in any manner used to apply first layer 642. However, second layer 652 may include an appearance different from that of first layer 642. For example, first layer 642 may be black while second layer 652 is selected from a color consisting of gray, red, blue, green, yellow, or a combination thereof. Also, in some embodiments, second layer 652 has a color or general appearance similar to that of touch pad 112 (shown in FIG. 1), such as gray.

Chin cover 124 may further include third layer 662 disposed on first layer 642 and second layer 652. Third layer 662 may be formed from any material used to form first layer 642 and second layer 652, and may be applied to the second surface in any manner used to apply first layer 642 and second layer 652. In some embodiments, third layer 662 includes a relatively dark appearance similar to that of first layer 642.

Chin cover 124 may include first dimension 672 representative of a lengthwise dimension of chin cover 124. First dimension 672 may be approximately similar to a lengthwise dimension of display 116 or the cover glass. However, in other embodiments, first dimension 672 can be increased or decreased to a desired dimension. Also, chin cover 124 can include extended region 680 having second dimension 682 than first dimension 672. Generally, second dimension 682 is approximately greater than a dimension of a recessed portion of the top case 104 (shown in FIG. 1) that allows for top case 104 to receive a portion of a clutch assembly (not shown). In this manner, extended region 680 of chin cover 124 may hide or cover additional internal components when portable computing system 100 is in an open configuration (shown in FIGS. 1-2). Further, first layer 642 and third layer 662 may also be applied to extended region 680.

Chin cover 124 may include thickness 688 that accounts for the combined thickness of substrate 632, first layer 642, second layer 652, and third layer 662. In some embodiments, thickness 688 is less than 1 millimeter ("mm"). In the embodiment shown in FIG. 6, thickness 688 is less than 0.4 mm. It will be appreciated that some features or dimensions are not drawn to scale and may be exaggerated to show certain details. Various texturing techniques for substrate 632 are described and explained in U.S. Provisional Application 62/128,955, to Andre et al., and titled "CHIN PLATE FOR A PORTABLE COMPUTING DEVICE", the contents of which is incorporated herein by reference in its entirety.

Figure 7:
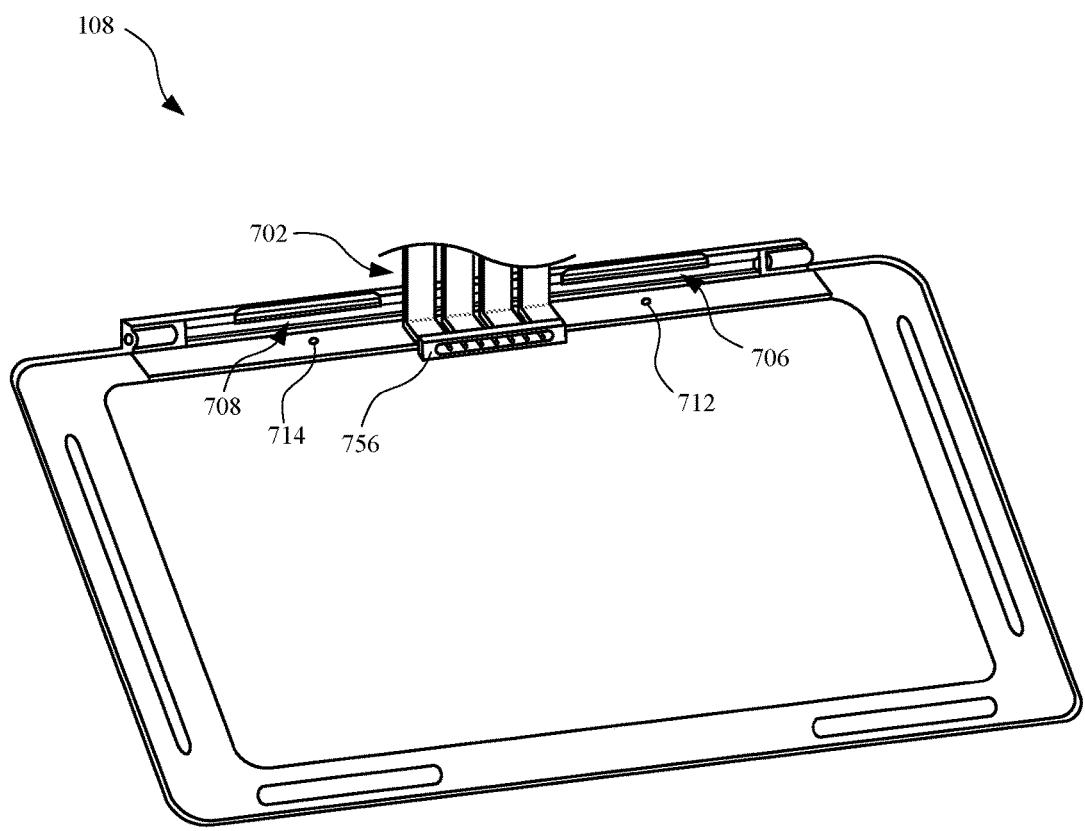
FIG. 7 illustrates an isometric view of an embodiment of a top portion of the portable computing system, in accordance with the described embodiments.

FIG. 7 illustrates an isometric view of an embodiment of lid portion 108 of a portable computing system, in accordance with the described embodiments. Lid portion 108 may also be referred to as a display housing. Display 116 of lid portion 108 is removed to show certain structural features of the lid portion 108. Lid portion 108 can include part of flexible circuit assembly 702 that includes one or more flexible circuits electronically coupled to components in another location of the portable computing system (not shown). Flexible circuit assembly 702 may also extend into base portion 102 (shown in FIG. 1) and electrically connect with one or more components, such as a processor circuit and/or a battery pack. In this manner, the top portion 704 can receive electrical power (from the battery pack) and/or data communication (from the processor circuit) from base portion 102 via flexible circuit assembly 702. As shown, flexible circuit assembly 702 is coupled with connector 756 that may be connected to an integrated circuit or another flexible circuit (not shown). However, as lid portion 108 may be pivotally coupled with base portion 102, some moving parts can exert a force on flexible circuit assembly 702. In some cases, after several cycles of rotating or pivoting lid portion 108 with respect to base portion 102, the force exerted on flexible circuit assembly 702 can cause flexible circuit assembly 702 to decouple from connector 756. As a result, flexible circuit assembly 702 no longer relays power and/or data communication to lid portion 108.

Lid portion 108 can be modified to receive a feature designed to counter the forces exerted on flexible circuit assembly 702 previously described. Before installing the feature, lid portion 108 may undergo several material removal processes by a cutting tool (such as a T-cutting tool). For example, the material removal processes can define first undercut region 706 and second undercut region 708, both of which can be designed to receive a portion of the feature, which will be described below. Also, lid portion 108 can including first mounting hole 712 and second mounting hole 714 designed to secure the feature with lid portion.

Figure 8:
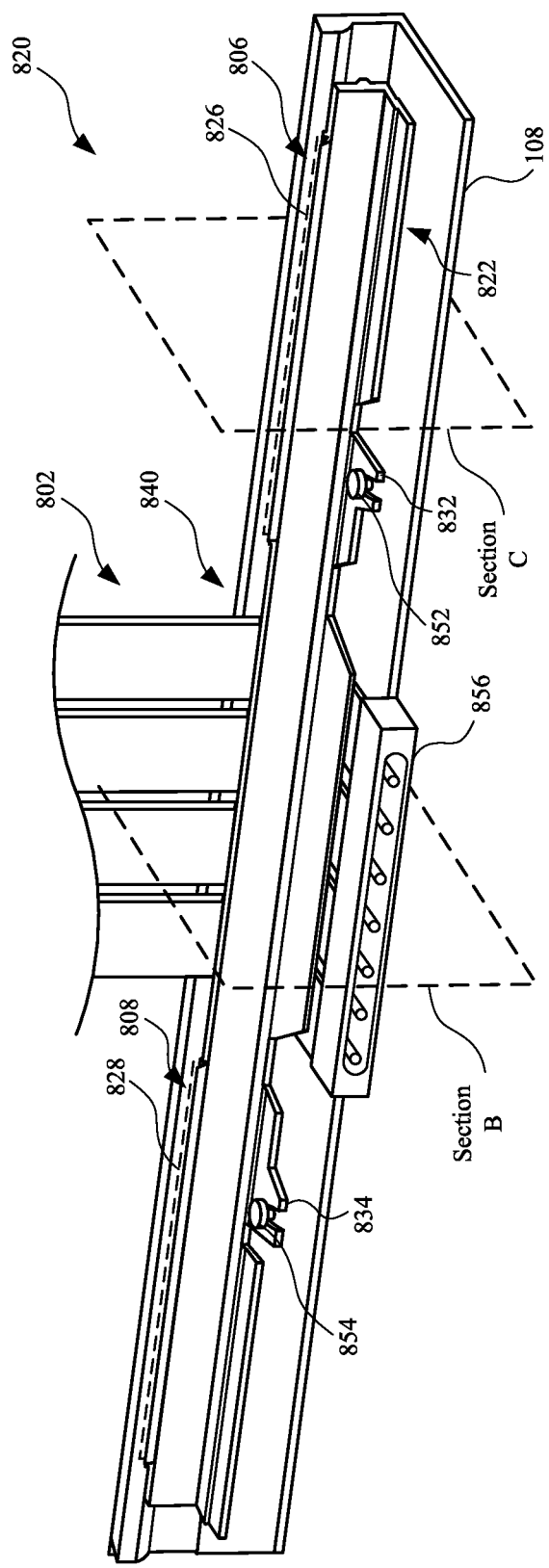
FIG. 8 illustrates an isometric view of the retention member secured with the top portion.

FIG. 8 illustrates an isometric view of retention member 820 secured with lid portion 108. As shown, first mounting structure 832 and second mounting structure 834 receive first fastener 852 and second fastener 854, respectively, to secure retention member 820 with lid portion 108. However, prior to using first fastener 852 and second fastener 854, first extension 826 and second extension 828 are first inserted, or hooked, into first undercut region 806 and second undercut region 808, respectively. In this configuration, first extension 826, second extension 828, central region 840, and a compressible member (not shown) combine to define a counteracting force such that flexible circuit assembly 802 remains relatively immobile in a location proximate to connector 856.

In some embodiments, retention member 820 is formed from a metal (such as aluminum). In the embodiment shown in FIG. 8, retention member 820 is formed from a polycarbonate material, which may include glass fiber. Further, in some embodiments, the materials used to form retention member 820 are injection-molded into a cavity (not shown) that defines the size and shape of retention member 820. This allows for retention member 820 having both a lightweight and custom design that fits into a relatively small space.

Figure 9:
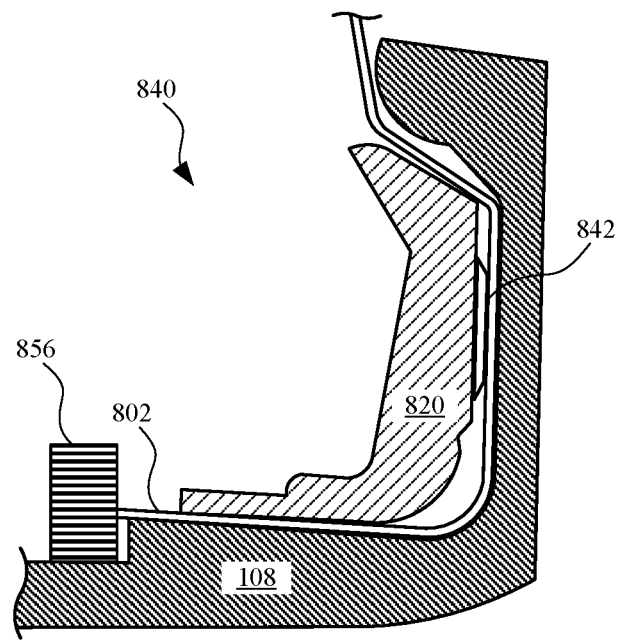
FIG. 9 illustrates a cross sectional view of the central region of the retention member, taken along Section B in FIG. 8.

FIG. 9 illustrates a cross sectional view of central region 840 of retention member 820, taken along Section B in FIG. 8. As shown, compressible member 842 in central region 840 engages flexible circuit assembly 802 such that flexible circuit assembly 802 is engaged with lid portion 108, thereby limiting the overall movement of flexible circuit assembly 802 in a location proximate to connector 856.

Figure 10:
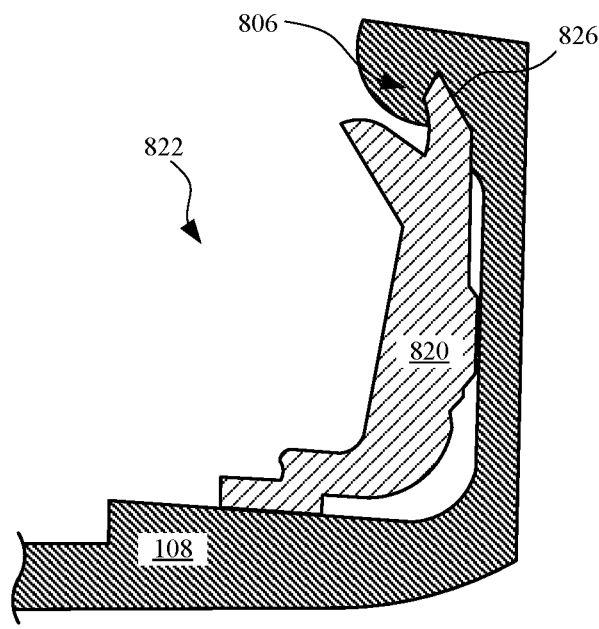
FIG. 10 illustrates a cross sectional view of the first end region of the retention member, taken along Section C in FIG. 8.

FIG. 10 illustrates a cross sectional view of first end region 822 of retention member 820, taken along Section C in FIG. 8. As shown, first extension 826 engages first undercut region 806 of lid portion 108 to provide part of the counteracting force of retention member 820. It will be appreciated that second extension 828 and second undercut region 808 include substantially similar features and configurations.

Retention member 820 is described and explained in: (i) U.S. Provisional Application 62/106,687, to Farahani et al., and titled "ENCLOSURE FEATURES OF A PORTABLE COMPUTER"; (ii) U.S. Provisional Application 62/111,036, to Farahani et al., and titled "ENCLOSURE FEATURES OF A PORTABLE COMPUTER"; (iii) U.S. Provisional Application 62/106,689, to Reid et al., and titled "KEYBOARD STRUCTURE AND RETENTION FEATURES OF A PORTABLE COMPUTER"; and (iv) U.S. Provisional Application 62/111,042, to Reid et al., and titled "KEYBOARD STRUCTURE AND RETENTION FEATURES OF A PORTABLE COMPUTER", the contents of which is incorporated herein by reference in its entirety.

FIG. 10 illustrates a cross sectional view of first end region 822 of retention member 820, taken along Section C in FIG. 8. As shown, first extension 826 engages first undercut region 806 of the lid portion 108 to provide part of the counteracting force of retention member 820. It will be appreciated that the second extension 828 and the second undercut region 808 (shown in FIG. 8) include substantially similar features and configurations. The retention member 820 is described and explained in: (i) U.S. Provisional Application 62/106,687, to Farahani et al., and titled "ENCLOSURE FEATURES OF A PORTABLE COMPUTER"; (ii) U.S. Provisional Application 62/111,036, to Farahani et al., and titled "ENCLOSURE FEATURES OF A PORTABLE COMPUTER"; (iii) U.S. Provisional Application 62/106,689, to Reid et al., and titled "KEYBOARD STRUCTURE AND RETENTION FEATURES OF A PORTABLE COMPUTER"; and (iv) U.S. Provisional Application 62/111,042, to Reid et al., and titled "KEYBOARD STRUCTURE AND RETENTION FEATURES OF A PORTABLE COMPUTER", the contents of which is incorporated herein by reference in its entirety.

Figure 11:
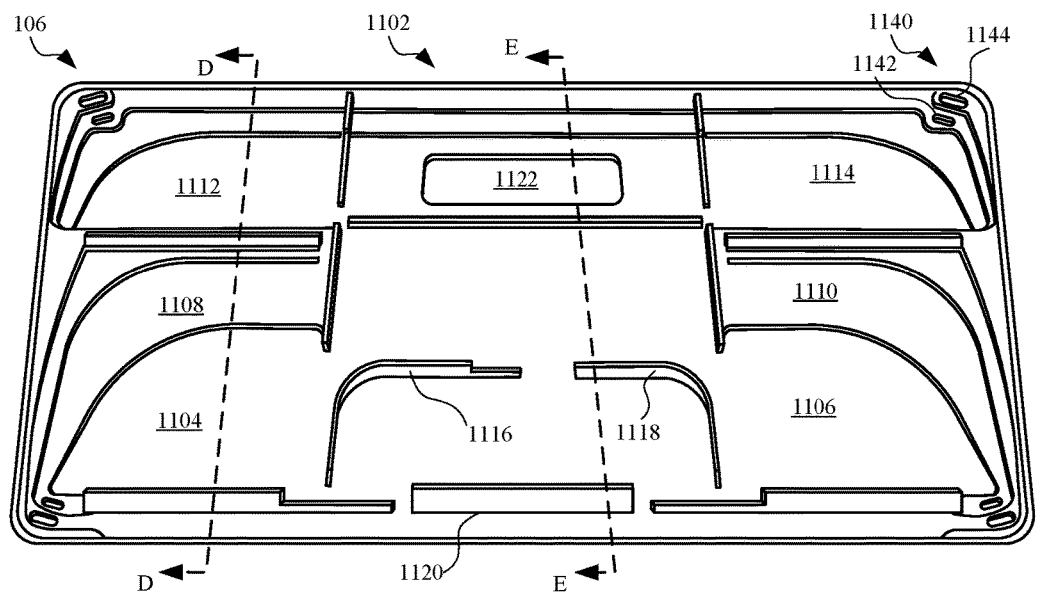
FIG. 11 illustrates an isomeric view of an interior facing surface of a bottom case of a portable computing system, in accordance with the described embodiments.

FIG. 11 illustrates an isometric view of interior facing surface 1102 of bottom case 106 of portable computing system 100, in accordance with the described embodiments. Bottom case 106 provides a base upon which portable computing system 100 rests (shown in FIG. 1). As shown, bottom case 106 has undergone multiple material removal processes to define several terraced regions and structural support features throughout bottom case 106. For example, bottom case 106 includes first terraced region 1104 and second terraced region 1106, both of which are positioned at a substantially similar vertical elevation within bottom case 106. Also, bottom case 106 may further include third terraced region 1108 and fourth terraced region 1110, both of which are positioned at a substantially similar vertical elevation within bottom case 106. However, third terraced region 1108 and fourth terraced region 1110 are positioned at an elevation higher than that of first terraced region 1104 and second terraced region 1106. Also, bottom case 106 may further include fifth terraced region 1112 and sixth terraced region 1114, both of which are positioned at a substantially similar vertical elevation within bottom case 106. Fifth terraced region 1112 and sixth terraced region 1114 are positioned at an elevation higher than that of third terraced region 1108 and fourth terraced region 1110. The terraced regions previously described provide additional space for a portable computing system in order to compensate for a smaller form factor of the portable computing system. For example, the terraced regions can receive one or more battery packs having geometry complementary to that provided by bottom case 106. This allows for additional volume for the one or more battery packs as opposed to a bottom case having a substantially planar interior-facing surface. While bottom case 106, as shown in FIG. 11, includes a generally symmetric design, in other embodiments, bottom case 106 is asymmetric. For example, first terraced region 1104 may include a surface area greater than that of second terraced region 1106.

Bottom case 106 can further include additional regions defined by the material removal processes. For example, as shown, bottom case 106 includes a number of structural ribs taking the form of ribs 1116, 1118 and 1120. Because the nature of the subtractive machining operation allows for the structural ribs to be arranged in any geometry, portions of the ribs 1116, 1118 and 1120 can include spline shaped or non-conical curves. Ribs 1116, 11118 and 1120 can provide support to bottom case 106 by, for example, engaging top case 104 (shown in FIG. 1) when top case 104 and bottom case 106 are coupled together and also by increasing a rigidity of bottom case 106. Furthermore, ribs 1116, 1118 and 1120 further define an area in which an internal component (e.g., integrated circuit) can be received by bottom case 106. In some embodiments, various structural ribs can constrain motion of one or more internal components in contact with bottom case 106. In some embodiments, the formation of bottom case 106 can include an additional material removal process that defines cavity 1122 or recess designed to receive an additional internal component.

In some embodiments, a single material removal process with a particular cutting tool is used is applied to a block of material. In some embodiments, the block of material can take the form of an extruded aluminum alloy. In the embodiment shown in FIG. 11, a first cutting process is performed to bottom case 106. The first cutting process uses a first cutting tool. Also, the first cutting process can be referred to a rough cut as a substantial portion of the bottom case 106 is removed. The pattern taken by the first cutting process can be performed in a raster scan operation, or alternatively, in a spiral pattern. Then, a second subsequent cutting process can be performed. The second cutting process can include a second cutting tool with a larger radius than that of the first cutting tool. In this manner, the edges defined by the second cutting tool are generally smoother and reduce the probability of sharp edges that can cut internal components, such as the battery packs. Moreover, a two-part cutting process can reduce manufacturing times of the bottom case 106 when compared with a more traditional, single cutting operation.

Also, the corner regions of bottom case 106 include a pair of openings designed to receive a foot that engages a surface on which bottom case 106 can be positioned. For example, first corner region 1140 includes first cavity 1142 and second cavity 1144 that include openings that extend entirely through bottom case 106. These will be described in detail below. Portable computing system 100 having bottom case 106 with terraced regions previously described allows for portable computing device 100 having no fan assembly, which is often found in traditional portable computing systems. Accordingly, portable computing device 100 may operate with less noise, as noise due to the fan assembly is no longer present.

Figure 12:
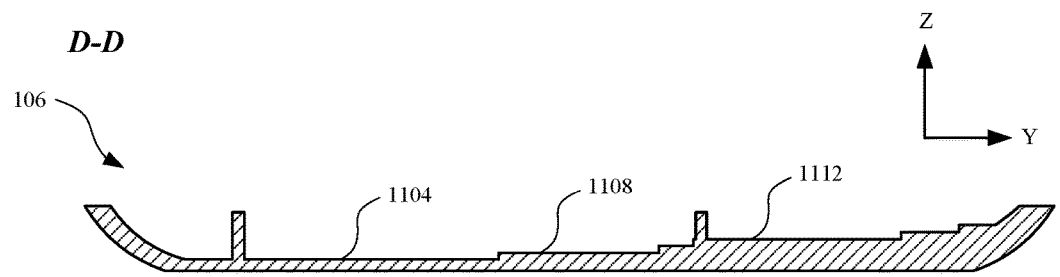
FIG. 12 illustrates a cross-sectional view of the bottom case shown in FIG. 11, taken along section line D-D.
Figure 13:
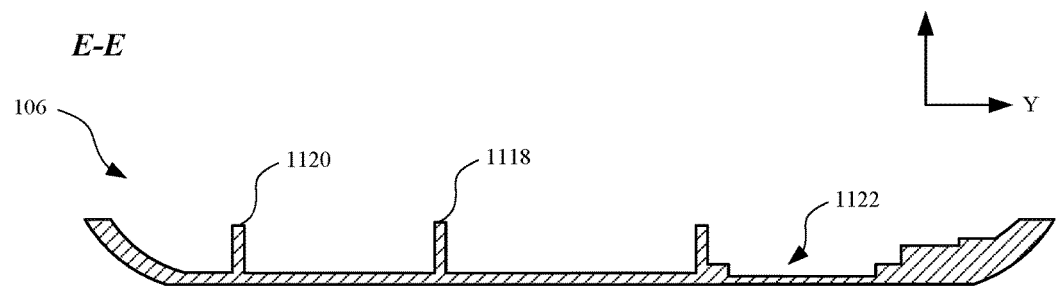
FIG. 13 illustrates a cross-sectional view of the bottom case shown in FIG. 11, taken along section line E-E.

FIGS. 12 and 13 are cross-sectional views of FIG. 11 and illustrate the various elevations of bottom case 106 defined by the two-part material removal process. FIG. 12 illustrates a cross-sectional view of the bottom case shown in FIG. 11, taken along section line D-D. As shown, in the z-dimension, first terraced region 1104 is below third terraced region 1108, which in turn is below fifth terraced region 1112. FIG. 13 illustrates a cross-sectional view of the bottom case shown in FIG. 11, taken along section line E-E. Ribs 1118 and 1120 are higher in elevation in a z-dimension than a region between ribs 1118 and 1120. Also, cavity 1122 is lower in the z-dimension as compared to cross-sectional regions of bottom case 106 shown in FIG. 12, specifically fifth terraced region 1112.

Figure 14:
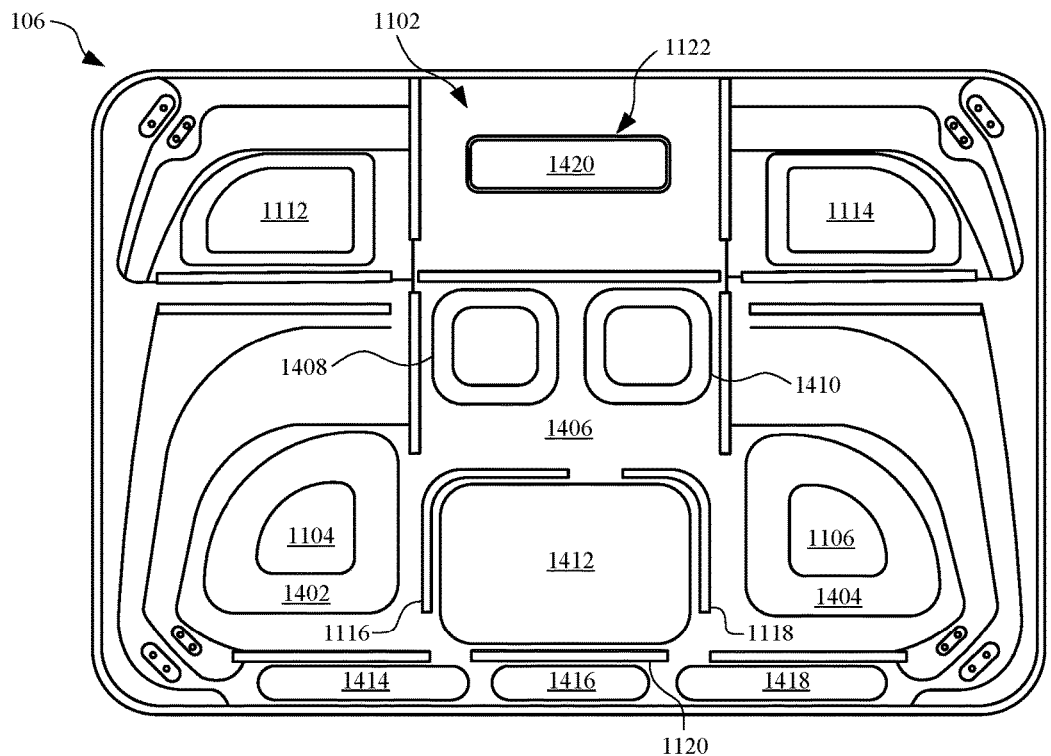
FIG. 14 illustrates a top view of an interior facing surface of the bottom case having several adhesive structures secured with the terraced regions of the bottom case.

FIG. 14 illustrates a top view of interior facing surface 1102 of bottom case 106 having several adhesive structures secured with the terraced regions of bottom case 106. For instance, first terraced region 1104 and second terraced region 1106 include first adhesive ring 1402 and second adhesive ring 1404, respectively. Also, central region 1406 of the bottom case 106 includes third adhesive ring 1408 and fourth adhesive ring 1410. The adhesive rings previously described may be used to secure internal components (for example, battery packs) with bottom case 106. In some embodiments, the adhesive rings are formed from a pressure sensitive adhesive (PSA). Also, the adhesive rings can have a size and a shape that provides sufficient adhesive force to retain the internal components in place. Moreover, the adhesive rings are not excessively large to provide unnecessary adhesion forces. In this manner, a portable computing system 100 (shown in FIG. 1) can be made with a reduced weight based on the size and shape of the adhesive rings. Further, internal components secured with bottom case 106 may include a terraced design corresponding to the terraced regions of bottom case 106. For example, one or more battery packs may include a shape or contour corresponding to first terraced region 1104, third terraced region 1108, and/or fifth terraced region 1112 (shown in FIG. 11). In this manner, the spaces or voids defined by the terraced regions of bottom case 106 may be occupied by the one or more contoured battery packs. Accordingly, portable computing system 100 can include greater battery capacity which can lead to longer usage of portable computing system 100 between consecutive charges of the contoured battery packs. Also, the terraced designed of the battery packs can be chosen to include a shape corresponding to the terraced regions of bottom case 106 even in those embodiments in which bottom case 106 is asymmetric. For example, one or more contoured battery packs disposed over second terraced region 1106, fourth terraced region 1110, and/or sixth terraced region 1114 (shown in FIG. 11) may include a size and shape different (smaller or larger) than that of the one or more battery packs covering to first terraced region 1104, third terraced region 1108, and/or fifth terraced region 1112.

Bottom case 106 may include other adhesive structures. For example, first adhesive structure 1412 is located between ribs 1116, 1118, and 1120 while additional adhesive structures 1414, 1416 and 1418 are disposed forward of rib 1120. In some embodiments, the first adhesive structure 1412 secures an internal component, such as an integrated circuit on a printed circuit board to bottom case 106 while the additional adhesive structures can be used for mounting speaker modules and display circuitry to bottom case 106. Also, cavity 1122 may include second adhesive structure 1420 designed to secure another internal component with bottom case 106. The adhesive structures can take the form of strips of pressure sensitive adhesive. By securing rigid internal components to bottom case 106, the overall structural rigidity of bottom case 106 can be increased and therefore compensates bottom case 106 in instances when bottom case 106 that is relatively thin. In some embodiments, the adhesive structures can be formed of electrically conductive pressure sensitive adhesive so that the internal components can be grounded to bottom case 106 through the adhesive structure. It should be noted that in some embodiments components can alternatively be fastened to bottom case 106 by a number of fasteners. It should be noted that additional details regarding the formation and structure of bottom case 106 can be found in U.S. Provisional Application No. 62/111,042, to Reid et al., filed Feb. 2, 2015, and titled "KEYBOARD STRUCTURE AND RETENTION FEATURES OF A PORTABLE COMPUTER".

Figure 15:
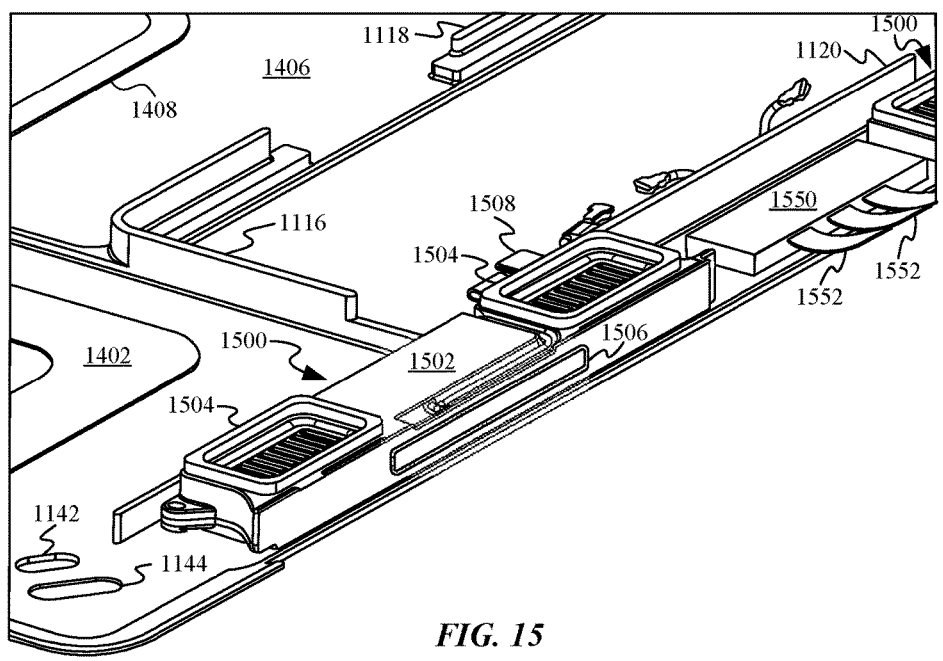
FIG. 15 shows a perspective view of a number of electrical components secured to bottom case.

FIG. 15 shows a perspective view of a number of electrical components secured to bottom case 106. The electrical components can include assemblies 1500 that include speaker and antenna components. Display circuitry 1550 can also be attached to bottom case 106. Assemblies 1500 are configured to electrically isolate speaker components disposed within speaker housing 1502. Speaker housing 1502 can be at least partially coated with a layer of conductive material to prevent electromagnetic interference (EMI) from entering or leaving speaker housing 1502. Each of assemblies 1500 also includes conductive gaskets 1504 that provide a conduit for routing audio signals from within speaker housing 1502 out of base portion 102. When bottom case 106 is joined to top case 104 (shown in FIG. 1), conductive gaskets 1504 are compressed against an interior facing surface of top case 104. Once conductive gaskets 1504 are compressed they can create a grounding path between each of assemblies 1500 and top case 104. In some embodiments, conductive gaskets 1504 can be made up of a windowed block of closed cell foam surrounded by a layer of conductive fabric. The windowed block of closed cell foam can include a number of conductive pathways running through the windowed block of closed cell foam. In this way, any EMI not blocked by the conductive fabric can be blocked by a faraday cage formed through the conductive pathways defined within the windowed block of closed cell foam. The closed cell foam is also operative to prevent audio from escaping through the conductive gaskets 1504. Assemblies 1500 can also include antennas 1506 disposed along an exterior surface of speaker housing 1502. Antennas 1506 are positioned to transmit and receive wireless signals through an opening defined by a gap between top case 104 and bottom case 106 that is at least partially covered by lid portion 108 and a radio frequency transparent cosmetic cover (such as chin cover 124, shown in FIG. 6). Assemblies 1500 can also include flex connectors extending through speaker housing 1502. In some embodiments, speaker housing 1502 can be formed from two housing components and the flex connector can be configured to extend through an interface between the housing components. In this way audio data can be routed into speaker housing 1502. As mentioned above, bottom case 106 can also support display circuitry 1550. Display circuitry 1550 can include video processors and circuit boards configured to drive operations of display 116. Flexible circuits 1552 can be configured to route the instructions generated by display circuitry 1550 into lid portion 108 as previously described in FIGS. 7-10. In some embodiments, display circuitry 1550 can be attached first to top case 104 and simply compressed against an interior facing surface of bottom case 106. It should be noted that additional details regarding the combined speaker and antenna assembly can be found in U.S. Provisional Application No. 62/104,611, to Sweet et al., filed Jan. 16, 2015, and titled "HYBRID ACOUSTIC EMI FOAM FOR USE IN A PERSONAL COMPUTER".

Figure 16:
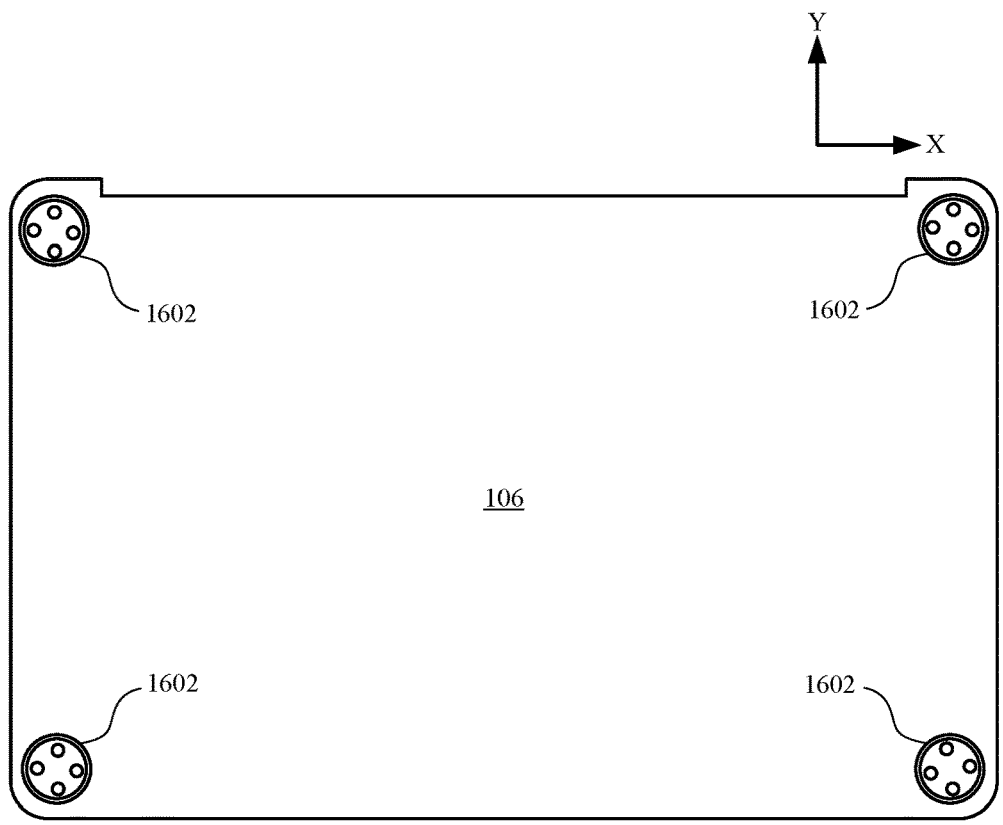
FIG. 16 illustrates a bottom view showing an exterior facing cosmetic surface of a bottom case having several recesses configured to receive support feet.

FIG. 16 illustrates a bottom view showing an exterior facing cosmetic surface of bottom case 106 having several recesses 1602 configured to receive support feet 136. Recesses 1602 can have size and shape that corresponds to the size and shape of support feet 136. In this way, when support feet are positioned within corresponding recesses 1602, support feet 136 can be prevented from shifting in the X and Y axes by walls defining recesses 1602. Due to the spacing limitations created by the terraced regions previously described, a particular process is developed to secure support feet 136 to bottom case 106. In some embodiments, recesses 1602 can be quite shallow so that no more than a slight lip is defined by bottom case 106. The slight lip can be just tall enough to constrain lateral motion of support feet 136 along the exterior facing cosmetic surface during an installation operation.

Figure 17:
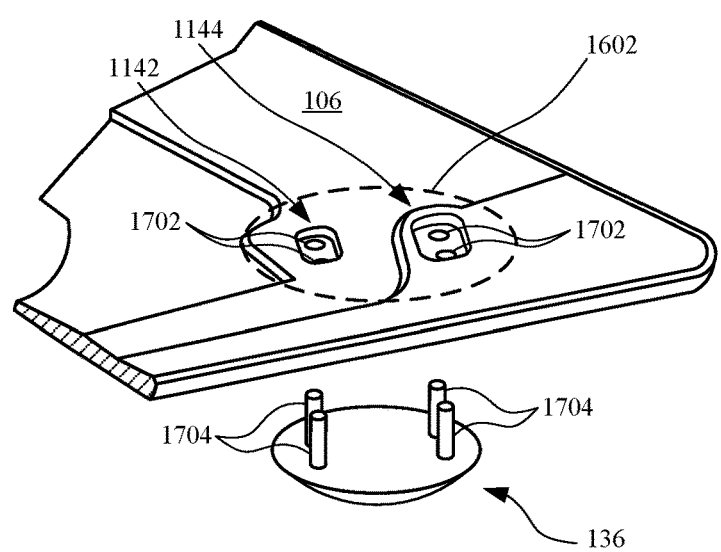
FIG. 17 illustrates an isometric view of a corner region of a bottom case prior to receiving a first one of support feet.

FIG. 17 illustrates an isometric view of a corner region of bottom case 106 prior to receiving a first one of support feet 136. As shown, first cavity 1142 and second cavity 1144 of bottom case 106 include openings 1702 designed to receive protrusions 1704 of support foot 136. Using multiple protrusions makes support foot 136 more robust. For example, if one or more of protrusions 1704 breaks off of support foot 136 the remaining protrusions 1704 are capable of securing support foot 136 with bottom case 106. It should be noted that while four protrusions 1704 and corresponding openings 1702 are depicted that other configurations with a greater or lesser number of protrusions and openings are certainly possible.

Recesses 1602 disposed across the exterior facing surface shown in FIG. 16 can be defined at least in part by a laser ablation process depicted by the circular dashed region 1602 in FIG. 17. The laser ablated portion that defines a periphery of each of recesses 1602 can be used to define a further material removal process in which recesses 1602 are formed. Also, although not shown, an adhesive, such as pressure sensitive adhesive (PSA), can be positioned within the recesses 1602, and can be used to further secure support feet 136 to bottom case 106.

Once support feet 136 are placed within recesses 1602 and the protrusions of support feet 136 extend through openings 1702 of bottom case 106 a heat deforming member can engage the protrusions of foot 136. The heat deforming member can define a heat staking process designed to melt each of the protrusions 1704. Once the melting process is finished, the heat deforming member can be removed. After protrusions 1704 are deformed by the melting process, protrusion 1704 define mechanical interlocks in first cavity 1142 and second cavity 1144. In this manner, support feet 136 can be secured with bottom case 106 by the resulting mechanical interlocks and an adhesive layer (not shown). Also, first cavity 1142 and second cavity 1144 are designed such that the mechanical interlocks are sub-flush, or below, the surrounding surfaces of the bottom case. In this manner, the mechanical interlocks do not disturb other internal components, such as a battery pack, proximate to first and second cavities 1142 and 1144.

Figure 18:
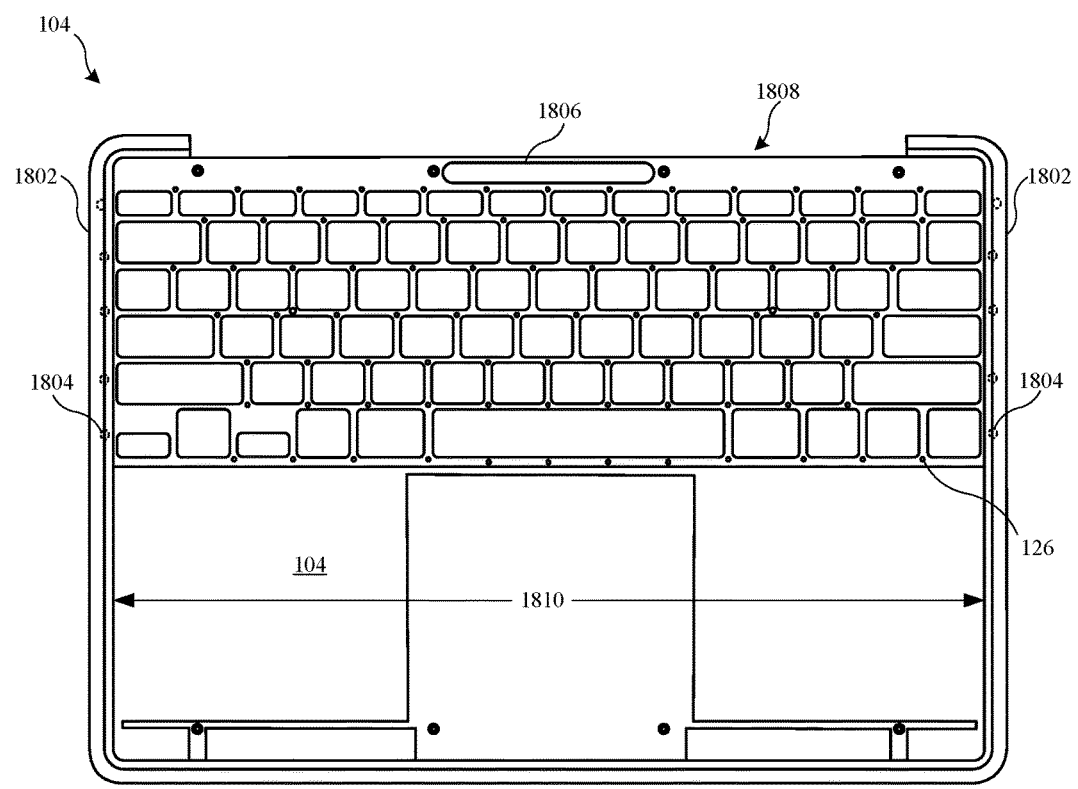
FIG. 18 shows an interior facing surface of a top case, in accordance with the described embodiments.

FIG. 18 shows an interior facing surface of top case 104. Top case 104 may further include several side rails used to create space between top case 104 and bottom case 106 (not shown). For example, top case 104 can include side rails 1802. Also, top case 104 may include several cavities proximate to or defined by side rails 1802. For example, side rails 1802 include end cavities 1804 that can take the form of threaded apertures for receiving fasteners in the form of screws. In some embodiments, end cavities 1804, shown as dotted lines are positioned at least partially within an undercut region defined by side rails 1802 (from a bottom view). In the depicted embodiment, some of end cavities 1804 are positioned completely within the undercut region defined by side rails 1802. End cavities 1804 may be designed and positioned to provide further securing means for various internal components, such as for example a keyboard assembly. Also, although not shown, the interior facing surface of top case 104 can receive an adhesive, along the lines of a layer of pressure sensitive adhesive ("PSA"). Moreover, the PSA can be applied in various locations along a keyboard rib structure 1816 of top case 104, with keyboard rib structure 1816 defined as a web region to receive keycaps 114 (shown in FIG. 1). In this manner, a keyboard assembly (not shown) can be secured to top case 104 by the layer of PSA prior to securing the keyboard assembly to top case 104 with several fasteners secured to the central cavities of top case 104.

The interior-facing surface of top case 104 also includes a material removal region defined by an indention region 1806. Indention region 1806 is designed to allow space for moving parts of other components, such as for example display circuitry 1550 (shown in FIG. 15). Also, the top case 104 includes an opening 1808 defined in part by side rails 1802. The opening 1808 allows top case 104 to receive several internal components. The opening 1808 includes a dimension 1810 which may be defined as a length of opening 1808. It should be noted that additional details regarding top case 104 can be found in U.S. Provisional Application No. 62/111,042, to Reid et al., filed Feb. 2, 2015, and titled "KEYBOARD STRUCTURE AND RETENTION FEATURES OF A PORTABLE COMPUTER". It should be noted that speaker holes shown in top case 104 have been omitted from this particular drawing for simplicity sake. It should also be noted that speaker holes are not required in all cases and can be routed out of top case 104 in other manners.

Figure 19:
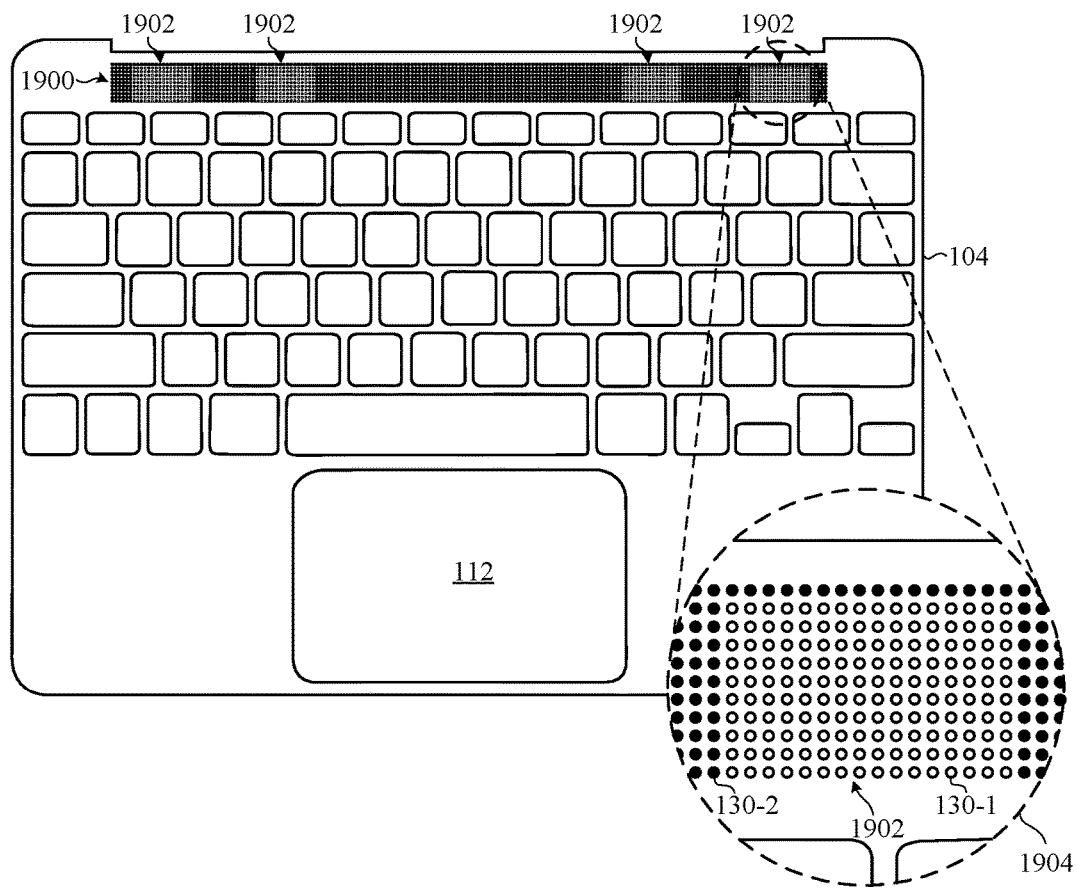
FIG. 19 shows a top view of an exterior cosmetic surface of a top case and how an array of speaker holes can extend across a substantial portion of the top case, in accordance with the described embodiments.

FIG. 19 shows a top view of an exterior cosmetic surface of top case 104 and how array 1900 of speaker holes 130 can extend across a substantial portion of top case 104. Array 1900 can provide a cosmetically pleasing and uniform grid even though many of the holes are located nowhere near a speaker. Unfortunately, if each of speaker holes 130 extended entirely through top case 104 certain lighting conditions could cause internal components to be visible through some of speaker holes 130. One way to overcome this problem is to form those speaker holes 130 not immediately above internal speakers as blind holes that do not extend completely through top case 104. Regions 1902 indicate locations of array 1900 where speaker holes 130 are positioned directly above conductive gaskets 1504 of combined speaker and antenna assemblies 1500 (shown in FIG. 15). Close up view 1904 shows how speaker holes 130 can be through holes 130-1 and speaker holes 130 can be blind holes 130-2. It should be noted that in addition to creating a more uniform cosmetic appearance, blind holes 130-2 can also help top case 104 to maintain its structural integrity, as the blind holes do not result in as much material removal as through holes 130-1 do. Unfortunately, simply forming blind holes 130-2 with no further actions would look strange as the bottom surface of the blind holes would still be bright aluminum, causing blind holes 130-2 to be substantially different from through holes 130-1.

Figure 20:
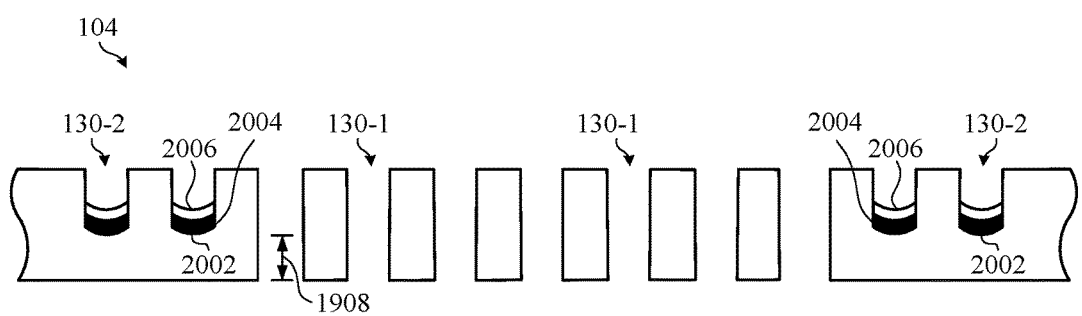
FIG. 20 shows a cross-sectional view of the area depicted in the close up view in FIG. 19 and how the blind holes can be made to look more like the through holes.

FIG. 20 shows a cross-sectional view of the area depicted in close up view 1904 in FIG. 19 and how the blind holes 130-2 can be made to look more like the through holes 130-1. A perforated portion of top case 104 is depicted after having undergone a selective ink coverage process, in accordance with some embodiments. In some embodiments, top case 104 is anodized prior to or after forming through holes 130-1 and blind holes 130-2. Through holes 130-1 and blind holes 130-2 can be formed using any suitable method, including drilling (e.g., mechanical or laser drilling). In some embodiments, the holes are formed using computer numerical control (CNC) methods. The size and shape of each of through holes 130-1 and blind holes 130-2 can vary depending on design requirements and on manufacturing processes. In some embodiments, blind holes 130-2 have curved or non-planar terminal surfaces, which can be a product of the drilling process. For example, if a mechanical drill is used to form blind holes 130-2, terminal surfaces 2002 can be associated with a shape of the drill bit that is used. In some embodiments, through holes 130-1 and blind holes 130-2 are drilled using a drilling machine with drill bit point angle of approximately 130 degrees or 150 degrees. In other embodiments, terminal surfaces 2002 have a different shape, such as a substantially flat shape that can be formed using, for example, a laser drilling process. In some cases, it is found that shallower or flatter terminal surfaces 2002 result in better ink coverage and improved darkening of blind holes 130-2.

In some embodiments, each of through holes 130-1 has substantially the same diameter and each of blind holes 130-2 has substantially the same diameter. In some embodiments, an average diameter of through holes 130-1 is substantially the same as average diameter of blind holes 130-2. In other embodiments, an average diameter of through holes 130-1 is substantially different than an average diameter of blind holes 130-2. In a particular embodiment, an average diameter of through holes 130-1 and average diameter of blind holes 130-2 are each around 0.35 mm. The average depth of blind holes 130-2 can vary depending on design requirements as well as a desired average thickness of the wall. In some embodiments, blind holes 130-2 have substantially the same depth while in other embodiments blind holes 130-2 have varying depths. A thickness of top case 104 can vary depending on design. In some embodiments, blind holes 130-2 are formed about halfway through a thickness of top case 104. In some embodiments, a depth of blind holes 130-2 is at least about 100 micrometers. In one particular embodiment, a wall thickness of top case 104 can be about 600 micrometers, and a depth of blind holes 130-2 range between about 200 micrometers and 300 micrometers, resulting in a remaining support portion having a thickness 1908 ranging between about 300 micrometers and 400 micrometers.

FIG. 20 shows substrate after ink coating 2004 is selectively deposited onto surfaces of inner walls that define blind holes 130-2, such as terminal surfaces 2002. If a printing process is used, the selective coating operation can be referred to as a selective printing process. Note that in some embodiments ink coating 2004 can also cover portions of other surfaces within blind holes 130-2, such as the sidewalls. In some embodiments, the selective depositing avoids depositing ink coating 2004 onto an exterior cosmetic surface of top case 104. This can be accomplished using an ink printer that is designed to accurately dispense ink in predetermined two-dimensional locations. For example, ink-dispensing nozzles of an inkjet type printer can be scanned or passed over the cosmetic surface and through holes to selectively deposit ink coating only within blind holes 130-2.

The method used to deposit ink coating 2004 can depend in part on the size (i.e., diameters) of blind holes 130-2. For example, the deposition technique should be able to form droplets of ink that are small enough to fit within blind holes 130-2. If blind holes 130-2 have small diameters, some spraying techniques may not be able to form ink droplets small enough to provide adequate displacement of air from blind holes 130-2 during the deposition process, resulting in the ink not getting deposited within blind holes 130-2. Thus, the method used should be able to provide ink droplets sufficiently small to overcome any surface tension created when deposited within blind holes 130-2 and allow dislocation of air trapped within blind holes 130-2 during the depositing. In some embodiments, the ink droplet size is less than about 100 microliters, and in a particular embodiment, between about 10 and 100 microliters. In some embodiments, this involves the use of ink jet dispenser systems where small droplets of ink are propelled through a nozzle. Examples of suitable equipment include flatbed printers, such those manufactured by Canon Inc. (Japan), Fujifilm (Japan), and Roland DG Corporation (Japan), which can produce droplets in the scale of picoliters. Other equipment can include piezoelectric style jet dispensers, such as PICO® Piezoelectric jet dispensing systems manufactured by Nordson Corporation (headquartered in Westlake, Ohio, U.S.), which can produce droplets as small as 2 nanoliters.

In some embodiments, ink coating 2004 is a dark colored and opaque ink, such as black ink. The black ink can be made either from a pure black ink (e.g., black 265) or from a mixture of colors, such as a CMYK (cyan, magenta, yellow, and key) mixture. In some embodiments, other combinations of inks with different colors are used. In some embodiments, the ink is mixed with a filler or binder material that provides more volume to ink coating 2004 to ensure full coverage of terminal surfaces 2002. The filler or binder material can itself have a color or can be substantially colorless. If an inkjet printer is used, the filler or binder material can be dispensed at the same time as the black ink using a separate ink jet nozzle so that a thicker layer of ink can be deposited per pass. In some embodiments, the filler or binder material is a clear colored ink, such as clear inks used to provide glossy appearance to prints. In a particular embodiment, a black colored ink is mixed with a clear colored ink. The viscosity of the ink should be sufficient to form small enough droplets of ink, as described above, but also to provide a good opaque color. Note that ink coating 2004 can have any color and is not limited to black or dark colored ink material. For example, ink coating 2004 can have a predetermined color to match a color of an object positioned on or near an interior surface of top case 104 and visible through holes 130-1.

FIG. 20 also depicts an optionally deposited protective coating 2006 that can prevent ink coating 2004 from being dislodged from blind holes 130-2 or prevent ink coating 2004 from exposure to chemicals, such as chemicals used to clean top case 104, and that can lead to loss or discoloration of ink coating 2004 within blind holes 130-2. In some embodiments, protective coating 2006 can also reduce point reflection of ink coating 2004, thereby providing a darker color to blind holes 130-2. In some embodiments, protective coating 2006 is substantially water resistant. Protective coating 2006 can be made of any suitable material. In some embodiments, protective coating 2006 is made of a clear ink, such as the clear ink that is mixed with a black ink for depositing ink coating 2004 in some embodiments described above. It should be noted that additional information regarding formation of the blind speaker holes can be found in U.S.

Provisional Application No. 62/101,826, to Shi et al., filed Jan. 9, 2015, and titled "TREATMENT OF A SUBSTRATE SUB-SURFACE".

Figure 21:
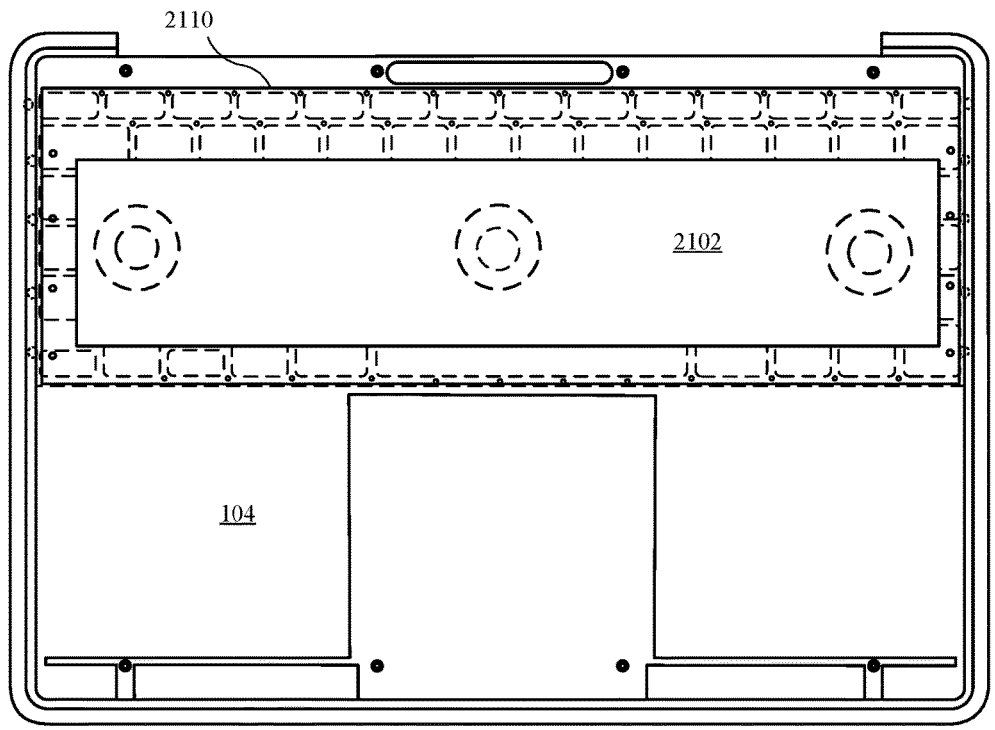
FIG. 21 illustrates a bottom view of the material handling feature carrying the keyboard assembly over the top case, in accordance with the described embodiments.

FIG. 21 illustrates a bottom view of material handling feature 2102 carrying keyboard assembly 2110 over the top case 104, in accordance with the described embodiments. Material handling feature 2102 is designed to carry keyboard assembly 2110 in an assembly process and install keyboard assembly 2110 in the top case 104. Keyboard assembly 2110 may include a flexible printed circuit board that includes several keys defining a keyboard, such as keyboard 110 (shown in FIG. 1). The flexible circuit board is capable of bending to some degree without damaging keyboard assembly 2110. In this manner, a lateral dimension of keyboard assembly 2110 may be larger than a lateral dimension of an opening of the top case 104, and the keyboard assembly 2110 may bend or deform to fit into the opening of top case 104.

Figure 22:
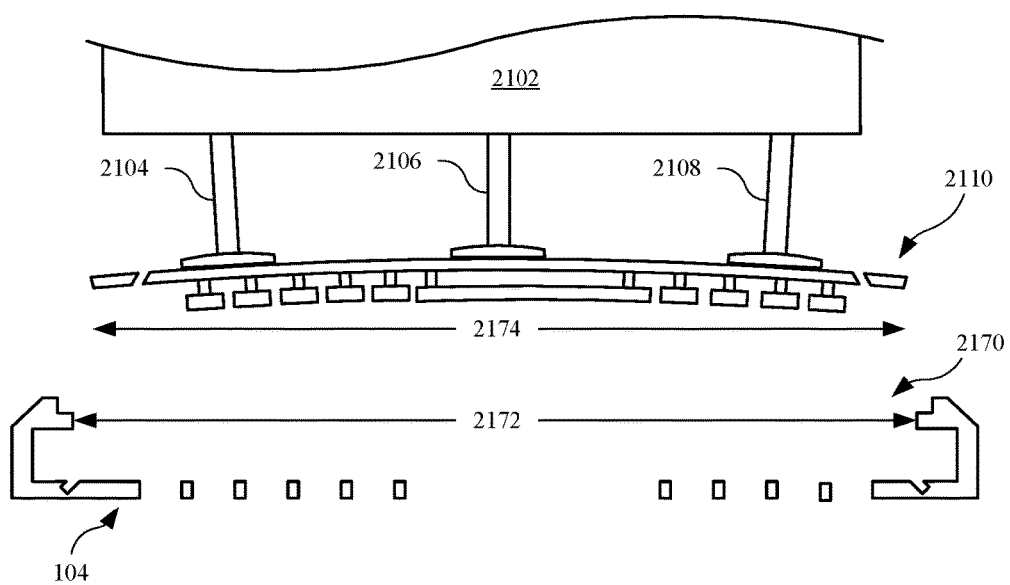
FIG. 22 illustrates a side view of the material handling feature, the keyboard assembly, and the top case shown in FIG. 21.

FIG. 22 illustrates a side view of material handling feature 2102, keyboard assembly 2110, and the top case 104 shown in FIG. 21. As shown, material handling feature 2102 actuates first arm 2104, second arm 2106, and third arm 2108 to deform keyboard assembly 2110 so that a lateral dimension of keyboard assembly 2110 is reduced to second dimension 2174, which is less than dimension 2172 of opening 2170 of top case 104.

Figure 23:
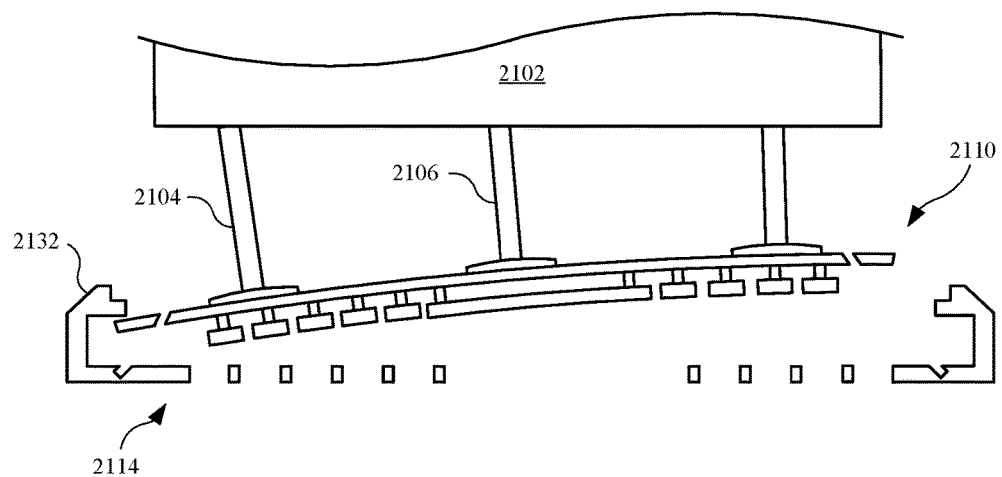
FIG. 23 illustrates a side view of the material handling feature partially inserting the keyboard assembly into the top case, in accordance with the described embodiments.

FIG. 23 illustrates a side view of material handling feature 2102 partially inserting keyboard assembly 2110 into top case 104, in accordance with the described embodiments. As shown, material handling feature 2102 actuates first arm 2104 and second arm 2106 to position a portion of keyboard assembly 2110 below first side rail 2132 of top case 104.

Figure 24:
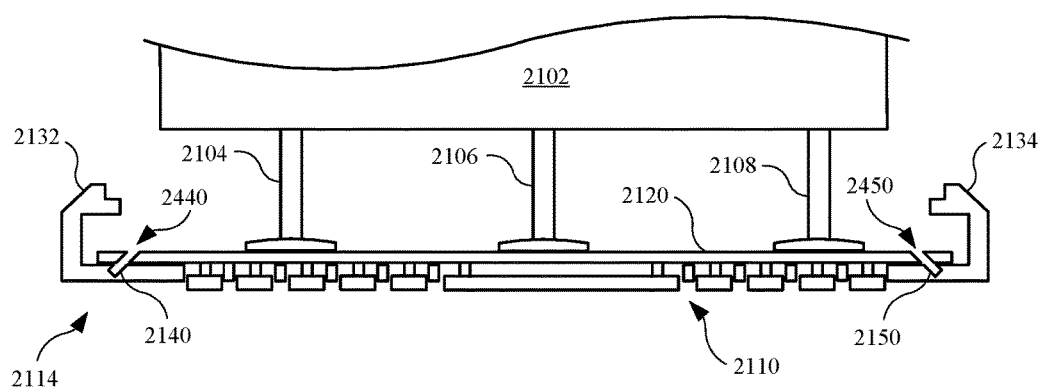
FIG. 24 illustrates a side view of the material handling feature fully inserting the keyboard assembly into the top case, in accordance with the described embodiments.

FIG. 24 illustrates a side view of material handling feature 2102 fully inserting keyboard assembly 2110 into top case 104, in accordance with the described embodiments. Keyboard assembly 2110 and circuit board 2120 are now in an unbent configuration. As shown, material handling feature 2102 actuates first arm 2104, second arm 2106, and third arm 2108 such that portions of keyboard assembly 2110 are under first side rail 2132 and second side rail 2134. Also, material handling feature 2102 can position keyboard assembly 210 such that some of the openings of the keyboard assembly 2110 align with some of the end cavities of the top case 104. For example, first end opening 2440 and second end opening 2450 of the keyboard assembly 2110 are aligned with first end cavity 2140 and second end cavity 2150, respectively, of top case 104. This allows the end openings and the end cavities to receive a fastener (not shown) to secure keyboard assembly 2110 to top case 104. It will be appreciated that the remaining end openings of keyboard assembly 2110 are aligned with the remaining end cavities of top case 104 in a similar manner.

Figure 27:
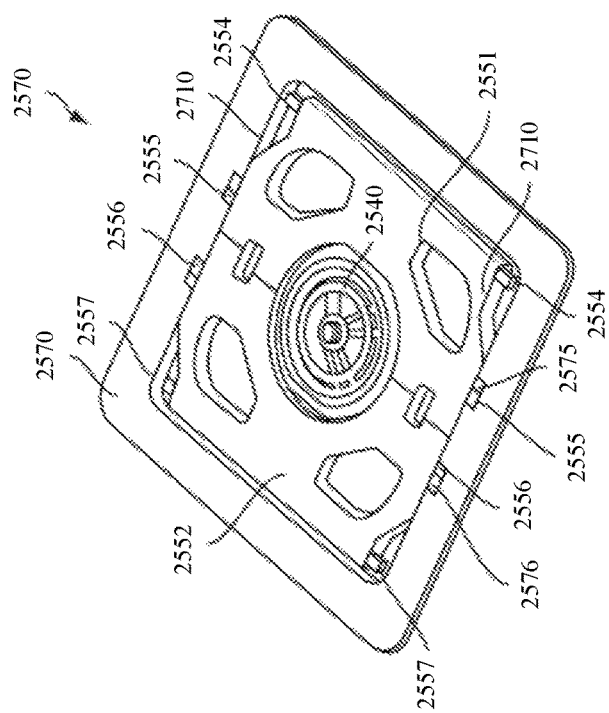
FIG. 27 illustrates illustrative perspective view of a butterfly hinge and support structure in accordance with the described embodiments.
Figure 25:
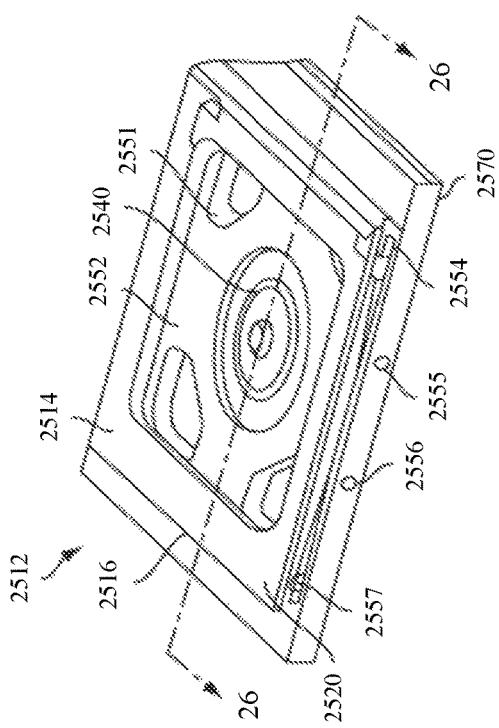
FIG. 25 illustrates an isometric view of a key mechanism in accordance with the described embodiment.
Figure 26:
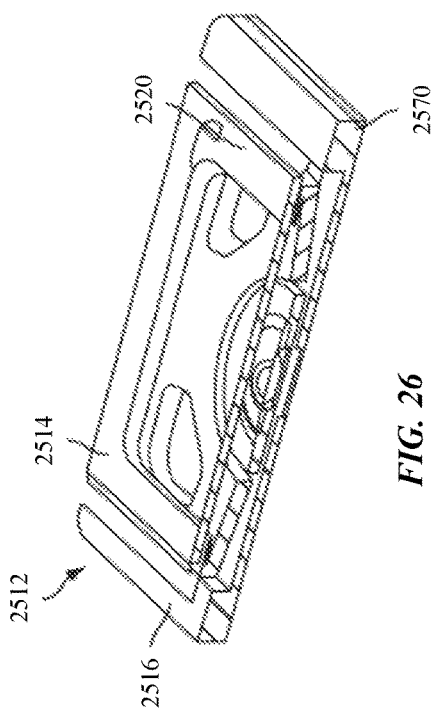
FIG. 26 illustrates shows an illustrative cross-sectional view of the key mechanism of FIG. 25, in accordance with the described embodiments.

FIGS. 25-27 show various illustrative views of another key mechanism, in accordance with the described embodiments. In particular, FIG. 25 shows an illustrative perspective view of key mechanism 2512 in a non-depressed position. FIG. 26 shows a cross-sectional view taken along line 26-26 in FIG. 25. And FIG. 27 shows an illustrative perspective view of key mechanism 2512 without a keycap assembly. As shown in FIG. 25, key mechanism 2512 can include keycap 2514, laminate layer 2516, substructure 2520, switch 2540, butterfly hinge 2550, and support structure 2570. Key mechanism 2512 exhibits many of the same attributes of the key mechanism described and explained in U.S. Ser. No. 14/499,209, to Leong et al., filed Sep. 28, 2014, and titled "LOW-TRAVEL KEY MECHANISM USING BUTTERFLY HINGES".

Butterfly hinge 2550 can form a support structure that includes wings 2551, 2552. Wing 2551 can include pivot pin 2555 and keycap assembly pin 2554. Wing 2552 can include pivot pin 2556 and keycap assembly pin 2557. Keycap assembly pins 1754, 1757 are coupled to substructure 2520 and pivot pins 2555, 2556 are coupled to support structure 2570. Pivot pins 2555, 2556 are secured within slots 2575, 2576, respectively, of support structure 2570. Slots 2575, 2576 may be cavities in support structure 2570 that are covered by laminate layer 2516. In effect, laminate layer 2516 locks pivot pins 2555, 2556 in place within support structure 2570. In this embodiment, pivot pins 2555, 2556 and keycap assembly pins 2554, 2557 all extend away from butterfly hinge 2550.

In some embodiments, switch 2540 is formed from a metal, such as stainless steel. Switch 2540 can fit in a cavity existing between wings 2551, 2552, as shown. In this particular embodiment, the base of switch 2540 can reside on support structure 2570, as opposed to being fixed to substructure 2520. When key mechanism 2512 is in its non-depressed position, switch 2540 is in its unbuckled state and props or biases the keycap assembly up. When key mechanism 2512 is in its depressed position, switch 2540 will be buckled and wings 2551, 2552 will be pressed down in a log shaped position, with all keycap assembly pins 2554, 2557 and pivot pins 2555, 2556 in substantially the same plane. Each wing can include upstops 2710, which are operative to limit the up-travel of the wings when the key mechanism is in its undepressed position. Upstops 2710 may engage laminate layer 2516 in the non-depressed position. Upstops 2710 may be shaped at an angle to enable flush interfacing with the laminate layer. In some embodiments, travel of the keycaps can be limited to between about 0.5 mm and 0.75 mm for a full keystroke.

Figure 28:
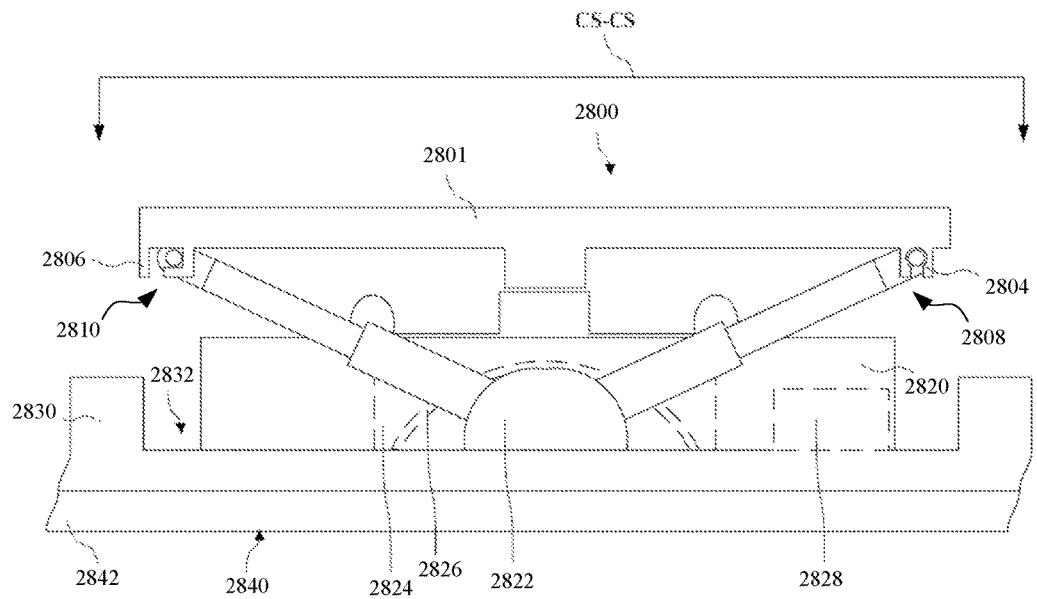
FIG. 28 illustrates a side view of a key assembly of a low-travel keyboard assembly, according to various embodiments.

FIG. 28 shows an illustrative side view of a portion of low-travel keyboard assembly 2800 of a portable computing system, according to some embodiments. Specifically, FIG. 28 shows a side view of a single key assembly of low-travel keyboard assembly 2800. The top case is omitted from FIG. 28 for clarity.

Key mechanism 2801, representative of remaining keycaps of low-travel keyboard assembly 2800, may include several retaining members, such as first retaining member 2804 and second retaining member 2806, both of which are positioned on key mechanism 2801. More specifically, as shown in FIG. 28, key mechanism 2801 may include first retaining member 2804 positioned on first side 2808 of key mechanism 2801, and second retaining member 2806 positioned on a second side 2810 of key mechanism 2801, opposite first side 2808. First retaining member 2804 and second retaining member 2806 may be formed on an underside region of key mechanism 2801 adjacent to switch housing 2820 of low-travel keyboard assembly 2800. The underside region is generally associated with a region of key mechanism 2801 not visible to a user when key mechanism 2801 is assembled with first retaining member 2804 and second retaining member 2806. Also, as shown, switch housing 2820 includes dome switch opening 2824 that houses dome switch 2826 and LED recess 2828 adjacent to dome switch opening 2824.

The first retaining member 2804 and second retaining member 2806 may be utilized to couple key mechanism 2801 within low-travel keyboard assembly 2800, and specifically, to a hinge mechanism 2822 coupled to PCB 2830. Hinge mechanism 2822, as shown in FIG. 28, may include any suitable hinge mechanism 2822 capable of moving key mechanism 2801 from an uncompressed state to a compressed state, including but not limited to: a butterfly hinge mechanism, a scissor hinge mechanism, a telescoping hinge mechanism or a sliding hinge mechanism. Hinge mechanism 2822 may be coupled to and/or positioned within recess 2832 of PCB 2830. PCB 2830 may be coupled with keyboard shield 2840 via adhesive 2842. In some embodiments, adhesive 2842 is a conductive adhesive.

Figure 29:
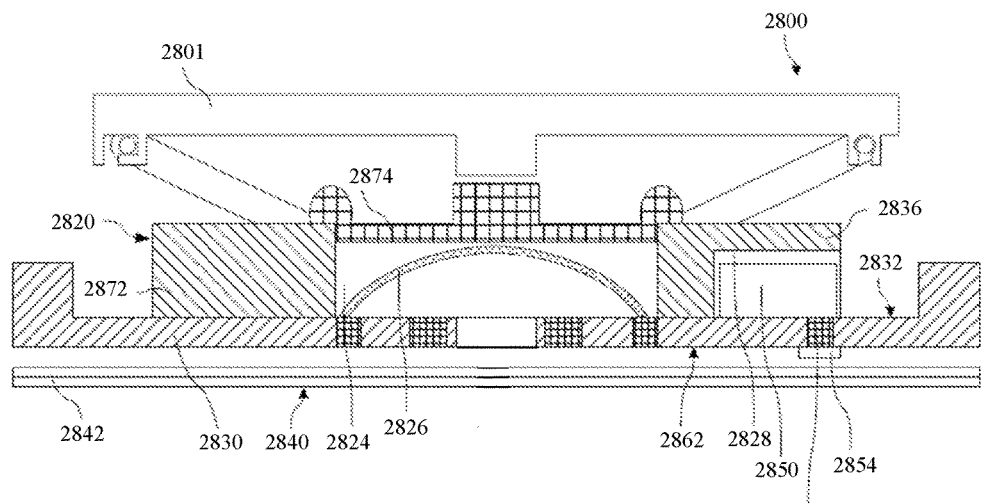
FIG. 29 illustrates cross-section front view of a low-travel keyboard assembly including a switch housing taken along line CS-CS in FIG. 28, according to embodiments.

FIG. 29 shows a front cross-sectional view of low-travel keyboard assembly 2800 taken along line CS-CS in FIG. 28. Low-travel keyboard assembly 2800 may include switch housing 2820 positioned between key mechanism 2801 and PCB 2830. In a non-limiting example, switch housing 2820 may be positioned within recess 2832 of PCB 2830, and may be coupled to PCB 2830 adjacent to key mechanism 2801. Switch housing 2820 may include dome switch opening 2824 formed through switch housing 2820, and LED recess 2828 formed through a portion of switch housing 2820. As shown in FIG. 29, dome switch opening 2824 may receive and/or house dome switch 2826, which may be compressed by key mechanism 2801 to form an electrical connection to interact with a portable computing system. Additionally as shown in FIG. 29, LED recess 2828 of switch housing 2820 may receive LED assembly 2850, which may include a light source that emits a light through switch housing 2820 to key mechanism 2801 to provide a light around the perimeter of key mechanism 2801 and a transparent glyph (not shown) formed through key mechanism 2801. The transparent glyph may be formed from a light-transparent material (e.g., plastic) defined by a letter, number, or a symbol, any of which may be found on a keycap known in the art to allow light to pass.

As shown in FIG. 29, LED assembly 2850, and specifically contacts, or leads, of LED assembly 2850, may be in electrical contact with LED contact 2852 formed through PCB 2830. LED contact 2852 may be in communication with an LED driver 2854 positioned on second surface 2862 of PCB 2830. PCB 2830 may have a number of LED drivers positioned on second surface 2862, where each LED driver 2584 corresponds to, and is in electronic communication with LED assembly 2850 of low-travel keyboard assembly 2800. LED driver 2854 positioned on second surface 2862 of PCB 2830 may be configured to provide power and/or control to LED assembly 2850 during operation of low-travel keyboard assembly 2800 included in the portable computing system 100.

As shown in FIG. 29, switch housing 2820 may include body portion 2872, and a light guide panel (LGP) portion 2874 formed integrally and molded to body portion 2872. Body portion 2872 of switch housing 2820 may include dome switch opening 2824 and LED recess 2828 formed adjacent dome switch opening 2824. Body portion 2872 may be directly coupled to PCB 2830 within recess 2832, as shown in FIG. 29. Body portion 2872 and LGP portion 2874 of switch housing 2820 may be formed from distinct materials. That is, body portion 2872 may be formed from a first material having substantially rigid properties for supporting key mechanism 2801 during operation of low-travel keyboard assembly 2800 and/or protecting the various components (e.g., dome switch 2826, LED assembly 2850) included within switch housing 2820. The first material forming body portion 2872 of switch housing 2820 may also include transparent properties for allowing light emitted by the LED assembly 2850 to pass through body portion 2872 toward key mechanism 2801, as discussed herein. Additionally, the first material of body portion 2872 may include reflective properties for reflecting the light emitted by the LED assembly 2850 to be redirected toward key mechanism 2801.

Several features described for key mechanism 2801 of keyboard assembly 2800 shown in FIGS. 28 and 29 may be incorporated into the embodiment shown in FIGS. 25-27. For instance, the key mechanism 2512 can include a switch housing (such as switch housing 2820 and its described features), an LED assembly (such as LED assembly 2850), and/or an LGP portion (such as LGP portion 2874).

LGP portion 2874 of switch housing 2820 may be formed integrally with body portion 2872. More specifically, as shown in FIG. 29, LGP portion 2874 may be molded to and formed integrally with body portion 2872, and may cover dome switch opening 2824 formed in body portion 2872. LGP portion 2874 may be formed from a second material, distinct from the first material forming body portion 2872, and may be substantially flexible or deformable. As discussed herein, LGP portion 2874 may substantially flex and protect dome switch 2826 when key mechanism 2801 is compressed. In addition to being flexible, the second material forming LGP portion 2874 may include: substantially transparent properties for allowing light to pass through LGP portion 2874 to key mechanism 2801, and/or substantially reflective properties to redirect light toward key mechanism 2801.

LGP portion 2874 may be formed over dome switch opening 2824 to redirect light toward key mechanism 2801, as discussed herein, and to substantially protect dome switch 2826 from undesired wear from key mechanism 2801 during operation of low-travel keyboard assembly 2800. That is, when a force is applied to key mechanism 2801 to compress key mechanism 2801, key mechanism 2801 may contact LGP portion 2874 of switch housing 2820, which may subsequently deform and compress dome switch 2826 to form an electrical connection. By providing a barrier between key mechanism 2801 and dome switch 2826, LGP portion 2874 may reduce the wear on dome switch 2826 over the operational life of low-travel keyboard assembly 2800.

Switch housing 2820 may also include roof portion 2836 formed over LED recess 2828. More specifically, body portion 2872 of switch housing 2820 may include a roof portion 2836 positioned over LED recess 2828 and LED assembly 2850 positioned within LED recess 2828. As shown in FIG. 29, roof portion 2836 of switch housing 2820 may be formed integrally with switch housing 2820, and specifically body portion 2872 of switch housing 2820. However, it is understood that roof portion 2836 of switch housing 2820 may be formed from a distinct component or material that may be coupled to body portion 2872 of switch housing 2820. Roof portion 2836 of switch housing 2820 may be substantially opaque to prevent the light of LED assembly 2850 from being emitted through roof portion 2836.

Figure 30:
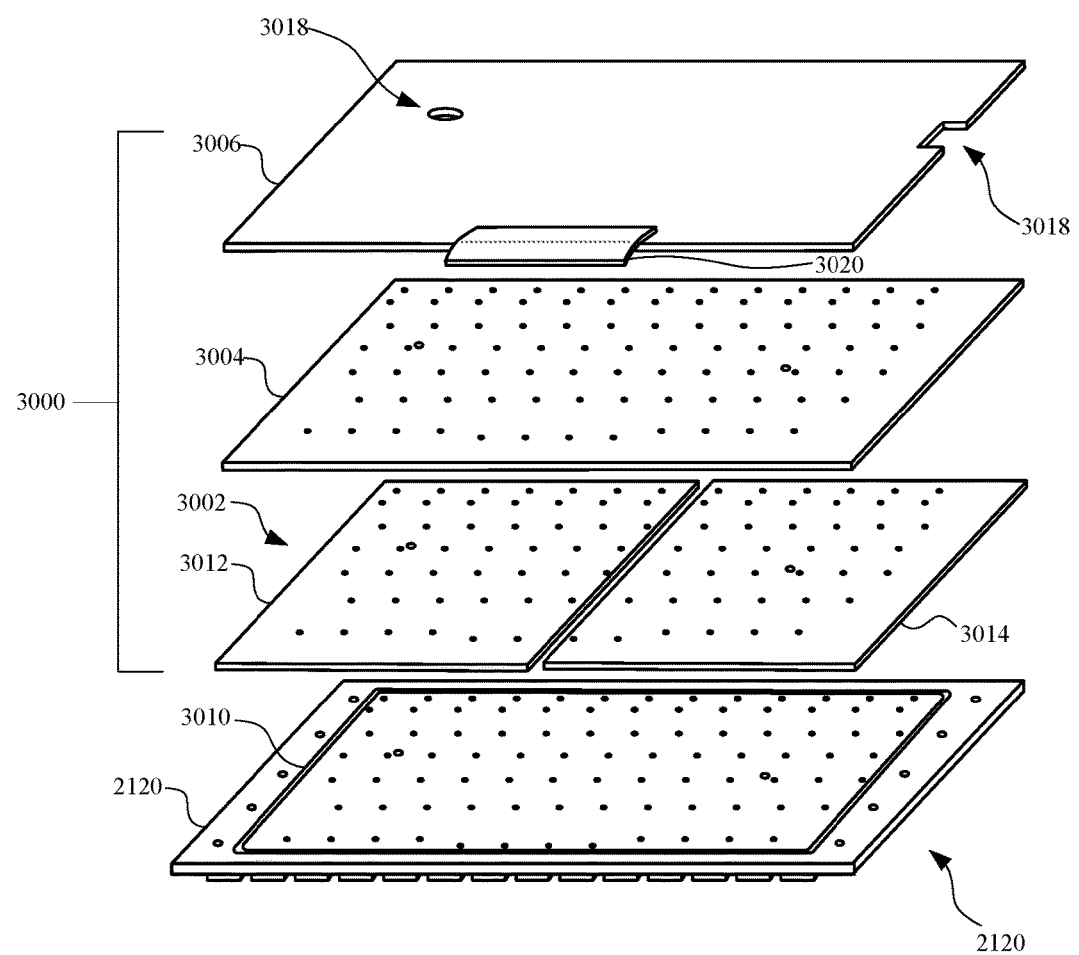
FIG. 30 illustrates an exploded view of several layers defining a keyboard shield used with the keyboard assembly, in accordance with the described embodiments.

FIG. 30 illustrates an exploded view of several layers defining keyboard shield 3000 used with the keyboard assembly, in accordance with the described embodiments. Keyboard shield 3000 may include several layers offering several features. For example, keyboard shield 3000 may include first layer 3002. In some embodiments, first layer 3002 is formed from a non-electrically conductive material. For example, in some embodiments, first layer 3002 is formed from Mylar. First layer 3002 is designed to seal with a rear portion of circuit board 2120 of keyboard assembly 2110. Also, first layer 3002 is designed to prevent ingress of contaminants from entering the portable computing system via the openings in keyboard rib structure 1816 (shown in FIG. 18) and extending to internal components susceptible to damage from the contaminants. Also, first layer 3002 includes several openings in locations corresponding to the locations of the central openings of the circuit board, with the openings of the circuit board designed to receive a fastener in order to secure the circuit (and the keyboard assembly) with the top case. In this manner, a portion of the fasteners and alignment pins used to secure and align keyboard assembly 2110 to a top case (not shown) can extend through the openings of first layer 3002. Further, in some embodiments, first layer 3002 includes a dark color or finish, such as matte black.

Also, in some embodiments, first layer 3002 is formed from a unitary layer. In the embodiment shown in FIG. 30, first layer 3002 is formed from first section 3012 and second section 3014. Further, first section 3012 and second section 3014 may be applied to circuit board 2120 by an embossing procedure. In this manner, first section 3012 and second section 3014 can accommodate some of the keys of the keyboard assembly 2110, in particular keys in the central region, which may exert a force to circuit board 2120 causing the central region of circuit board 2120 to be non-coplanar with respect to remaining regions of circuit board 2120.

Keyboard shield 3000 further includes second layer 3004. In some embodiments, second layer 3004 is formed from an electrically conductive material. For example, in some embodiments, second layer 3004 is formed from aluminum, including aluminum foil. Second layer 3004 may be electrically connected to circuit board 2120 via conductive adhesive 3010 disposed on circuit board 2120. In this manner, second layer 3004 can define part of an electrical grounding path for components electrically connected to second layer 3004, as circuit board 2120 is electrically connected the top case (not shown) via metal fasteners (not shown), both of which may be formed from electrically conductive materials. Also, similar to first layer 3002, second layer 3004 includes several openings in locations corresponding to the locations of the central openings of circuit board 2120 and first layer 3002, thereby allowing a portion of the fasteners and alignment pins to extend through the openings of second layer 3004. Also, although not shown, second layer 3004 may be formed as a first section and a section in a manner similar to that of first layer 3002.

Keyboard shield 3000 may further include third layer 3006. In some embodiments, third layer 3006 is formed from a non-electrically conductive material, such as Mylar. As shown, third layer 3006 includes first custom opening 3016 and second custom opening 3018. First custom opening 3016 and second custom opening 3018 allow internal components of a portable computing device to engage second layer 3004 such that the internal components (not shown) are electrically grounded. Although shown in FIG. 30 in specific locations, first custom opening 3016 and second custom opening 3018 may be formed anywhere through third layer 3006 in order to electrically connect an internal component to second layer 3004. In other embodiments, third layer 3006 includes three or more custom openings.

With the exception of first custom opening 3016 and second custom opening 3018, third layer 3006 is free of openings. Accordingly, first layer 3002 and second layer 3004 can combine with third layer 3006 to define several blind holes. In this manner, a portion of the fasteners extending through first layer 3002 and second layer 3004 are generally shielded via third layer 3006 and therefore not visible. Also, in some embodiments, third layer 3006 includes a dark color or finish, such as matte black. Also, although not shown, third layer 3006 may be formed as a first section and a section in a manner similar to that of first layer 3002.

Keyboard shield 3000 may further include tail member 3020. When keyboard shield 3000 is secured with the keyboard assembly 2110 and when the keyboard assembly 2110 is secured with the top case (not shown) in a manner previously described, tail member 3020 is disposed in indention region 1806 of top case 104 (shown in FIG. 18). In some embodiments, tail member 3020 includes TEFLON. In this manner, the tail member 3020 provides a relatively smooth surface for a moving part of, for example, lid portion 108 (shown in FIG. 7). As shown, tail member 3020 is secured with third layer 3006. However, tail member 3020 may be secured with first layer 3002 and/or second layer 3004.

Also, although not shown, additional layers may be included with keyboard shield 3000. For example, in some embodiments, a graphite layer is integrated with first layer 3002. The graphite layer provides improved thermal properties. For example, the graphite layer absorbs heat generated by some internal components to spread the heat throughout the graphite layer. In addition, other layers including materials such as steel, carbon fiber, and/or glass fiber can be used. These layers provide additional protection to, for example, a battery pack that may otherwise be susceptible to rupturing if contacted by an internal component.

Figure 31:
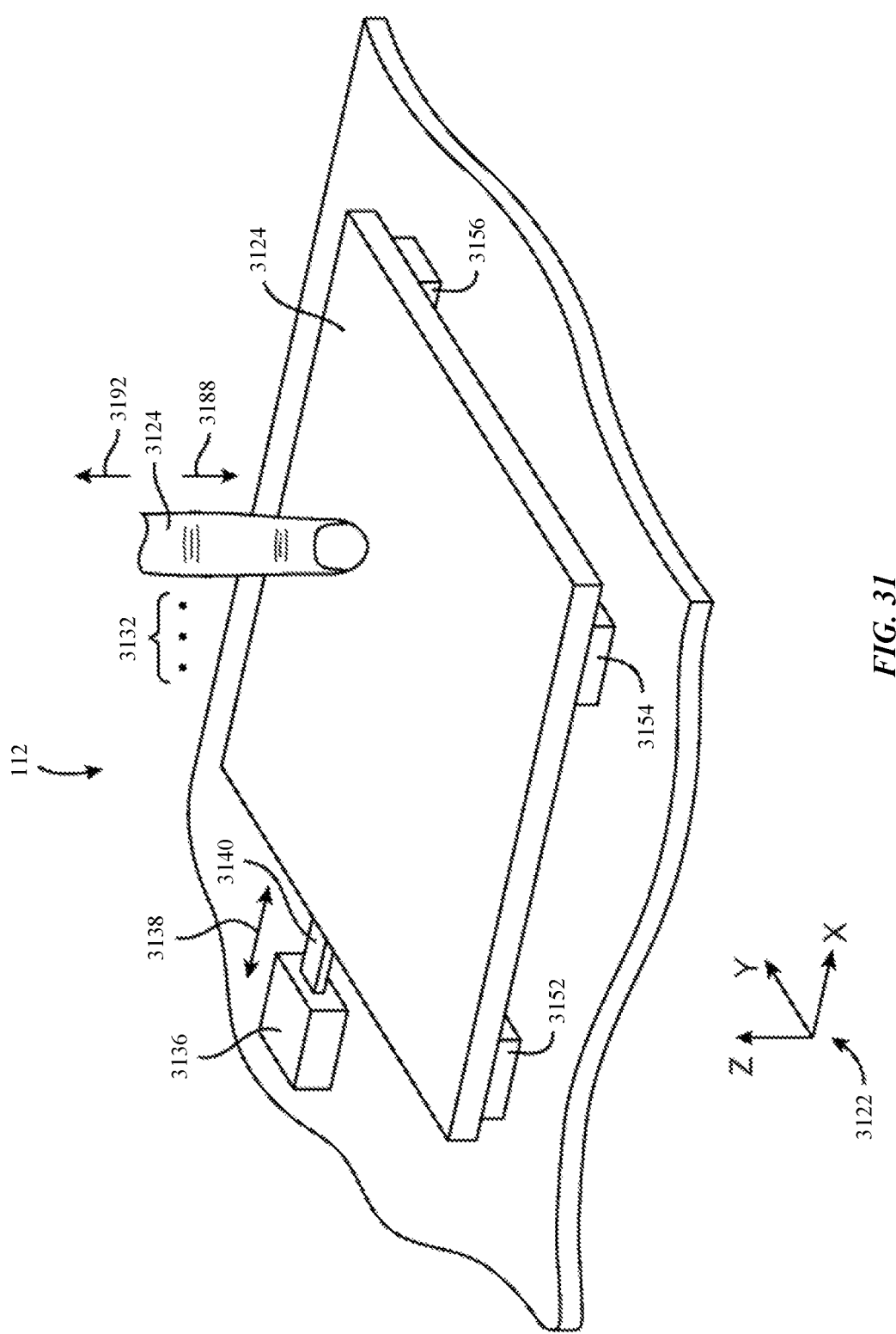
FIG. 31 illustrates an isometric view of an interior portion of an electronic device with a touch pad showing the touch pad having force sensors and an actuator for providing feedback, in accordance with the described embodiments.

FIG. 31 illustrates an isometric view of an interior portion of device portable computing system with touch pad 112 showing the touch pad 112 having force sensors and actuator 3136 for providing feedback, in accordance with the described embodiments. The location of the user's finger(s) or other external object(s) in the X-Y plane of touch pad 112 can be sensed using the touch sensor of touch pad 112. Downwards and upwards motion along the Z-axis can be detected using force sensors. As shown in FIG. 31, touch pad 112 may have a touch pad member 3124 (sometimes referred to as a track pad member). The touch sensor array can be used to measure the position of external objects such as finger 3126 with respect to the X and Y lateral dimensions of touch pad member 3124. As indicated by dots 3132, there may be more than one external object (i.e., more than one finger) touching touch pad member 3124 (e.g., when a user is making a multi-touch gesture command). Arrangements in which a single object is touching touch pad member 24 are sometimes described herein as an example. This is, however, merely illustrative. One object, two objects, three objects, or more than three objects may simultaneously contact touch pad member 3124 if desired.

In addition to touching touch pad member 3124 at one or more locations, a user may generate button actuation events. Button actuation events involve press events in which a user presses downwards in direction 3188 along the Z axis (see, e.g., coordinate system 3122). Button actuation events also involve release events. In a release event, the user reduces the amount of downwards force that is being applied to touch pad member 3124 and stops moving finger 3126 in direction 3188 (e.g., by lifting finger 3126 upwards in direction 3192).

Button actuation actions, which are sometimes referred to as force application events, can be sensed using force sensors. As shown in FIG. 31, touch pad 112 may include first force sensor 3152, second force sensor 3154, and third force sensor 3156, all of which, as shown, engage touch pad member 3124. In some embodiments, touch pad 112 includes four or more force sensors. These force sensors are generally responsive to forces that are applied vertically (along the Z-axis). The force sensors may be placed under the four corners of a rectangular touch pad structure such as touch pad member 3124 as shown in FIG. 31 (as an example). In configurations with two sensors, sensors can be positioned at opposing edges of touch pad member 3124. In configurations with three sensors, the sensors can be distributed so as to form a tripod-type configuration. If only a single sensor is used, the sensor may be located beneath the center of touch pad member 3124 or along an edge of touch pad member 3124 (e.g., the leading edge).

An advantage of placing force sensors at all four corners of touch pad member 3124 is that this allows force signals from multiple sensors to be gathered and processed in parallel. The force sensor signals may be averaged, may be processed to help confirm the location of finger 3126 on touch pad member 3124, or may be processed to determine what type of action should be taken by a portable computing system.

Button actuation activity or other activity (e.g., certain touch events) may result in force feedback. For example, when the user presses downwards on touch pad member 3124 in direction 3188, one or more of first force sensor 3152, second force sensor 3154, and third force sensor 3156 may compress slightly and may detect the resulting force on touch pad member 3124. If a sufficient downwards force is detected, actuator 3136 may be used to impart movement (tactile feedback) to touch pad member 3124. With the illustrative arrangement shown in FIG. 31, actuator 3136 is coupled to touch pad member 3124 by laterally extending arm 3140. Arm 3140 may be, for example, a strip of metal or other structure that is rigidly connected between the output of actuator 3136 and touch pad member 3124.

When actuator 3136 is driven by a control signal, actuator 3136 drives arm 3140 toward and/or away from touch pad member 3124 (e.g., in lateral directions 3138 parallel to the X-axis, shown in the FIG. 31 as an example). The movement imparted by actuator 3136 is sometimes referred to as tactile feedback, because this type of movement may be provided in response to a button actuation event. Users tend to expect that button actuation events will result in a clicking feel and sound. By driving actuator 3136 appropriately, vibrations or other movement in touch pad member 3124 may produce a desired tactile experience for the user (e.g., in the tips of finger 3126). For example, it may feel to the user as if touch pad member 3124 moved downwards and engaged a conventional mechanical switch, when in actuality, one or more of first force sensor 3152, second force sensor 3154, and third force sensor 3156 allowed relatively little vertical movement of touch pad member 3124, because touch pad member 3124 is mounted in a substantially fixed location within a base portion of the portable computing system. If desired, actuator 3136 can impart force to arm 3140 and therefore touch pad member 3124 in response to other criteria (e.g., when certain software conditions arise, when the user makes certain gestures that are sensed using the touch sensor portion of touch pad 112, etc.).

Touch pad 112 may be formed from a layered stack of structures. For example, touch pad member 3124 may include a printed circuit board or other substrate on which an array of touch sensor electrodes are formed. The array of electrodes may be substantially equal in size to the size of touch pad member 3124, so that touch pad member 3124 and the array extend across all of the active surface of the touch pad 112.

Stiffeners, smooth glass cover layers, and layers of ink and adhesive may also be incorporated into touch pad member 3124. If desired, size and weight may be minimized by implementing touch pad 112 with fewer layers. For example, touch pad 112 may be implemented using a glass or ceramic layer with integrally formed capacitive electrodes and no stiffener, provided that touch pad 112 is still rigid. The stiffness of touch pad member 3124 ensures that button actuation activity by a user will be detectable by the aforementioned force sensors, regardless of the location at which the user presses the surface of touch pad member 3124. Touch pad 112 having a touch pad member 3124 that is relatively rigid also helps ensure that a single actuator, such as actuator 3136, or other suitable number of actuators is able to effectively generate tactile feedback over the entire surface of touch pad member 3124 (i.e., global actuator-induced motion). If the ceramic, glass, plastic, or other layers of touch pad member 3124 that are used to form the contact surface and touch sensor array for touch pad member 3124 are flexible, a stainless steel stiffener or other suitable stiffening structure may be incorporated into touch pad member 3124. Touch pad member 3124 may also be stiffened by using sufficiently thick layers of glass, ceramic, plastic, or composite materials without using an extra stainless steel stiffening layer (e.g., by forming some of the layers of touch pad member 3124 from glass, ceramic, plastic, or composite material that is 1 mm thick or more, 2 mm thick or more, 3 mm thick or more, or 4 mm thick or more, as examples). A rectangular shape is typically used for touch pad member 3124, because this corresponds to the rectangular shape of display 116 (shown in FIG. 1). Other shapes may, however, be used if desired. These are merely illustrative examples. Any suitable touch pad structures may be used in forming touch pad 112 if desired. Various features of touch pad 112 are described and explained in U.S. Pat. No. 8,633,916, to Bernstein et al., and titled "TOUCH PAD WITH FORCE SENSORS AND ACTUATOR FEEDBACK", the content of which is incorporated herein by reference in its entirety.

Figure 32:
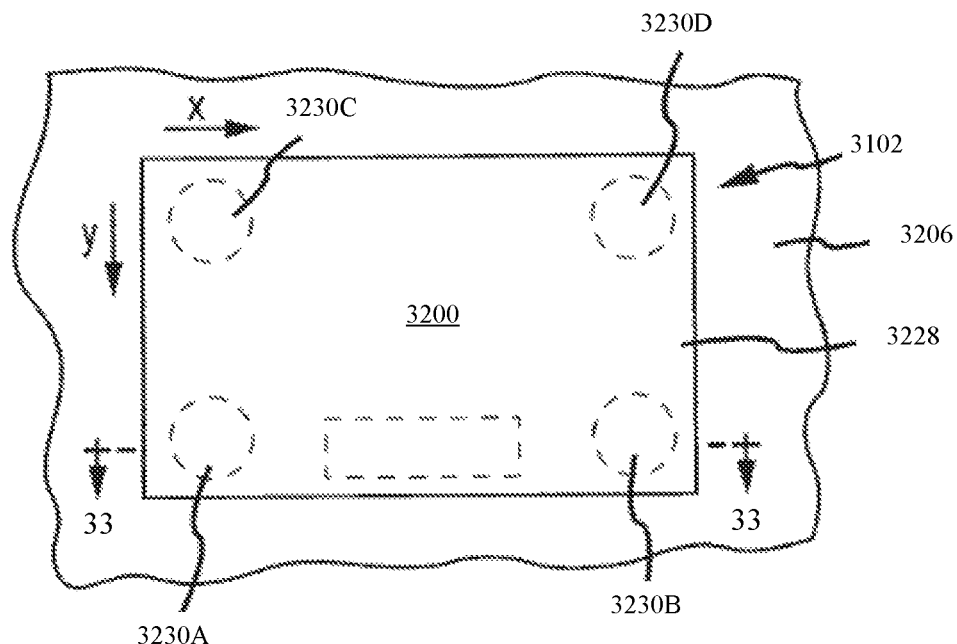
FIG. 32 illustrates an enlarged top plan view of a touch pad including haptic device, in accordance with the described embodiments.
Figure 33:
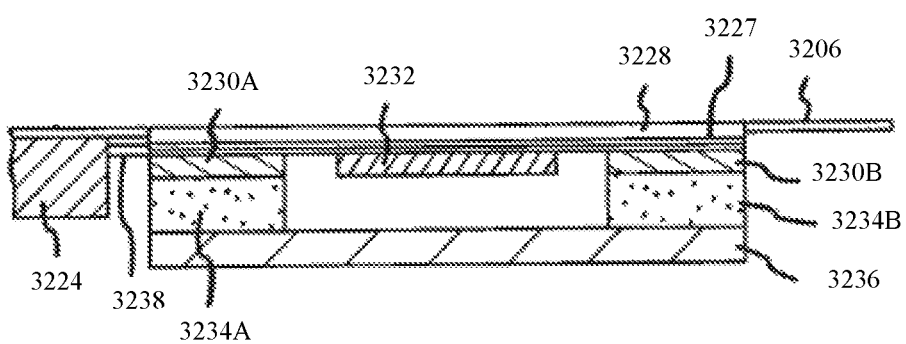
FIG. 33 illustrates a cross-sectional view of the haptic device of FIG. 32, taken along line 33-33 in FIG. 32.

In some cases, a portable computing system may include a touch pad with additional features. For example, FIG. 32 illustrates an enlarged top plan view of touch pad 3200 including haptic device 3202, in accordance with the described embodiments. FIG. 33 is a cross-sectional view of haptic device 3202 of FIG. 32 taken along line 33-33 in FIG. 32. Haptic device 3202 selectively provides output or feedback to a user by moving, vibrating, or otherwise alternating feedback surface 3228 of touch pad 3200. Feedback surface 3228 may be associated with a surface of a touch pad member 3124 (in FIG. 31) designed to receive an input or gesture from a user. Haptic device 3202 may include actuator 3224 operably connected to feedback surface 3228. Additionally, haptic device 3202 incorporates the input sensors which may include one more force sensors such as first force sensor 3230A, second force sensor 3230B, third force sensor 3230C, and fourth force sensor 3230D. Also, haptic device 3202 may further include position sensors 3227 and one or more acceleration sensors (not shown). The haptic device 3202 may also include one or more biasing supports, such as first biasing support 3234A and second biasing support 3234B. Although not shown, haptic device 3202 may include a third biasing support positioned below third force sensor 3230C and fourth biasing support positioned below 3230D. The biasing supports combine to secure and support haptic device 3202 to a portable computing system.

Haptic device 3202, when included within the portable computing system, may be substantially surrounded by enclosure 3206, which may be similar to that of base portion 102 (shown in FIG. 1). Haptic device 3202 may include feedback surface 3228 that may be supported by the one or more biasing supports, such as first biasing support 3234A and second biasing support 3234B, above substrate 3236 or other support surface for the portable computing system. Also, one or more acceleration sensors (not shown) in electrical connection with, for example, feedback surface 3228, actuator 3224, and position sensors 3227. The input sensors may be positioned beneath, adjacent, or on top of feedback surface 3228. In some embodiments, the input sensors may be integrated into feedback surface 3228.

Haptic device 3202 may further be operably connected to actuator 3224. Actuator 3224, which will be discussed in more detail below, selectively moves feedback surface 3228 to provide feedback to a user. Actuator 3224 may be operably connected to feedback surface 3228 by one or more connection members 3238.

Actuator 3224 may receive one or more electrical signals from the a processor (not shown) within the portable electronic device or other controlling element, and those electrical signals may be converted into mechanical movement by actuator 3224. For example, in some embodiments, actuator 3224 is a solenoid actuator including a wire wound around a moveable iron core, and as a current passes through the wire coil, the iron core may move correspondingly. Specifically, the electric current through the wire may create a magnetic field. The magnetic field may then apply a force to the core or plunger, to either attract the core. In these embodiments, the actuator may also include a spring or biasing member which may return the core to its original position after the magnetic field is removed. In other embodiments, actuator 3224 is an electromagnet, or a series of magnets that are selectively energized to attract or repeal feedback surface 3228.

In embodiments where actuator 3224 is a solenoid or electromagnet it may be configured to respond to one or more waveforms, which may vary the mechanical output of actuator 3224. For example, the various waveforms may vary the current through the wire, and thus may vary the magnetic field created. By changing the magnetic field different types of linear mechanical movements may be created.

It should be noted that in other embodiments, actuator 3224 is a mechanism for creating mechanical movement other than a solenoid actuator. For example, actuator 3224 may be a motor, servo, series of magnets, or the like. As a specific example, actuator 3224 may be a series of bar electromagnets with alternating poles that may be used to mechanically move feedback surface 3228.

In some embodiments, actuator 3224 selectively moves feedback surface 3228 linearly, e.g., along the X axis and/or the Y axis illustrated in FIG. 32. In other words, feedback surface 3228 may translate horizontally but may not move vertically with respect to enclosure 3206. In other embodiments, actuator 3224 may move feedback surface 3228 vertically or a combination of vertically and linearly. However, in embodiments where actuator 3224 may move feedback surface 3228 linearly, a user in contact with feedback surface 3228 may perceive the movement of feedback surface 3228 as being vertical in nature. This is because feedback surface 3228 may move linearly a small distance or may move very quickly. In some embodiments, sufficiently small lateral displacements can be experienced by the user as vertical movement of surface 3228. Such embodiments may have a thinner height than a haptic device employing vertical displacement.

Furthermore, because feedback surface 3228 may move linearly, the height required for haptic device 3202 may be reduced, as compared with haptic devices that require movement to produce feedback. This is because a height of enclosure 3206 may not have to accommodate a vertical travel distance for feedback surface 3228. Further, in these embodiments, enclosure 3206 may extend over a portion of feedback surface 3228 to better protect internal components of the portable computing system from debris or other elements. This is possible because feedback surface 3228 may only need to translate beneath enclosure 3206 (and not above it) to provide feedback to a user. In yet other embodiments, actuator 3224 moves feedback surface 3228 in the vertical direction or a combination of vertical and linear directions.

Actuator 3224 may provide a force to feedback surface 3228 (or other portions of the haptic device 3202) to move feedback surface 3228 a predetermined distance in a direction parallel with respect to feedback surface 3228. The travel length in the first direction may depend on the desired feedback. In some embodiments, actuator 3224 moves feedback surface 3228 in more than one direction. For example, actuator 3224 may displace feedback surface 3228 and then provide a second force to return feedback surface 3228 to its original position. However, in other embodiments, the biasing supports, which include first biasing support 134A and second biasing support 134B, may provide a biasing force that may return feedback surface 3228 to its original position.

It should be noted that in other embodiments, actuator 3224 can be configured to move feedback surface 3228 in other manners, e.g., vertically. In yet other embodiments actuator 3224 may move feedback surface 3228 both in the vertical and horizontal directions.

With reference to FIGS. 32 and 33, in some embodiments, feedback surface 3228 may be a relatively rectangular shape or square shape, and force sensor 3230A, second force sensor 3230B, third force sensor 3230C, and fourth force sensor 3230D may be positioned beneath each corner or adjacent each corner of feedback surface 3228. In these embodiments, the aforementioned force sensors may determine a force input applied to substantially any portion of feedback surface 3228.

In other embodiments, feedback surface 3228 is shaped differently. Further, in some embodiments, there are three or fewer force sensors. For example, haptic device 3202 may include a single force sensor positioned at a center of feedback surface 3128 and/or may include multiple force sensors positioned around a perimeter of feedback surface 3128. The location and number of the force sensors may be determined based on the desire sensitivity of force input desired to be captured by haptic device 3202. Thus, if haptic device 3202 is relatively more force-sensitive, in those embodiments, haptic device 3202 includes five or more force sensors.

The force sensors may be substantially any type of sensor capable of detecting an exerted force. In some embodiments, the force sensors are strain gauges. Generally, the force sensors are any other type of sensor known in the art that are configured to detect changes in force applied to a surface.

Position sensors 3227 (or touch sensors) may be configured to detect an input location on feedback surface 3228. In some embodiments, position sensors 3227 include one or more capacitive sensors. For example, haptic device 3202 may include a grid of electrodes operably connected to feedback surface 3228 and configured to detect an input signal, such as a change in capacitance or other electrical change. Capacitive sensing grids for sensing are generally known in the art, and by using a scanning technique the capacitive sensing grids can detect multiple touches on a surface substantially simultaneously. However, in other embodiments, other position sensors are used, such as a light sensors that detect disruption in light signals, piezoelectric sensors positioned on feedback surface 3228, or acoustic sensors which detect position based on sound waves, and so on.

Acceleration sensor 3232 may detect an acceleration of a user input. For example, acceleration sensor 3232 may be an accelerometer that detects how quickly a user may press on feedback surface 3228 based on an acceleration of feedback surface 3228 (to which it may be operably connected). Further, although actuator 3224 may move the feedback surface 228 vertically, the biasing supports, including first biasing support 134A and second biasing support 134B, may have some resiliency so that acceleration sensor 3232 may move slightly due to an input force in order to better detect the acceleration of the input force.

With reference to FIG. 33, first biasing support 3234A and second biasing support 3234B may support and operably connect the feedback surface 3228 to the substrate 3236 or other support surface of the portable computing system. In some embodiments, haptic device 3202 may include four biasing supports, such as first biasing support 3234A and second biasing support 3234B, and two additional biasing supports (not shown), which each may be operably connected to a respective corner of feedback surface 3228. In these embodiments, the biasing supports may be operably connected to feedback surface 3228 at a location substantially adjacent to the location of the force sensors, such as first force sensor 3230A, second force sensor 3230B, third force sensor 3230C, and fourth force sensor 3230D.

The biasing supports previously described provide a biasing force to feedback surface 3228 to return feedback surface 3228 to a normal or first position. The biasing supports may be substantially any member capable of providing a biasing or return force to feedback surface 3228. In some embodiments, the biasing supports include a relatively flexible and resilient member, such as a gel. In this example, the gel may be a silicon based gel, that may be positioned around the sides of feedback surface 3228. In other embodiments, the biasing supports may be one or more springs spanning between substrate 3236, feedback surface 3228, and/or other types of flexible yet resilient materials. In yet other embodiments, haptic device 3202 may use a magnetic force from one or more magnets to return feedback surface 3228 to its original position.

Although the biasing supports described include four separate members, in some embodiments, the biasing supports may be a single integral member. In other embodiments, haptic device 3202 includes three or less biasing supports.

It should be noted that the concepts and devices disclosed herein may be used or otherwise incorporated into components other than track pads or moving elements. For example, the force sensors may be used to sense force inputs as applied to a cover glass of a display (such as a touch sensitive display) and/or to an enclosure of a device. In these instances, certain elements of the disclosure, discussed in more detail below, may be implemented although the select device or mechanism may not have a haptic or user output component. As a specific example, the force sensors may be incorporated into a cover glass for a capacitive touch display (such as for a tablet or smartphone), and may be used to determine one or more forces correlating to one or more user inputs. However, in this example, the cover glass may not provide haptic output to the user; for instances, the cover glass may not move or vibrate. Thus, although the term feedback surface is described with respect to a haptic device, in some embodiments, the surface may be incorporated into non-moving or other non-haptic devices. The haptic device 3202 is described and explained in International Application PCT/US13/00086, to Parivar et al., with an international filing date of Mar. 15, 2013, and titled "VARYING OUTPUT FOR A COMPUTING DEVICE BASED ON TRACKING WINDOWS", the contents of each is hereby incorporated by reference in their entirety.

Figure 34:
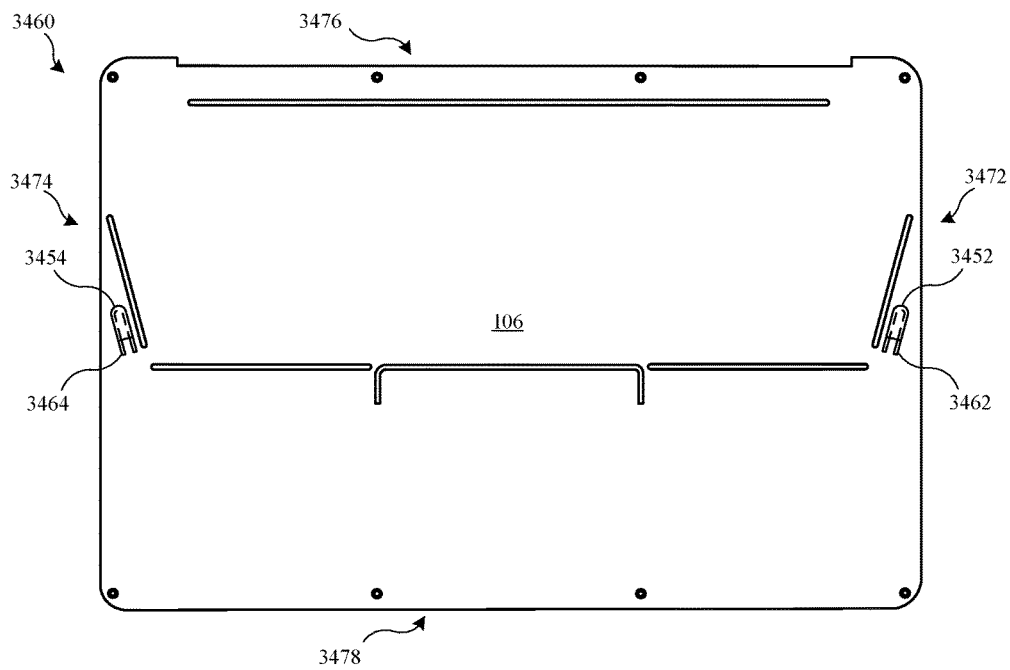
FIG. 34 illustrates a plan view of an interior portion of the bottom case, in accordance with the described embodiments.

FIG. 34 illustrates a plan view of interior portion 3460 of bottom case 106, in accordance with the described embodiments. The "interior portion" is generally associated with a region or surface not visible to a user when a portable electronic device is assembled. As shown, first retention feature 3452 and second retention feature 3454 are located on first side region 3472 and second side region 3474, respectively, of bottom case 106. However, it will be appreciated that first retention feature 3452 and/or second retention feature 3454 could be located anywhere along bottom case 106, such as the third side region 3476 or fourth side region 3478. Further, in some embodiments, bottom case 106 includes three or more retention features.

Each retention feature is designed to receive a protrusion (discussed below) that is part of an interior portion of a top case (such as top case 104 shown in FIG. 1). Each protrusion of the top case is generally located in positions corresponding to the location of first retention feature 3452 and second retention feature 3454. As such, the number of protrusion is equal to the number of retention features. Also, each retention feature and protrusion can replace a fastener (for example, a threaded screw) used in traditional portable computing systems. Accordingly, this allows the top case to couple with bottom case 106 without forming an opening in bottom case 106 previously used to receive the fastener. Also, FIG. 34 shows first retention feature 3452 and second retention feature 3454 including first securing member 3462 and second securing member 3464, respectively. This will be discussed below.

In order to provide a retention force between the top case and the bottom case, each retention feature may include a securing member designed to receive and retain a protrusion. The securing member may include certain flexible properties designed to allow the securing member to deform such that a protrusion, and in particular a tapered region of the protrusion, may be secured within the securing member. However, the securing member is also designed to return to its original shape (prior to engaging a protrusion or receiving some external force) in order to retain the protrusion.

Figure 35:
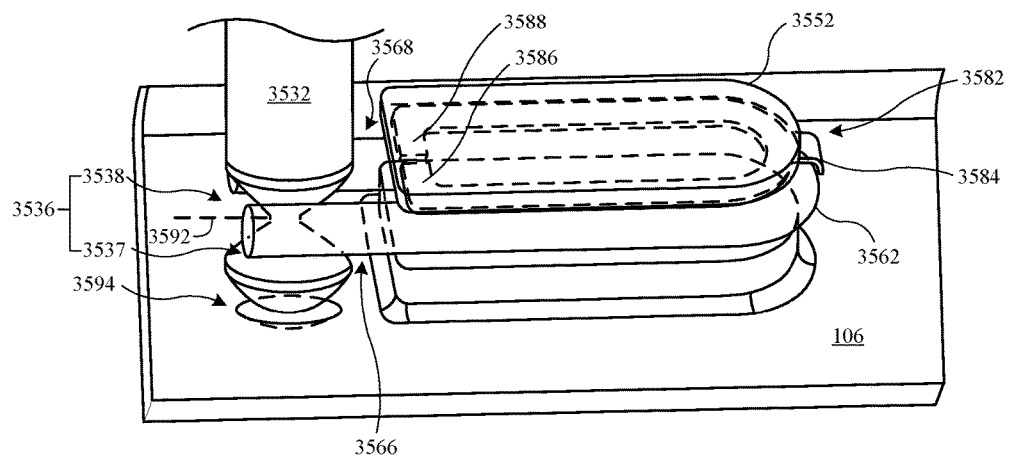
FIG. 35 illustrates an isometric view of an embodiment of a protrusion engaged with a securing member, the protrusion and the securing member designed to secure the top case to the bottom case.

FIG. 35 illustrates an isometric view of an embodiment of protrusion 3532 engaged with securing member 3562. Protrusion 3532 and securing member 3562 are designed to secure a top case with bottom case 106. Protrusion 3532 may include features previously described for a protrusion associated with a top case. Also, retention feature 3552 includes features similar to those of first retention feature 3452 (shown in FIG. 34), and securing member 3562 may include features similar to those of first securing member 3462 (shown in FIG. 34). Also, retention feature 3552 may be designed to receive tab member 3582. Tab member 3582 is designed to provide a tension to securing member 3562 such that securing member 3562 remains tensioned with (and positioned within) retention feature 3552. Also, tab member 3582 may include extension 3584 that may bend or curve around securing member 3562 to further secure securing member 3562 with retention feature 3552.

In some embodiments, protrusion 3532 is integrally formed with an interior region of a top case. In the embodiment shown in FIG. 35, protrusion 3532 is a separate structure mounted in an interior region of keyboard rib structure 1816 (shown in FIG. 18) and, in particular, mounted into a "blind hole" formed in keyboard rib structure 1816. A blind hole refers to a partial opening in a structure, with the opening not completely extending through the structure. Also, in some embodiments, protrusion 3532 is formed from a metal injection molding ("MIM") process. In the embodiment shown in FIG. 35, protrusion 3532 is formed from a material removal process similar to that of a screw. Also, protrusion 3532 includes tapered region 3536, which includes first tapered portion 3537 and second tapered portion 3538. First tapered portion 3537 and second tapered portion 3538 may include an angle with respect to imaginary horizontal line 3592 that is parallel to bottom case 106. The angles of first tapered portion 3537 and second tapered portion 3538 may be approximately in the range of 30 to 60 degrees with respect to imaginary horizontal line 3592. In the embodiment shown in FIG. 35, the angles formed by first tapered portion 3537 and second tapered portion 3538 is approximately 45 degrees with respect to imaginary horizontal line 3592. The angle of first tapered portion 3537 and second tapered portion 3538 may be adjusted to increase or decrease the retention force defined by the force created between tapered region 3536 and securing member 3562. For example, by lowering the angle of second tapered portion 3538, the retention force between tapered region 3536 and securing member 3562 increases, and a force required to overcome the retention force to remove protrusion 3532 from securing member 3562 must be increased. Also, bottom case 106 may cavity 3594 that receives at least a portion of protrusion 3532.

In some embodiments, the retention feature 3552 is adhesively secured to bottom case 106. In other embodiments, the retention feature 3552 is welded to the bottom case 35n the embodiment shown in FIG. 35, retention feature 3552 is integrally formed with the bottom case 106. Accordingly, retention feature 3552 is formed from the same material as that of the bottom case 106.

In some embodiments, securing member 3562 is formed from a metal (e.g., steel, carbon steel). Generally, securing member 3562 may be formed from any material having relatively high yield strength. In this manner, forces applied to securing member 3562 may cause some deformation to securing member 3562, yet securing member 3562 will return to its original wire form shape when the force is no longer applied to the securing member 3562. As shown in FIG. 35, securing member 3562 is generally defined by a U-shape wire form. However, securing member 3562 may be defined by other wire form shapes. For example, securing member 3562 may include a semi-circular region along with one or more linear regions (or linear extensions). In some embodiments, securing member 3562 includes nickel plating. Further, the nickel plating may be a relatively dark color, such as black.

Also, as shown in FIG. 35, securing member 3562 is designed to extend beyond retention feature 3552 such that securing member 3562 is capable of retaining protrusion 3532, and in particular, tapered region 3536. The portion of securing member 3562 extending beyond retention feature 3552 may be defined by first extension 3566 and second extension 3568. As shown, first extension 3566 and second extension 3568 engage tapered region 3536.

In some embodiments, tab member 3582 is formed form a metal (e.g., steel, stainless steel, aluminum). Also, tab member 3582 may be independently formed with respect to retention feature 3552. However, in other embodiments, tab member 3582 integrally formed with retention feature 3552 such that only an extension (e.g., extension 3584) defines tab member used to secure securing member 3562. Further, tab member 3582 may include a thickness approximately in the range of 0.1 to 0.3 millimeters. Also, in order to maintain tab member 3582 within retention feature 3552, tab member 3582 include first hook feature 3586 and second hook feature 3588, as shown in FIG. 35.

It will be appreciated that the various features shown and described in FIG. 35 may be applied to other features associated with the top case and/or the bottom case. For example, second retention feature 3454 and second securing member 3464 (both shown in FIG. 34) may include any feature previously described for retention feature 3552 and securing member 3562, respectively.

Figure 36:
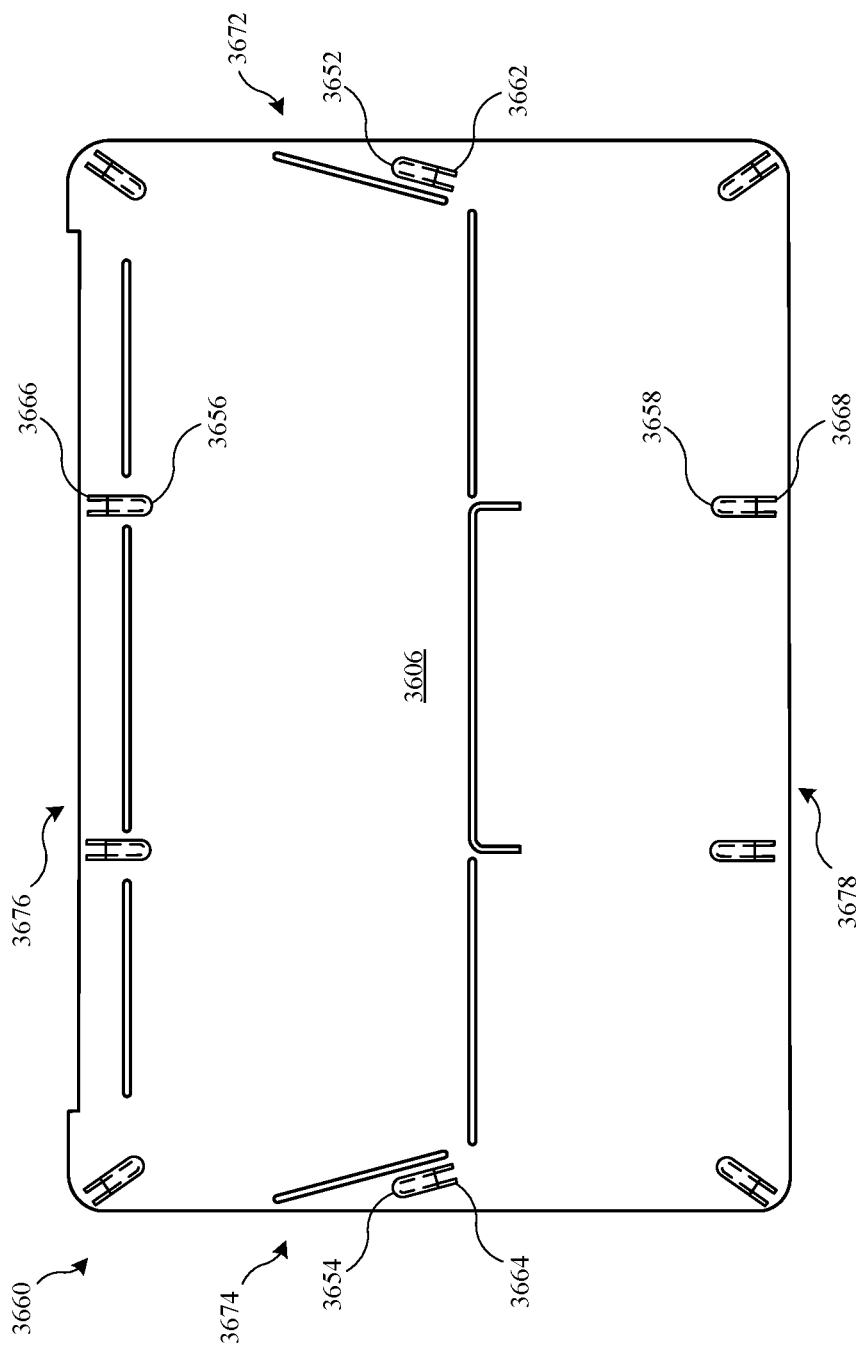
FIG. 36 illustrates a plan view of an interior portion of the bottom case having securing members disposed on an outer peripheral portion of the bottom case, in accordance with the described embodiments.

FIG. 36 illustrates a plan view of interior portion 3660 of bottom case 3606 having securing members disposed on an outer peripheral portion of bottom case 3606, in accordance with the described embodiments. For example, first side 3672 includes first retention feature 3652 having first securing member 3662. Also, second side 3674 includes second retention feature 3654 having second securing member 3664. Further, third side 3676 and fourth side 3678 include several retentions features, each of which includes a securing member. For example, third side 3676 includes third retention feature 3656 having third securing member 3666, and fourth side 3678 includes fourth retention feature 3658 having fourth securing member 3668. In this configuration, bottom case 3610 may include a sufficient number of retention features and securing members such that a top case of a portable computing system that includes an equal number of protrusions as the number of retention features can be secured with the securing members of bottom case 3606. This would allow for bottom case 3606 that does not require any fasteners (and as such, any openings to receive the fasteners) to be secured with a top case.

Figure 37:
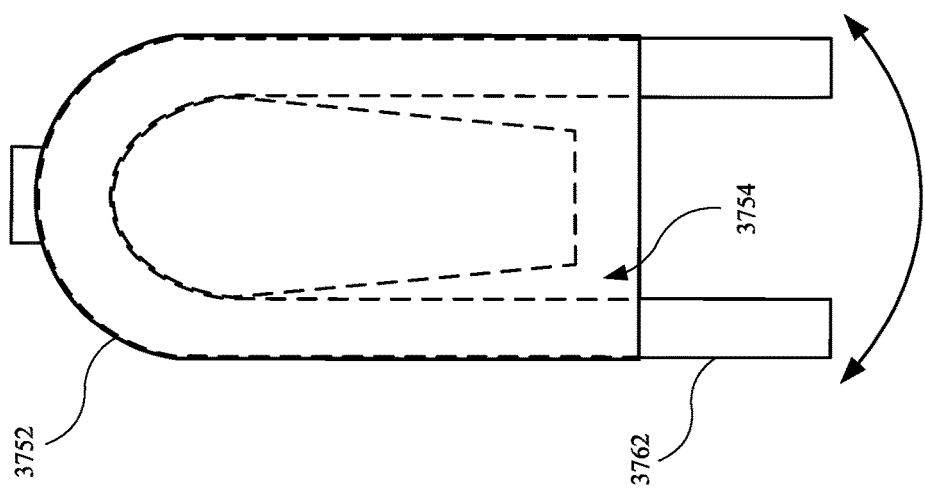
FIG. 37 illustrates a plan view of an alternate embodiment of the retention feature having a grooved region defined by an additional material removal region, in accordance with the described embodiments.

FIG. 37 illustrates a plan view of an alternate embodiment of retention feature 3752 having grooved region 3754 defined by an additional material removal region, in accordance with the described embodiments. Grooved region 3754 allow for additional movement and/or rotational positioning of structural features positioned within grooved region 3754. For example, securing member 3762 is able to pivot or rotate about retention feature 3752. This allows for some flexibility or additional tolerance for placement of a protrusion (not shown) of a top case. In other words, securing member 3762, having additional rotational movement due in part to grooved region 3754 of retention feature 3752, can rotate or pivot in a direction toward the protrusion to mechanically interlock with the protrusion.

Figure 38:
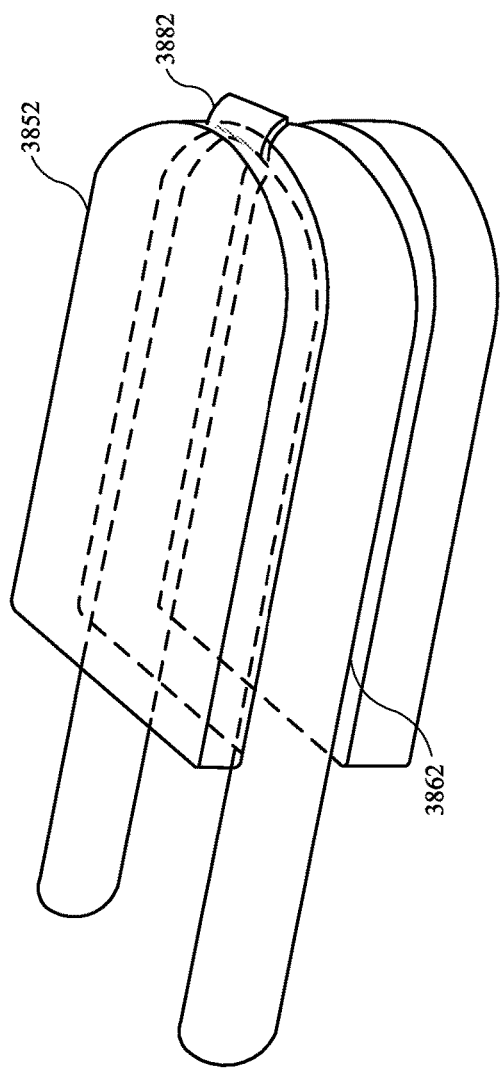
FIG. 38 illustrates an isometric view of an embodiment of a retention feature including a tab member integrally formed with the retention feature.

FIG. 38 illustrates an isometric view of an embodiment of retention feature 3852 including tab member 3882 integrally formed with retention feature 3852. Rather than include a separate tab member (e.g., tab member 3582 shown in FIG. 35), tab member 3882 used to secure securing member 3862 within retention feature 3852 is already located on retention feature 3852. Once securing member 3862 is positioned within retention feature 3852, tab member 3882 may be deformed or bent to retain securing member 3862. This allows for fewer parts in a portable computing system. Also, retention feature 3852 may be secured to a bottom case of a portable computing system (not shown) by means such as adhesive securing, soldering, or welding. Alternatively, retention feature 3852 may be integrally formed with the bottom case.

Figure 39:
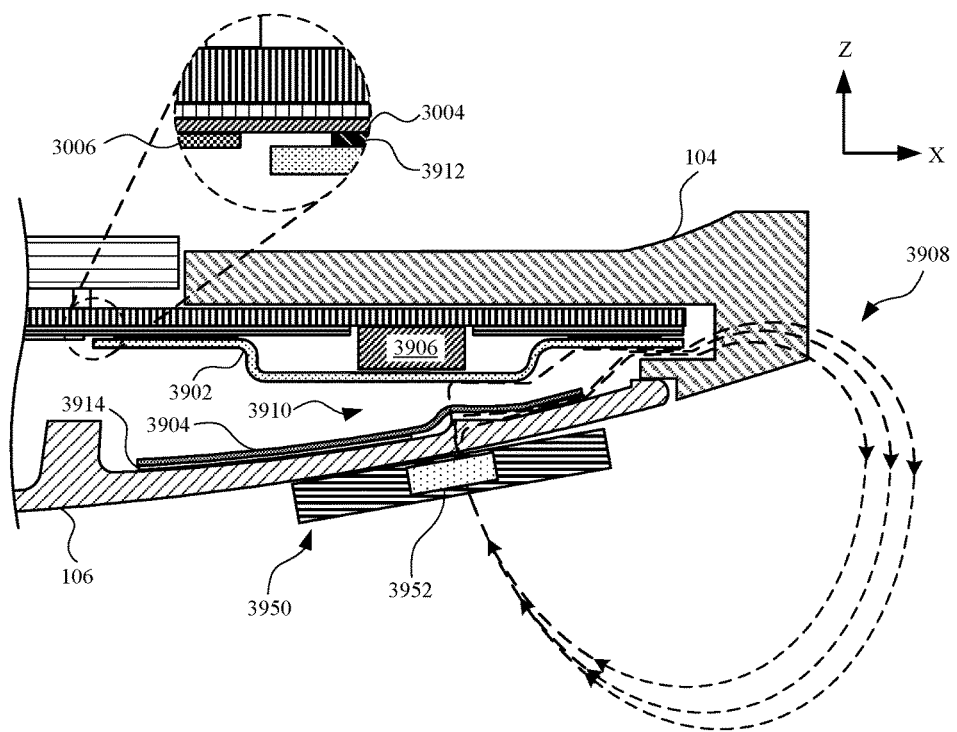
FIG. 39 shows a cross-sectional view of one end of a top case and a bottom case that includes metallic structures that shield a magnetic field sensor from magnetic fields originating from below the bottom case.

FIG. 39 shows a cross-sectional view of one end of top case 104 and bottom case 106 (shown in FIG. 1) that includes metallic structures 3902 and 3904 that shield magnetic field sensor 3906 from magnetic fields originating from a bottom surface of top case 104. Magnetic field sensor 3906 may be designed to detect a magnetic field emitted by a magnet in a lid portion of a portable computing system 100 (shown in FIG. 1). As shown, metallic structure 3904 is generally below metallic structure 3902 in a dimension (for example, a vertical z-dimension). In this manner, metallic structures 3902 and 3904 combine to define a magnetic shield such that magnetic field 3908 generated by external magnet 3952 of device 3950 is diverted in a direction away from magnetic field sensor 3906, as depicted. Generally, metallic structures 3902 and 3904 are designed to divert or redirect any magnetic field other than the magnetic field generated by a magnet disposed within lid portion 108. In this manner, magnetic field sensor 3906 does not generate the electrical signal (used to place portable computing system 100 in a "sleep mode") in response to external magnet 3952 in close proximity to the portable computing system 100. Also, an air gap 3910 defined as a void or space between metallic structure 3902 and metallic structure 3904 can further impede magnetic field 3908 from reaching magnetic field sensor 3906.

The enlarged view shows third layer 3006 (of keyboard shield 3000, shown in FIG. 30) partially removed such that metallic structure 3902 is electrically connected to second layer 3004 via a first conductive adhesive layer 3912. Metallic structure 3902 is then electrically grounded. Also, metallic structure 3904 can be adhesively secured with bottom case 106 by second conductive adhesive 3914 such that metallic structure 3904 is also electrically grounded. Metallic structures 3902 and 3904 offer a lightweight and low-cost solution. Further, magnetic field sensor 3906 can be a relatively simplistic sensor and need not include complex features. For example, a second sensor used as a "confirmation" sensor to detect a second magnet (not shown) in lid portion 108 is not required, due to the increased reliability of magnetic field sensor 3906. It should be noted that additional details regarding the magnetic shielding can be found in U.S. Provisional Application No. 62/111,042, to Reid et al., filed Feb. 2, 2015, and titled "KEYBOARD STRUCTURE AND RETENTION FEATURES OF A PORTABLE COMPUTER".

Figure 40A:
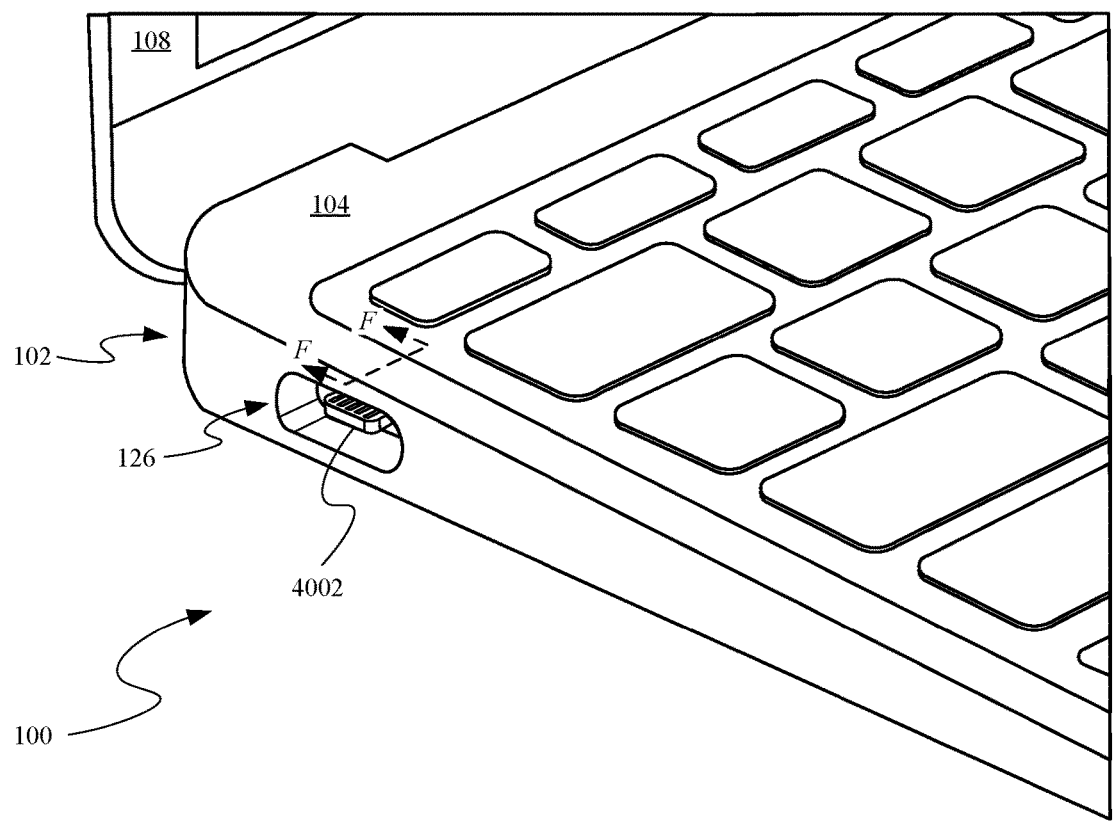
FIG. 40A shows a close up view of a left side of a portable computing system and a data port, in accordance with the described embodiments.
Figure 40B:
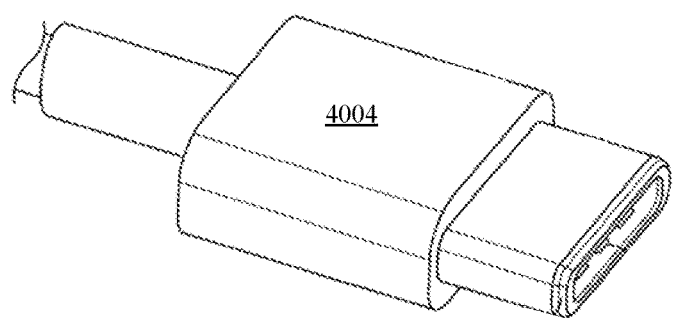
FIG. 40B shows a perspective view of an exemplary plug suitable for use with the data port depicted in FIG. 40A.

FIG. 40A shows a close up view of a left side of portable computing system 100 and data port 126. In some embodiments, data port 126 can serve as the only physical connector port for transferring high-speed data or receiving external power. In one particular embodiment, data port 126 can take the form of a USB-C type port. Data port 126 can be an omnidirectional port configured to receive a connector plug in a number of different orientations. In some embodiments, a sidewall of base portion 102 can remove the need for a connector shell by forming all of a receptacle for receiving a plug, thereby replacing a sheet metal shell that generally supports a connector of this type. In this way, only edge connector 4002 of a printed circuit board (PCB) secured to top case 104 needs to be provided on the PCB that supports data port 126 with the contacts needed to provide the electrical coupling between the connector plug and internal components of portable computing system 100. In one particular embodiment, edge connector 4002 can be a thin protruding portion, sometimes referred to as a tongue of the PCB with certain contacts configured to transfer and receive data and other contacts configured to receive external power. In some embodiments, the PCB can be flexibly mounted to data port 126 so edge connector 4002 of the PCB can shift in the event of a drop event that occurs when the connector plug is engaged in data port 126. In some embodiments, the opening can be a blind hole with an opening in the rear passing entirely through the wall that is only big enough for edge connector 4002 of the PCB. In this way, the smaller through hole can define a location of edge connector 4002 within data port 126. In some embodiments, an end of the blind hole that surrounds the opening passing through the wall of base portion 102 can include a rubber gasket or other protective layer configured to prevent scratching or wear upon the receptacle from repeated insertion and extractions of a connector plug. It should be noted that in some embodiments sidewalls defining the receptacle of for data port 126 can be conductive in nature so that a plug engaging data port 126 can be grounded to base portion 102. In some embodiments, making these walls conductive can involve selectively removing a protective layer such as an anodization layer from the metal defining the receptacle. FIG. 40B shows a perspective view of an exemplary electric plug 4004 configured to engage data port 126.

Figure 40C:
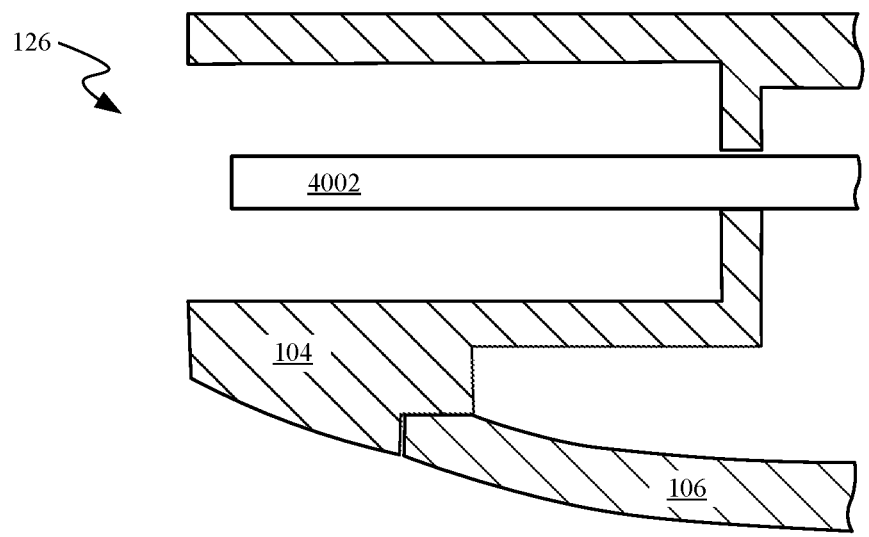
FIGS. 40C-40D show cross-sectional views of the data port shown in FIG. 40A.
Figure 40D:
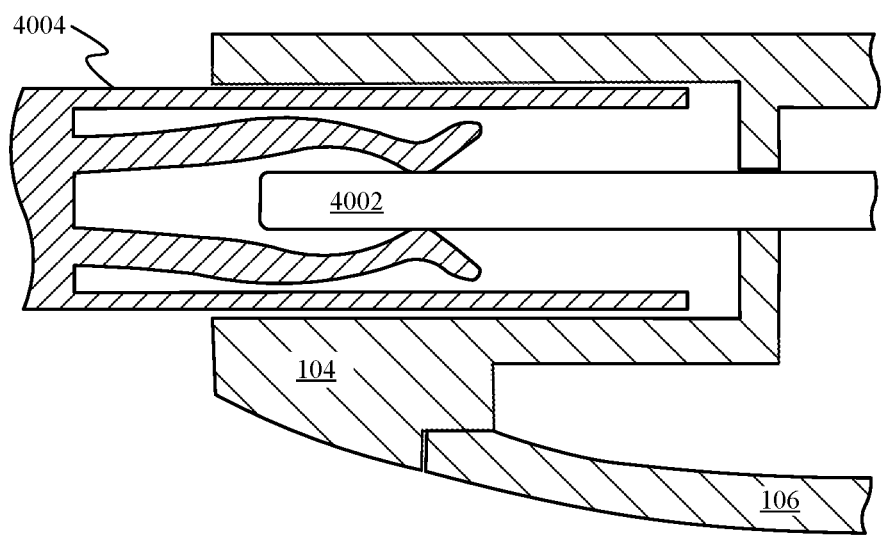

FIGS. 40C-40D show cross-sectional views of data port 126 in accordance with section line F-F, as depicted in FIG. 40A. FIG. 40C shows how the sidewall defines a receptacle portion of data port 126. In these depictions, top case 104 defines the sidewall of base portion 102 that defines the receptacle portion of data port 126. FIG. 40C also shows how the blind hole portion extends through a majority of the sidewall and then a smaller aperture extends completely through a remaining thickness of the sidewall. It should be noted that based upon a desired size of the receptacle and an amount of play desired for edge connector 4002 a thickness through which the smaller aperture extends may be greater or smaller. In this way, the length of the smaller rectangular aperture can be adjusted to allow edge connector 4002 to pivot within the portion of the receptacle defined by the sidewall. In this way, edge connector 4002 can make accommodations for drop events, which can reduce a risk of edge connector 4002 snapping off during a drop event. FIG. 40D shows another cross-sectional view in which plug 4004 is engaged within data port 126. Because plug 4004 is a symmetric plug and data port 126 a symmetric port, plug 4004 can be inserted in at least two different orientations. Patent application Ser. No. 14/543,748, filed Nov. 17, 2014 and entitled "Connector Receptacle Having a Tongue" by Amini et. al, describes various embodiments of this unitary data and power port in greater detail and is hereby incorporated by reference.

Figure 41A:
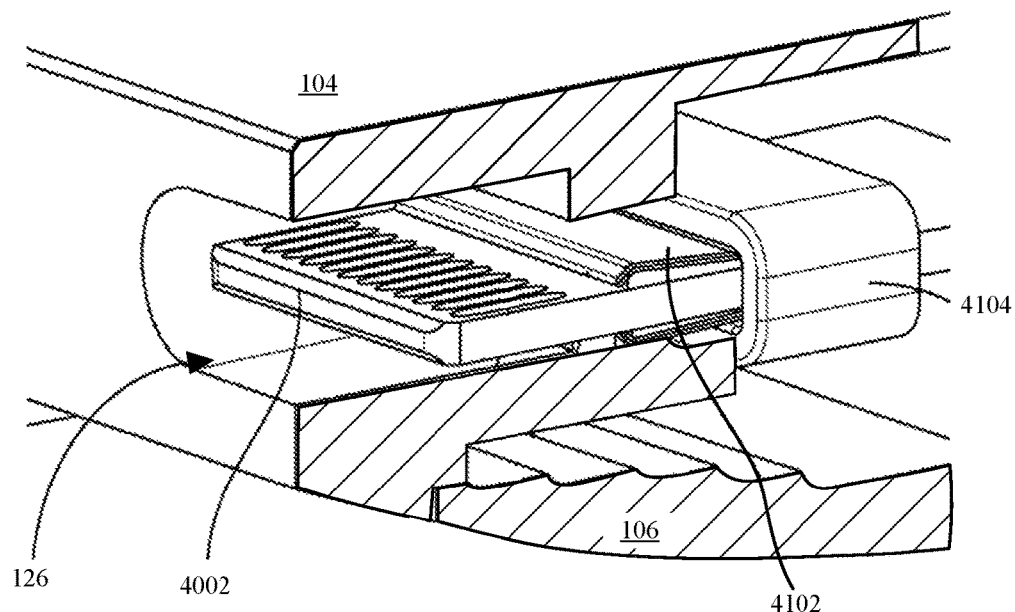
FIGS. 41A-41B show partial cross-sectional views of alternative data port embodiments.
Figure 41B:
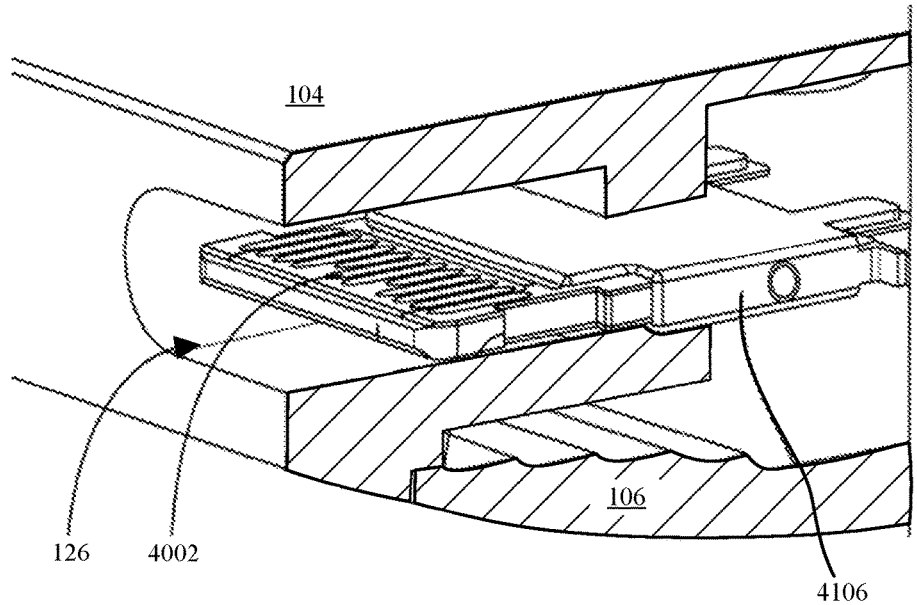

FIGS. 41A-41B show partial cross-sectional views of alternative data port embodiments. FIG. 41A shows an embodiment that includes two ground plates 4102 held in place by collar 4104. In some embodiments, ground plates 4102 can extend through different openings than the opening through which edge connector 4002 extends. FIG. 41B shows an embodiment in which a grounding jacket 4106 surrounds edge connector and grounds edge connector 4002 with top case 104. In some embodiments, one or more electrical contacts positioned on edge connector 4002 can be grounded to top case through grounding jacket 4106.

Figure 42:
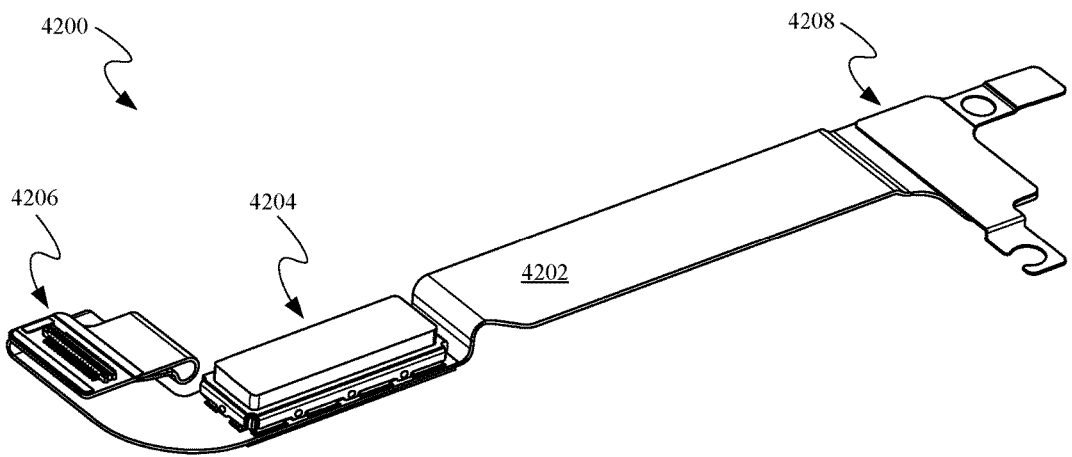
FIGS. 42 and 43 show various perspective views of a flexible connector suitable for routing power and data from the data port shown in FIG. 40A.
Figure 43:
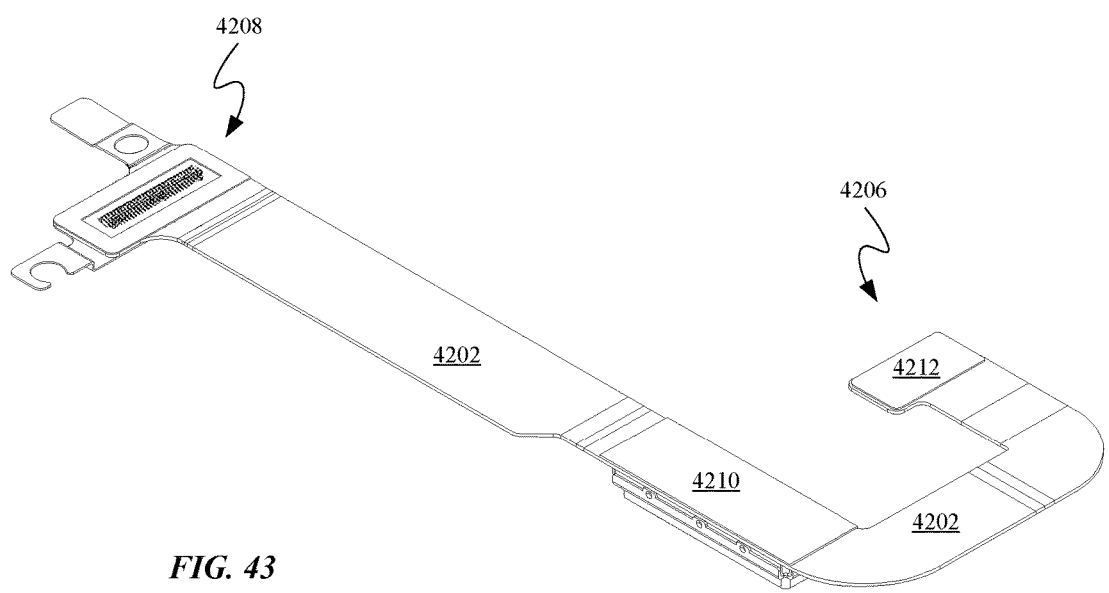

FIGS. 42-43 show different views of flexible connector 4200, which is responsible for routing power and high-speed data between data port 126 and another electrical components disposed within base portion 102 (shown in FIG.

40A). High-speed data can be transmitted and received using many different types of protocols. In some embodiments, data port 126 can be configured to simultaneously transmit and receive one or more protocols including one or more of the following protocol types: USB 3.0, USB 2.0, DisplayPort®, Thunderbolt®, DVI, HDMI, etc. Furthermore, flexible connector 4200 can include flexible substrate 4202 which is formed of a number of layers for transmitting the high-speed data. In some embodiments, the layers can include a discrete layer for transmitting power. In some embodiments, the layers can also include a grounding layer.

FIG. 42 shows how flexible connector 4200 can also include electrical component 4204 surface mounted to flexible substrate 4202. Electrical component 4204 includes a shielding can that prevents electromagnetic radiation emitted from the electrical component from affecting other components. Furthermore, electrical component 4204 includes a layer of conductive foam atop the shielding that can allow the shielding can to be grounded to an electrically conductive internal surface of base portion 102 for electrical grounding purposes. Electrical component 4204 can be configured to boost signals routed through flexible substrate 4202. In this way, flexible connector 4200 can be longer than would otherwise be possible in applications where high signal strength was required. Furthermore, in addition to the boosting components of electrical component 4204, electrical component 4204 can also include multiplexing circuitry for combining and separating the various signals received through data port 126. For example, in some embodiments, both DisplayPort® and USB 3.0 inputs can be received through electrical connector. The multiplexing circuitry can be used to separate and combine these signals as needed for use of the data by portable computing system 100. Flexible connector 4200 also includes two board-to-board connectors disposed at opposite ends of flexible substrate 4202. First end 4206 can include multiple bends that allow flexible substrate 4202 to more easily bend and flex to accommodate various operations during an assembly process. FIG. 43, which shows the opposite side of flexible connector 4200, depicts how the multiple bends look when flexible substrate 4202 is flattened out. FIG. 43 also shows an appearance of the board-to-board connector positioned at second end 4208. Also visible in FIG. 43 are stiffeners 4210 and 4212 which support the shielding and the board-to-board connector at first end 4206 respectively.

Figure 44:
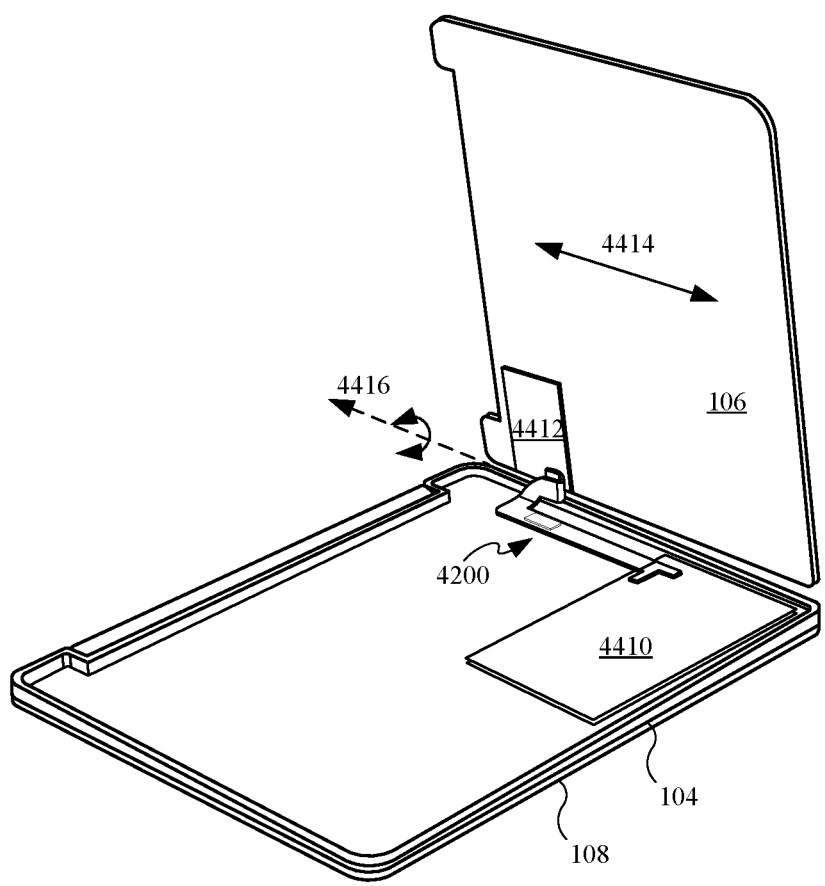
FIG. 44 shows how a flexible connector can be utilized to electrically couple two electrical components within a portable computing system, such as a main logic board and I/O board.

FIG. 44 shows how flexible connector 4200 can be utilized to electrically couple two electrical components within portable computing system 100: main logic board 4410 and I/O board 4412. As depicted, bend regions of flexible connector 4200 allows for translation of bottom case 106 with respect to top case 104 along axis 4414 and for rotation of bottom case 106 with respect to top case 104 about axis of rotation 4416. Further details regarding flexible connector 4200 are disclosed in U.S. Provisional Application No. 62/106,667, to Sweet et al., filed Jan. 22, 2015, and titled "HYBRID ACOUSTIC EMI FOAM FOR USE IN A PERSONAL COMPUTER".

Figure 45:
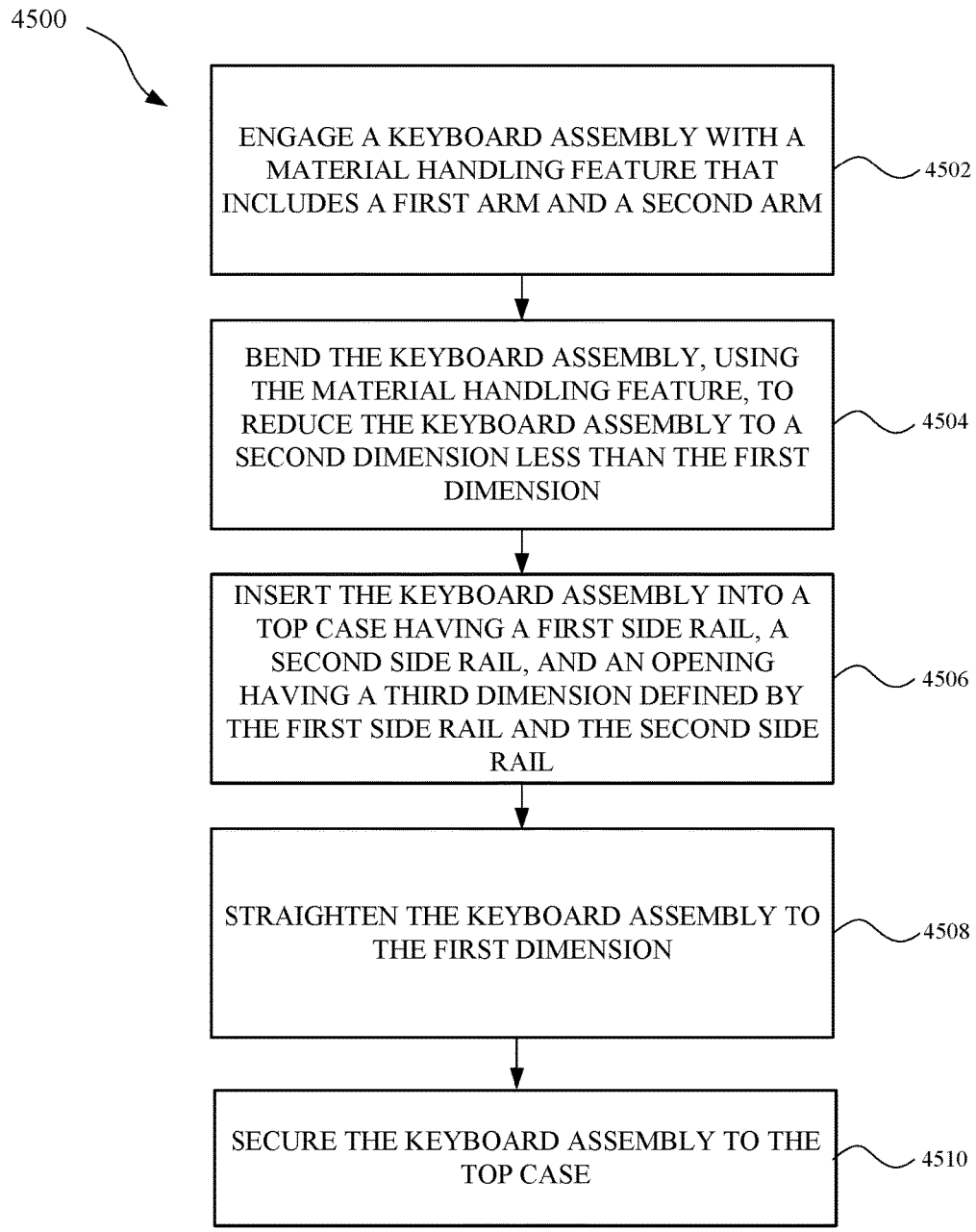
FIG. 45 illustrates a flowchart showing a method for forming a portable computing system, in accordance with the described embodiments.

FIG. 45 illustrates flowchart 4500 showing a method for forming a portable computing system, in accordance with the described embodiments. In step 4502, a keyboard assembly is engaged with a material-handling feature that includes a first arm and a second arm. The first arm and the second arm may include a first attachment feature and a second attachment feature, respectively. In some embodiments, the first attachment feature and the second attachment feature are suction cups. Also, the keyboard assembly can include a first end, a second end opposite the first end, and a first dimension defined by the first end and the second end. The first dimension also defines a length of the keyboard assembly.

In step 4504, the keyboard assembly is deformed or bent, using the material-handling feature, to reduce the keyboard assembly to a second dimension less than the first dimension. Although the keyboard assembly is bent, the keyboard assembly and a circuit board of the keyboard assembly are designed to withstand damage due to the aforementioned bending event.

In step 4506, the keyboard assembly is inserted into a top case having a first side rail, a second side rail, and an opening having a third dimension defined by the first side rail and the second side rail. The third dimension can be defined as a length of the opening. Also, the third dimension is less than the first dimension but greater than the second dimension. The bent configuration of the keyboard assembly allows the keyboard assembly to be inserted into the top case.

In step 4508, the keyboard assembly is straightened to the first dimension. This may be performed by actuating the first arm and the second arm (and in some cases a third arm) of the material-handling feature.

In step 4510, the keyboard assembly is secured to the top case. This can include the use of an assembly mechanism having several fastener receivers secured to a main body of the assembly mechanism. Also, fastener receivers may be angled. Further, the circuit board of the keyboard assembly may include angled openings at the first end and second end of the keyboard assembly. Also, the top case may include angled cavities proximate to the first side rail and the second side rail. In this manner, each fastener receiver can receive a fastener that can be inserted, at an angle, into an angled opening of the keyboard assembly and angled cavity of the top case. Also, the fastener and the angled cavity may be threaded such that the fastener is in threaded engagement with the angled cavity.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device, comprising:
a display housing that carries a display assembly;
a transparent substrate that covers the display assembly;
an antenna carried by the display housing and configured to enable wireless communication;
a cover coupled to the transparent substrate, the cover comprising a radio frequency permissive material to permit the wireless communication through the cover; and
a base portion rotatably coupled with the display housing, the base portion comprising:
a touch pad having a touch-sensitive interface,
an actuator coupled with the touch pad and configured to provide a vibratory feedback, and
a force sensor configured detect an amount of applied force to the touch-sensitive interface, the force sensor further configured to trigger the actuator to provide the vibratory feedback at the touch-sensitive interface when the amount of applied force that is detected exceeds a threshold amount of force.

2. The electronic device of claim 1, wherein the base portion comprises:
a top case having an opening to receive the touch pad, the top case further comprising a protrusion; and
a bottom case secured with the top case, the bottom case comprising a retention feature; and
a securing member rotatably coupled with, and extending from the retention feature, the securing member configured to flex to receive and retain the protrusion.

3. The electronic device of claim 2, wherein the top case comprises:
a sidewall having a cavity and a through hole that opens to the cavity; and
a circuit board extending through the through hole and the cavity to receive an external connector.

4. The electronic device of claim 2, wherein the bottom case comprises:
a first terraced region;
a second terraced region different from the first terraced region; and
an internal power supply having a shape in accordance with the first terraced region and the second terraced region.

5. The electronic device of claim 2, wherein the base portion comprises a speaker assembly covered by the top case, wherein the top case comprises:
a through hole that opens to the speaker assembly allowing acoustical energy from the speaker assembly to pass through the top case, and
a blind hole extending partially through the top case, the blind hole comprising an ink material such that the blind hole includes an appearance resembling the through hole.

6. The electronic device of claim 1, wherein
the display assembly extends from a first end to a second end opposite the first end, and
the cover extends from the first end to the second end.

7. The electronic device of claim 1, further comprising:
a flexible circuit electrically coupled with the display assembly and extending into the base portion; and
a retention member mounted with the display assembly and positioned over the flexible circuit to limit movement of the flexible circuit when the display housing rotates with respect to the base portion.

8. The electronic device of claim 7, wherein display housing comprises an undercut region, and wherein the retention member comprises a hook fitted into the undercut region to retain the flexible circuit.

9. The electronic device of claim 1, wherein:
the display housing comprises an opening that defines a platform and a relief section that is sub-flush with respect to the platform; and
an indicium is disposed in the opening at the platform; and
a mask that hides a surface of the relief section.

10. The electronic device of claim 9, wherein the opening further defines an indented region surrounding the relief section.

11. The electronic device of claim 1, wherein the cover comprises:
a glass substrate;
a first ink layer positioned on the glass substrate, the first ink layer comprising an opening; and
a second ink layer that fills the opening.

12. The electronic device of claim 1, wherein the vibratory feedback comprises a haptic feedback.

* * * * *